(12) United States Patent
Kohara et al.

(10) Patent No.: US 7,531,212 B2
(45) Date of Patent: May 12, 2009

(54) PROCESS FOR PRODUCING AN ALUMINA COATING COMPRISED MAINLY OF α CRYSTAL STRUCTURE

(75) Inventors: Toshimitsu Kohara, Hyogo (JP); Yoshimitsu Ikari, Hyogo (JP); Hiroshi Tamagaki, Hyogo (JP)

(73) Assignee: Kobe Steel, Ltd., Kobe-shi (JP)

( * ) Notice: Subject to any disclaimer, the term of this patent is extended or adjusted under 35 U.S.C. 154(b) by 405 days.

(21) Appl. No.: 10/523,931

(22) PCT Filed: Aug. 8, 2003

(86) PCT No.: PCT/JP03/10114

§ 371 (c)(1),
(2), (4) Date: Feb. 7, 2005

(87) PCT Pub. No.: WO2004/015170

PCT Pub. Date: Feb. 19, 2004

(65) Prior Publication Data

US 2005/0276990 A1    Dec. 15, 2005

(30) Foreign Application Priority Data

| Aug. 8, 2002 | (JP) | 2002-231954 |
| Dec. 9, 2002 | (JP) | 2002-357210 |
| Apr. 22, 2003 | (JP) | 2003-117353 |
| Apr. 30, 2003 | (JP) | 2003-125517 |
| Apr. 30, 2003 | (JP) | 2003-125519 |
| Apr. 30, 2003 | (JP) | 2003-125548 |
| Apr. 30, 2003 | (JP) | 2003-125549 |
| Apr. 30, 2003 | (JP) | 2003-125550 |

(51) Int. Cl.
*C23C 16/40* (2006.01)

(52) U.S. Cl. .......... 427/255.31; 427/255.391; 427/255.394; 427/255.7; 427/376.6; 204/192.1

(58) Field of Classification Search ........... 427/255.31, 427/255.394, 255.7, 255.391, 376.6; 204/192.1
See application file for complete search history.

(56) References Cited

U.S. PATENT DOCUMENTS

| 4,180,400 A | * | 12/1979 | Smith et al. ............... 75/235 |
| 4,310,614 A | * | 1/1982 | Connell et al. ......... 430/270.12 |
| 4,714,660 A | * | 12/1987 | Gates, Jr. .................. 428/698 |
| 4,720,437 A | * | 1/1988 | Chudo et al. .............. 428/698 |
| 4,847,163 A | * | 7/1989 | Shimamune et al. ........ 428/469 |
| 5,069,938 A | * | 12/1991 | Lorimer et al. ......... 427/255.26 |
| 5,071,696 A | * | 12/1991 | Chatfield et al. ............ 428/220 |
| 5,167,943 A | * | 12/1992 | Kuo et al. .................. 423/345 |
| 5,352,494 A | * | 10/1994 | Rousseau .................. 427/562 |
| 5,458,754 A | * | 10/1995 | Sathrum et al. ........ 204/192.38 |
| 5,516,588 A | * | 5/1996 | van den Berg et al. ...... 428/469 |
| 5,635,247 A | * | 6/1997 | Ruppi ....................... 427/348 |
| 5,654,035 A | * | 8/1997 | Ljungberg et al. ..... 427/255.34 |
| 5,683,761 A | * | 11/1997 | Bruce et al. ................ 427/596 |
| 5,851,687 A | | 12/1998 | Ljungberg |
| 5,879,823 A | * | 3/1999 | Prizzi et al. ................ 428/698 |
| 6,156,383 A | * | 12/2000 | Ishii et al. .............. 427/255.11 |
| 6,207,262 B1 | * | 3/2001 | Ichikawa et al. ............ 428/216 |
| 6,210,726 B1 | * | 4/2001 | Schiller et al. .............. 428/216 |
| 6,337,152 B1 | | 1/2002 | Kukino et al. |
| 6,495,271 B1 | * | 12/2002 | Vakil ......................... 428/632 |
| 6,599,062 B1 | * | 7/2003 | Oles et al. .................. 407/119 |
| 6,689,450 B2 | * | 2/2004 | Ruppi ........................ 428/216 |
| 7,094,447 B2 | * | 8/2006 | Ruppi ..................... 427/419.7 |
| 7,169,485 B2 | * | 1/2007 | Kohara et al. .............. 428/701 |
| 7,241,492 B2 | * | 7/2007 | Kohara et al. .............. 428/336 |
| 2004/0028951 A1 | * | 2/2004 | Ruppi ....................... 428/698 |

FOREIGN PATENT DOCUMENTS

| EP | 1247789 A2 * | 10/2002 |
| JP | 59-8679 | 1/1984 |
| JP | 5-208326 | 8/1993 |
| JP | 2742049 | 1/1998 |
| JP | 2000-44370 | 2/2000 |
| JP | 2000-218409 | 8/2000 |
| JP | 2002-53946 | 2/2002 |
| JP | 2002-543993 | 12/2002 |
| JP | 2002-543997 | 12/2002 |

OTHER PUBLICATIONS

Tolpygo, V.K. et al., "The effect of oxidation pre-treatment on the cyclic life of EB-PVD thermal barrier coatings with platinum-aluminide bond coats." Surface and Coatings Technology, vol. 200, Issues 5-6, Nov. 21, 2005, pp. 1276-1281.*

* cited by examiner

*Primary Examiner*—Bret Chen
(74) *Attorney, Agent, or Firm*—Oblon, Spivak, McClelland, Maier & Neustadt, P.C.

(57) ABSTRACT

The present invention provides a process for producing an alumina coating comprised mainly of α crystal structure on a base material.

30 Claims, 24 Drawing Sheets

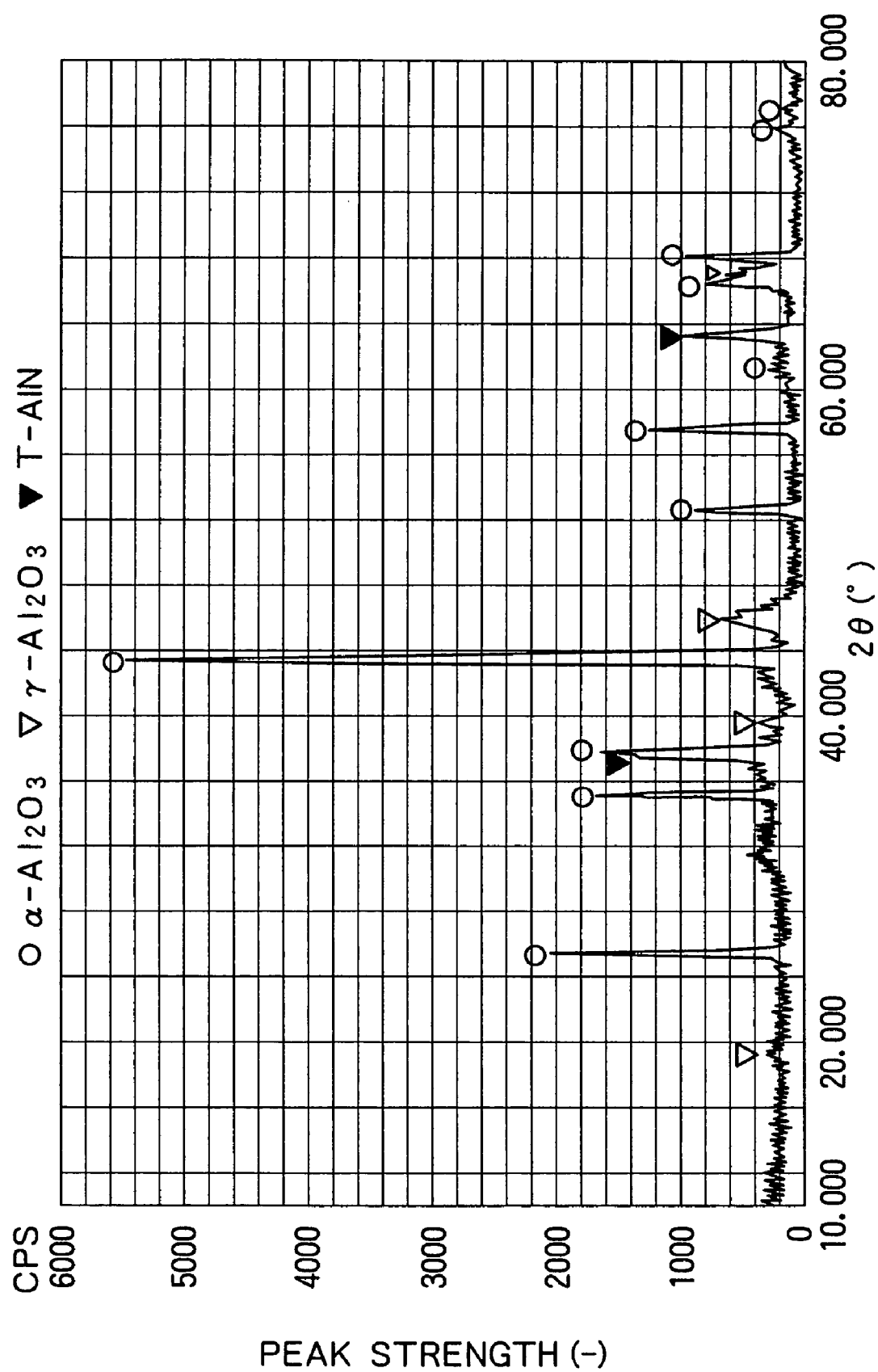

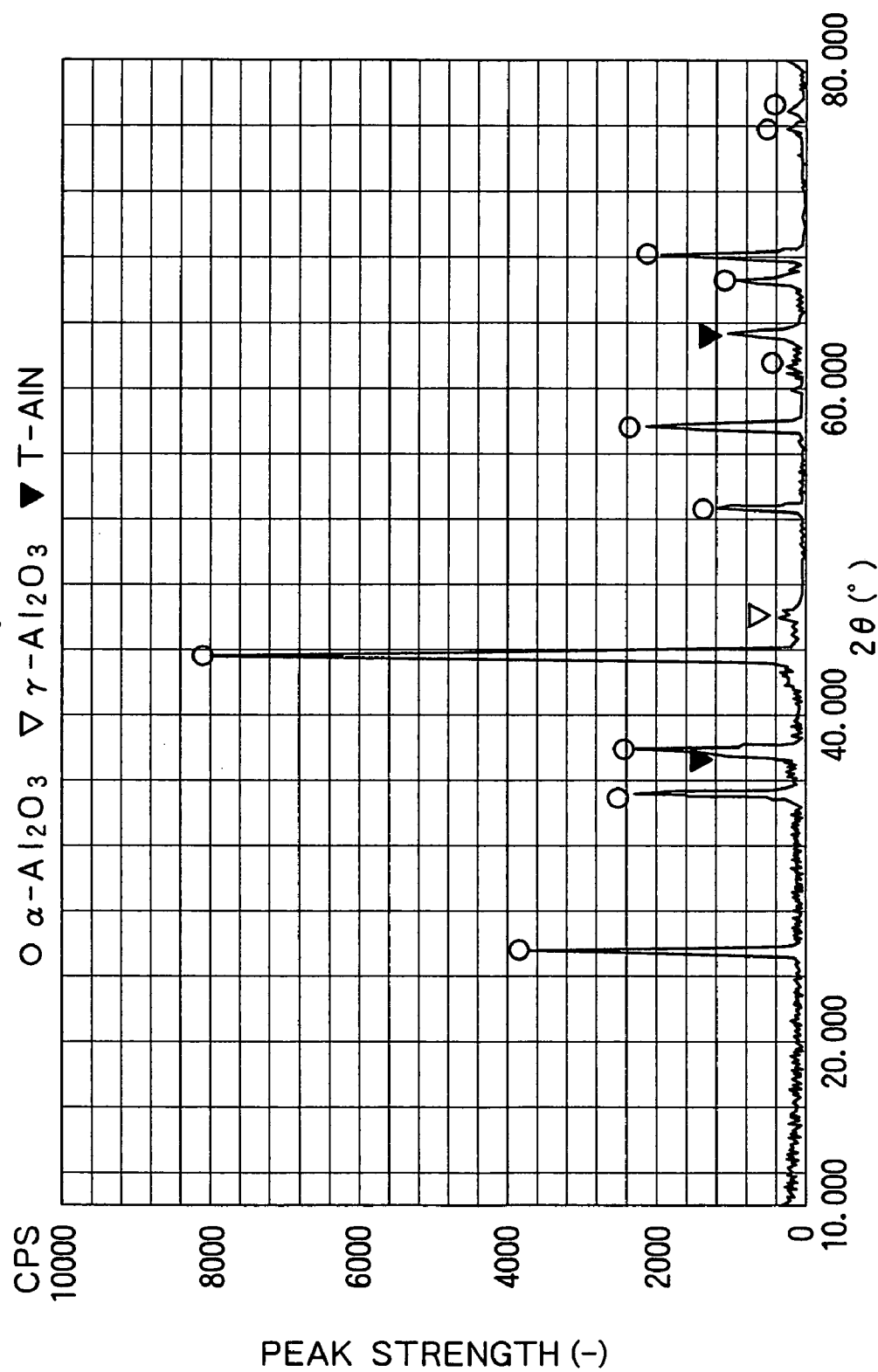

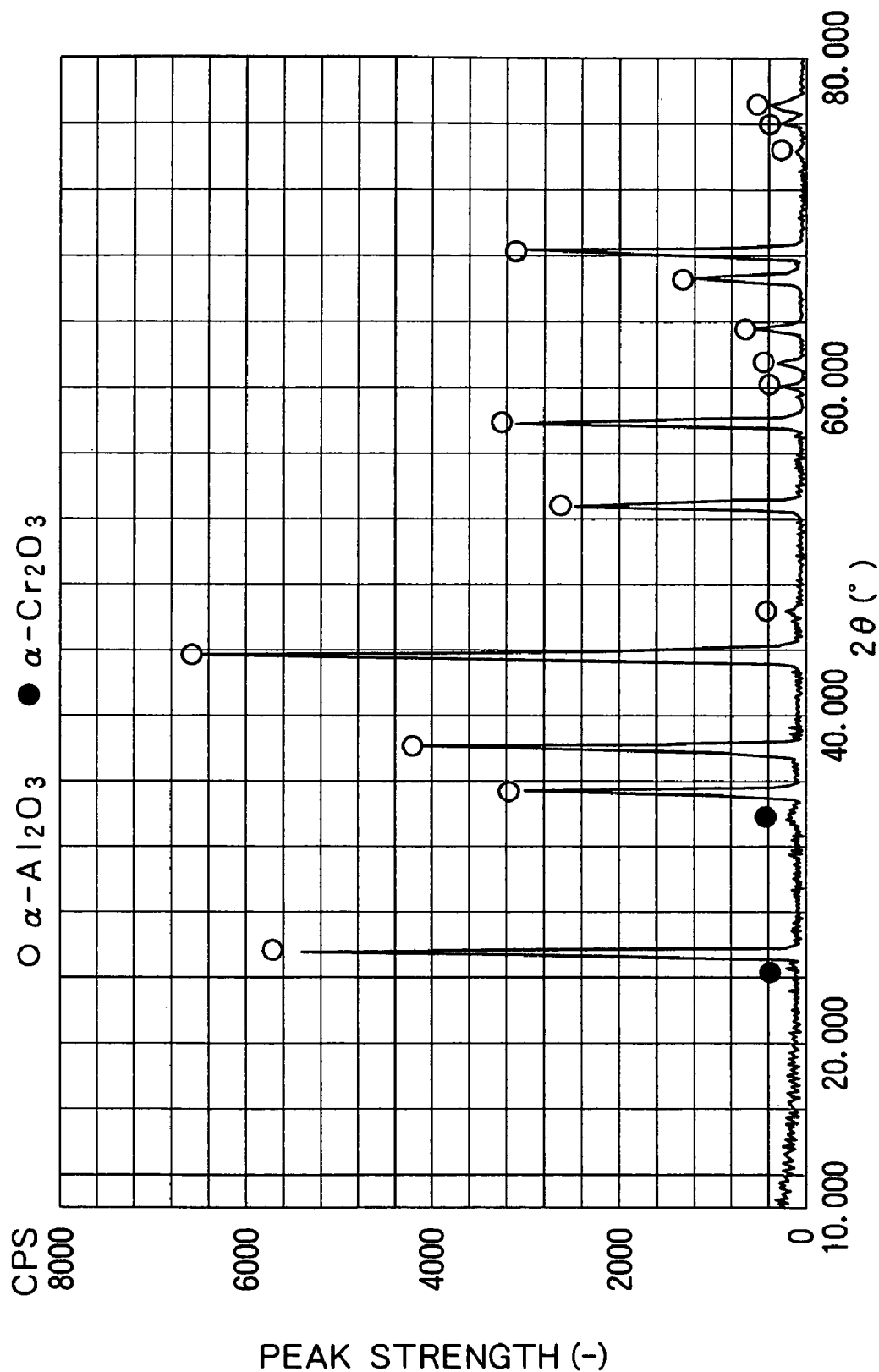

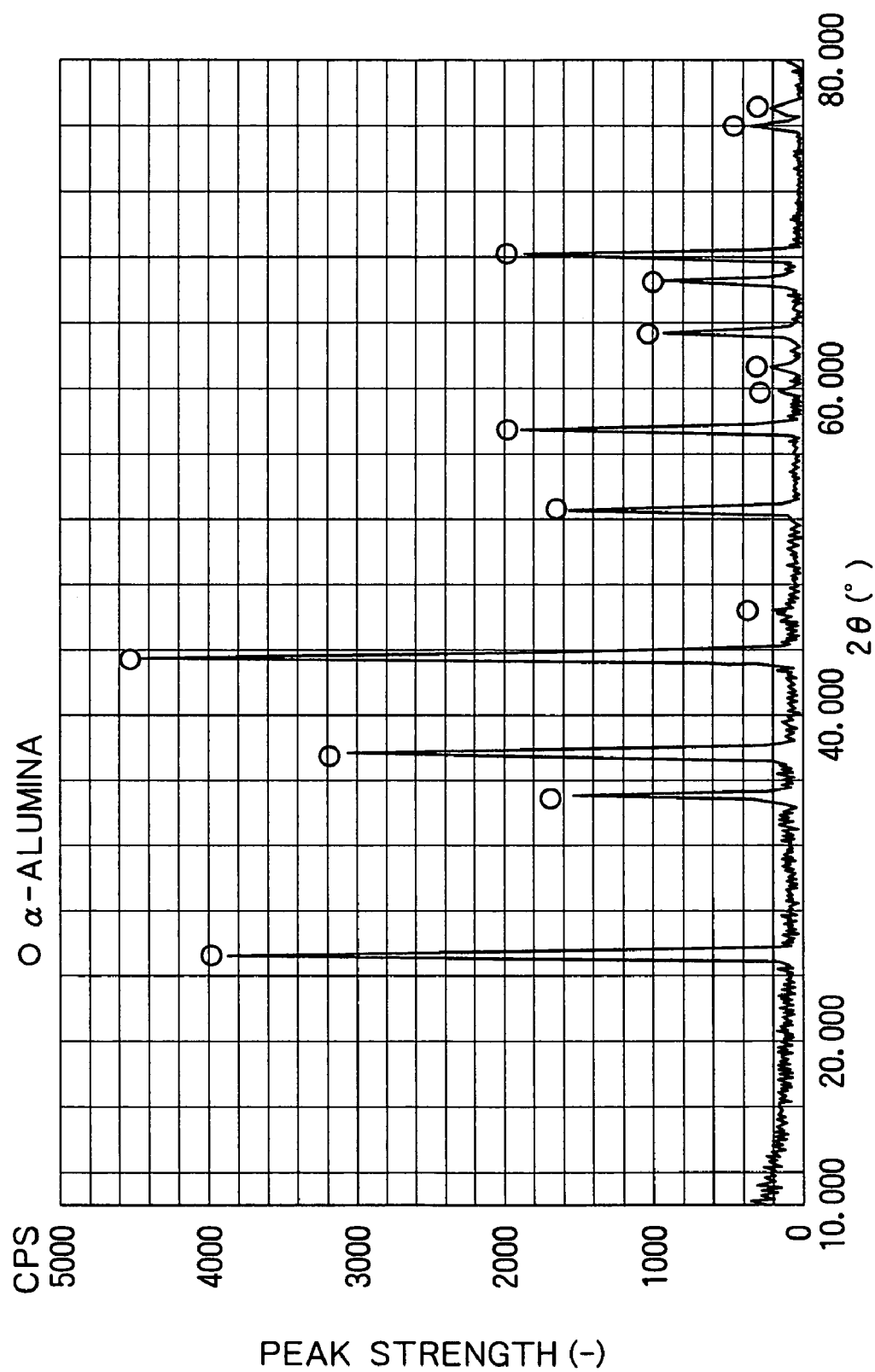

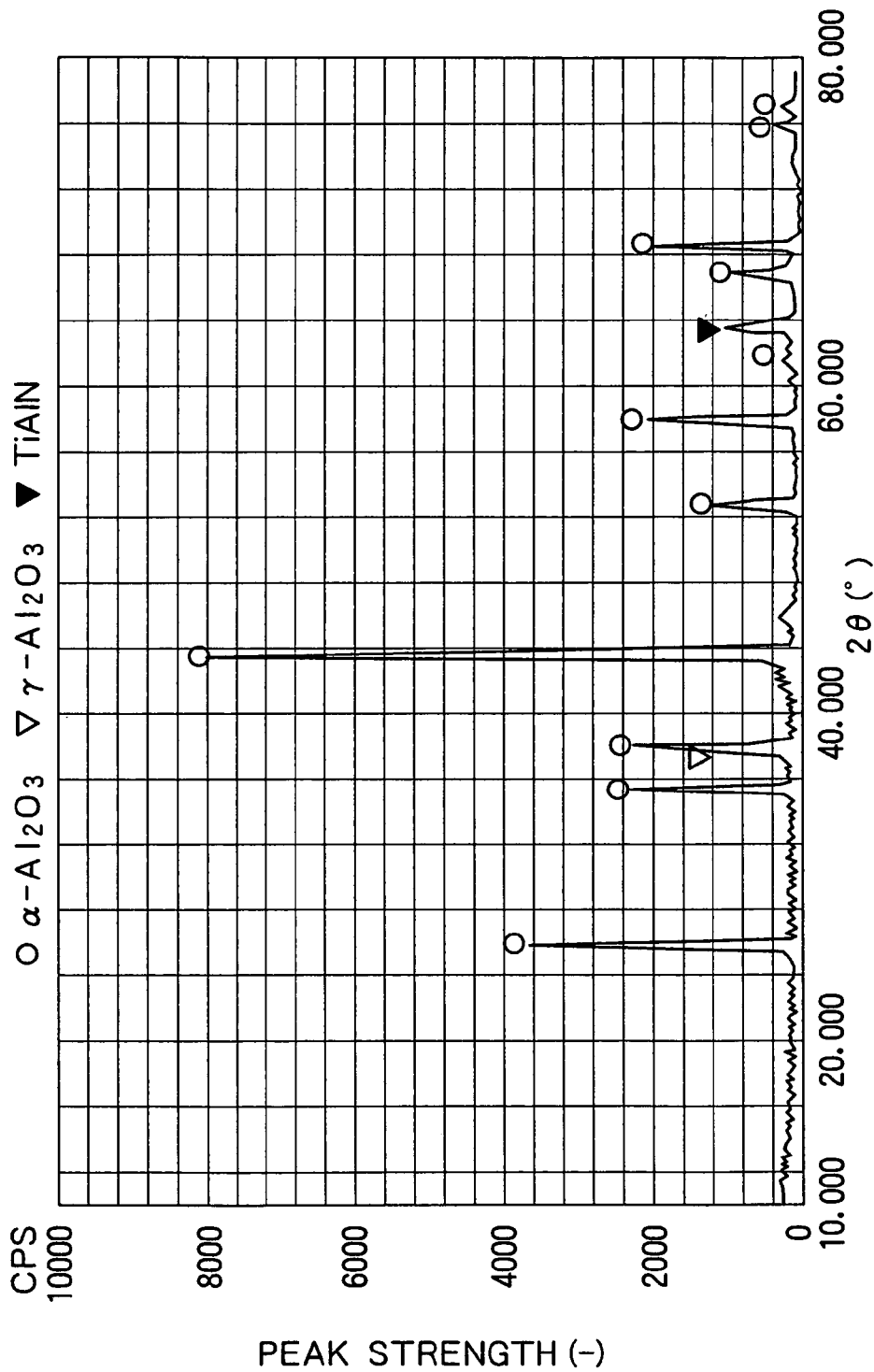

PROCESS FOR PRODUCING AN ALUMINA COATING COMPRISED MAINLY OF α CRYSTAL STRUCTURE

CROSS REFERENCES TO RELATED APPLICATIONS

This application is a national stage application of International Patent Application No. PCT/JP03/10114, file on Aug. 8, 2003, and claims priority to Japanese Patent Application No. 2002-231954, filed on Aug. 8, 2002; Japanese Patent Application No. 2002-357210, filed on Dec. 9, 2002; Japanese Patent Application No. 2003-117353, filed on Apr. 22, 2003; Japanese Patent Application No. 2003-125548, filed on Apr. 30, 2003; Japanese Patent Application No. 2003-125517, filed on Apr. 30, 2003; Japanese Patent Application No. 2003-125549, filed on Apr. 30, 2003; Japanese Patent Application No. 2003-125519, filed on Apr. 30, 2003; and Japanese Patent Application No. 2003-125550, filed on Apr. 30, 2003, all of which are incorporated herein by reference in their entireties.

TECHNICAL FIELD

The present invention relates to a process for producing an alumina coating composed mainly of α-type crystal structure, the alumina coating composed mainly of α-type crystal structure, a laminate coating including the alumina coating, a member clad with the alumina coating or the laminate coating, a process for producing the member, and a physical vapor deposition apparatus used for production thereof.

More specifically, the present invention relates to an effective process capable of forming an alumina coating composed mainly of α-type crystal structure excellent in wear resistance and heat resistance to be applied onto a wear resistant member such as a cutting tool, sliding member, or metal mold, in a low-temperature condition which never impairs the characteristic of the base material of the cutting tool, sliding member or the like, the resulting alumina coating composed mainly of α-type crystal structure, a laminate coating including the alumina coating composed mainly of α-type crystal structure, a member clad with the alumina coating or the laminate coating, a process for producing the member, and further a physical vapor deposition apparatus for forming an oxide-based hard coating such as the alumina coating excellent in wear resistance and heat resistance to be applied onto a wear resistant member such as a cutting tool, sliding member, or metal mold, on the surface of the base material of the cutting tool, sliding member, or the like.

The present invention also relates to a useful method for producing, by use of a sintered body of cubic boron nitride excellent in wear resistance (hereinafter often referred to as CBN for short) as a base material, an alumina coating composed mainly of α-type crystal structure excellent in oxidation resistance on the base material, a surface clad member comprising such a coating formed thereon to enhance the wear resistance and oxidation resistance, a useful method for producing such a surface clad member, and the like (hereinafter often referred to as the present inventive method simply).

Although the alumina coating composed mainly of α-type crystal structure of the present invention is applicable to the above-mentioned members for various uses, the application to a cutting tool will be mainly described as a typical example.

BACKGROUND ART

As the cutting tool or sliding member for which excellent wear resistance or sliding characteristic is required, one comprising a hard coating such as titanium nitride or titanium aluminum nitride formed on the surface of a high speed steel or cemented carbide base material by means of physical vapor deposition (hereinafter referred to as PVD), chemical vapor deposition (hereinafter referred to as CVD), etc. is generally used.

Since the hard coating is required to have wear resistance and heat resistance (oxidation resistance at high temperature) as characteristics, particularly when used as the cutting tool, a titanium aluminum nitride (TiAlN) has been frequently used in recent years as a cladding material to a cemented carbide tool the cutting edge temperature of which becomes high at the time of cutting. The reason that the TiAlN can exhibit excellent characteristics is that the heat resistance is improved by the effect of aluminum contained in the coating, and stable wear resistance and heat resistance can be kept up to a high temperature of about 800° C. As the TiAlN, various ones having different composition ratios of Ti and Al are used, wherein the atomic ratio of Ti:Al having both the characteristics is almost 50:50 to 25:75 for almost all of them.

The cutting edge of the cutting tool or the like is often raised to a high temperature of 1000° C. or higher at the time of cutting. Since sufficient heat resistance cannot be ensured only with the TiAlN film in such a situation, it has been carried out to ensure the heat resistance by forming the TiAlN film and further forming an alumina layer thereon, for example, as disclosed in Japanese Patent No. 2742049.

Alumina can take various crystal structures depending on the temperature, but is in a thermally metastable state in each case. When the temperature of the cutting edge remarkably fluctuates in a wide range extending from ordinary temperature to 1000° C. or higher, the crystal structure of alumina is changed, causing a problem such as cracking or peeling of the coating. However, only the alumina of α-type crystal structure (corundum structure) formed by raising the base material temperature to 1000° C. or higher by use of the CVD method can keep, if once formed, a thermally stable structure regardless of the subsequent temperature. Accordingly, cladding of the alumina coating of α-type crystal structure is regarded as an effective means to give heat resistance to the cutting tool or the like.

However, since heating of the base material to 1000° C. or higher is required to form the alumina of α-type crystal structure as described above, applicable base materials are limited. This is because a certain type of base materials might get soft, when exposed to a high temperature of 1000° C. or higher, and lose the adequacy as the base material for wear resistant member. Even a high-temperature base material such as cemented carbide causes a problem such as deformation, when exposed to such a high temperature. The practical temperature range of a hard coating such as a TiAlN film formed on the base material as a film exhibiting wear resistance is generally about 800° C. at a maximum, and the coating might be altered, when exposed to a high temperature of 1000° C. or higher, to deteriorate the wear resistance.

Against such a problem, it is reported in Japanese Patent Laid-Open No. Hei 5-208326 that an $(Al,Cr)_2O_3$ mixed crystal having a high hardness of the same level as the above-mentioned alumina was obtained in a low temperature range of 500° C. or lower. However, in case of a work material composed mainly of iron, since Cr present on the surface of the mixed crystal coating is apt to react with the iron in the work material at the time of cutting, the coating is severely worn to shorten the life.

Further, it is also reported by O. Zywitzki, G. Hoetzsch et al. in "Surf. Coat. Technol." (86-87 1996 p. 640-647) that a reactive sputtering is carried out by use of a pulse power source of high output (11-17 kW), whereby an alumina coating of α-type crystal structure could be formed at 750° C. However, enlargement of the pulse power source is inevitable to obtain alumina of α-type crystal structure by this method.

As a technique which solved such a problem, it is disclosed to form an oxide coating of corundum structure (α-type crystal structure) having a lattice constant of $\geq 4.779$ Å and $\leq 5.000$ Å and a coating thickness of at least 0.005 μm as a primary layer, and then form an alumina coating of α-type crystal structure on this primary layer in Japanese Patent Laid-Open No. 2002-53946, wherein the component of the oxide coating is preferably any one of $Cr_2O_3$, $(Fe,Cr)_2O_3$, and $(Al,Cr)_2O_3$, $(Fe_x,Cr_{(1-x)})_2O_3$ (wherein x is $0 \leq x \leq 0.54$) is more preferably adapted when the component of the oxide coating is $(Fe,Cr)_2O_3$, and $(Al_y,Cr_{(1-y)})_2O_3$ (wherein y is $0 \leq y \leq 0.90$) is more preferably adapted when the component of the oxide coating is $(Al,Cr)_2O_3$.

The above Japanese Patent Laid-Open No. 2002-53946 also indicates that it is advantageous to form a composite nitride coating composed of one or more elements selected from the group consisting of Ti, Cr and V and Al as a hard coating, form a coating composed of $(Al_z, Cr_{(1-z)})N$ (wherein z is $0 \leq z \leq 0.90$) thereon as an intermediate layer, further oxidize the coating to form an oxide coating of corundum structure (α-type crystal structure), and then form α-type alumina on the oxide coating. According to this method, the alumina of α-type crystal structure can be formed at a low temperature of base material.

In the above method, at the formation of the alumina coating of α-type crystal structure, $Cr_2O_3$ having corundum structure (α-type crystal structure) must be formed separately as the intermediate coating by forming, for example, a CrN coating and oxidizing the CrN coating. Therefore, there is still room for improvement from the point of enhancing the efficiency of formation of laminate coating. Since a Cr-containing coating such as $Cr_2O_3$ or $(CrN+Cr_2O_3)$ formed as the intermediate layer is not generally used as the material for cutting tool, the deterioration of cutting performance is feared. Accordingly, there would be further room for improvement also from the point of enhancing the cutting performance.

From such a point of view, in the present invention, examinations were made to realize an effective process capable of efficiently forming an alumina coating composed mainly of α-type crystal structure excellent in wear resistance and heat resistance or a laminate coating having the alumina coating composed mainly of α-type crystal structure without any intermediate coating in a relatively low-temperature condition with a minimized device load while suppressing the deterioration of characteristics or deformation of the base material or hard coating, a laminate coating excellent in wear resistance and heat resistance obtained by this method, and a tool (member) clad with the laminate coating (the alumina coating of α-type crystal structure).

Although the alumina coating obtained by the above-mentioned method is an alumina composed mainly of α-type crystal structure, diffraction peaks showing alumina of crystal structures other than α-type such as α-type were often observed in its X-ray diffraction pattern. Further, even if an alumina coating substantially consisting of only α-type crystal structure was obtained, it was often observed by SEM (scanning electron microscopy) that alumina grains on this coating surface had large spaces or uneven sizes. Accordingly, to further surely obtain an alumina coating excellent in wear resistance and heat resistance, it would appear that a further improvement is required.

From this point of view, in the present invention, examinations were made to provide an effective process for suppressing generation of crystal phases other than α-type crystal structure and for forming an alumina coating excellent in wear resistance and heat resistance with further minute and uniform alumina grains in a low-temperature condition which never impairs the characteristics of the base material for cutting tool, sliding member or the like.

Further, although crystalline α-alumina can be formed at a relatively low base material temperature according to the above-mentioned conventional method, this method has a disadvantage that a high-temperature or long-time oxidation treatment is required in the oxidation process because the intermediate layer is a stable nitride represented by CrN, in addition to the disadvantage that the intermediate layer must be limited to a nitride coating which can form, when oxidized, an oxide of corundum structure having a specified lattice constant. Accordingly, further examinations are required to perform the oxidization treatment in a further short time.

From this point of view, examinations were made to provide an effective process for producing an alumina coating composed mainly of α-type crystal structure and capable of performing the oxidation process at a relatively low temperature in a short time without limiting a metal element constituting the intermediate layer to a metal element which forms an oxide having the specified lattice constant structure, a member clad with such an alumina coating, and an effective process for producing the member clad with the alumina coating.

Further, examinations were made also for the purpose of providing an effective process capable of forming an alumina coating composed mainly of α-type crystal structure excellent in wear resistance and heat resistance on various kinds of base materials without forming a specified intermediate layer, a member clad with the alumina coating, and a process for producing the member.

In the present invention, in addition to the process for forming α-alumina on a hard coating such as TiAlN, TiN, and TiCN which are frequently used as hard coating, without interposing a special intermediate layer or the like as described above, research and development for a device structure for realizing it were also made.

Although excellent wear resistance and heat resistance are required for the cutting tool as described above, cemented carbide, high speed steel, cBN or the like is known as the material used for the cutting tool. Those having various hard coatings further formed on the surface of such a material (base material) have been extensively used as the cutting tools.

Among various materials described above, cBN is said to be excellent in strength or wear resistance, compared with other materials. As an example of using cBN, a technique disclosed in Japanese Patent Laid-Open No. Sho 59-8679 (claims etc.) is known. In this technique is proposed a surface-laded cBN-based ceramic cutting tool, comprising a hard coating layer composed of a single layer of one of a cemented carbide, nitride, carbonitride and carboxide of Ti and aluminum oxide or a composite layer of two or more thereof, the hard coating being formed in an average layer thickness of 5-20 □m by adapting the physical vapor deposition (PVD) or chemical vapor deposition (CVD) on the surface of a sintered cBN base material having a composition consisting of 20-50 vol % of a ceramic binder phase composed of TiC, TiN or TiCN, $Al_2O_3$, WC, $TiB_2$, etc. and the substantially remaining percentage of a cBN dispersed phase. This tool is used in a cutting work of high hardness quenched steel or cast iron.

It can be said that the characteristic of the cutting tool is determined by a proper combination of the tool base material with the hard coating to be formed on the surface thereof. From this point of view, it is an oxide aluminum ($Al_2O_3$: alumina) coating that is the most attractive as a cladding material when the base material is the sintered cBN. This is because the $Al_2O_3$ coating excellent in chemical stability is applied onto the sintered cBN excellent in plastic deformation resistance under a high temperature as the base material with good adhesion, whereby a clad member excellent in wear resistance particularly crater resistance, under high temperature and high load can be constituted, and thus suitable for application to the cutting tool which requires such characteristics.

From this point of view, various techniques for forming the alumina coating on the sintered cBN base material have been proposed. For example, with a goal of providing a cutting tool excellent in wear resistance, especially crater wear resistance in order to attain the high-hardness work material cutting and high-speed and high-efficiency cutting of iron based materials, a tool having one or more $Al_2O_3$ layers formed on at least a part of the surface involved in cutting of the sintered cBN base material is proposed in Japanese Patent Laid-Open No. 2000-44370 (claims, etc). This sintered body base material contains 20-99 vol % of a cBN dispersed phase, and 1.0 to less than 10 vol % of $Al_2O_3$ with an average grain size of 1 μm or less as a binder phase, and the alumina coating is formed on the base material in a thickness of about 0.5-50 μm. It is also disclosed therein that the $Al_2O_3$ coating is advantageously controlled to have an average grain size of 0.01-4 μm when the thickness is 0.5-25 μm, and to an average grain size of 0.01-10 μm when the thickness is more than 25 to 50 μm.

On the other hand, as a technique relating to a coated cBN cutting tool for metal working, for example, a tool composed of one or more cBN sintered bodies with or without a sintered cemented carbide support body is disclosed in Japanese Patent Publication No. 2002-543993 (claims, etc.), wherein the coating layer is formed of one or more layers of heat resistant compounds, and at least one of the layers consists of minute crystalline α-phase alumina of a grain size of less than 0.1 μm. This alumina layer is deposited by double-pole pulse DMS (dual magnetron sputtering) technique at a base temperature of 450-700° C.

Otherwise, as the similar technique relating to the cBN cutting tool, for example, a tool having the same structure but characterized by depositing the α-phase alumina as the coating by plasma activation chemical vapor deposition (PACVD) is disclosed in Japanese Patent Publication No. 2002-543997 (claims, etc.). In this technique, the tool base material to be coated is fixed, and a double-pole pulse DC voltage is applied between two electrically connected electrodes, whereby a plasma is brought thereto.

Even various techniques proposed up to now with respect to the formation of alumina coatings have the following problems. Namely, although the alumina coatings formed by the techniques of the above-mentioned Japanese Patent Publication Nos. 2002-543993 (claims, etc.) and 2002-543997 (claims, etc.) are composed of alumina having γ-type crystal structure (γ-alumina), the γ-alumina is often transformed to alumina of α-type crystal structure (α-alumina) which is naturally stable when the coatings are exposed to a high-temperature environment as the α-alumina has metastable crystal form among other alumina having various crystal forms, and cracking or peeling of the coatings might be caused according to this transformation. Therefore, these techniques cannot sufficiently respond to the recent cutting works which are increasingly speeded up.

In the technique shown in Japanese Patent Laid-Open No. 2000-44370 (claims, etc.), alumina having α-type crystal structure is also included in the alumina coating formed thereby, and the problem as described above is never caused in this crystal form. However, the composition of the binder phase in the sintered cBN forming the coating is limited in this technique. Further, although the CVD method is shown as a method for forming the α-alumina coating in this technique, a high-temperature atmosphere where the substrate temperature exceeds 1000° C. is required for the formation of the coating in this method, and such a high temperature might cause the overheating and transformation of the sintered cBN of the base material to an hBN phase, which consequently leads to an undesirable situation.

From such a point of view, the present inventors made examinations also for a process for producing an alumina coating capable of forming an alumina coating composed mainly of α-type crystal structure on a sintered cBN base material without depending on the high temperature as in the CVD method and specifying the composition of the sintered cBN, a member clad with such an alumina coating, and an effective process for producing the alumina clad member.

DISCLOSURE OF THE INVENTION

<First Mode>

As a means for obtaining a laminate coating having an alumina coating composed mainly of α-type crystal structure excellent in wear resistance and heat resistance, the following means are given.

A laminate coating according to the present invention comprises an oxide-containing layer formed by providing a laminate coating having a hard coating including a metal component containing Al and Ti as unavoidable elements and a compound of B, C, N, O, etc., and oxidizing the hard coating, and an alumina coating composed mainly of α-type crystal structure formed on the oxide-containing layer (hereinafter often referred to as Mode 1-a).

The outermost surface side of the oxide-containing layer is preferably substantially composed of alumina, and the hard coating layer is particularly preferably composed of TiAlN.

As the hard coating including the metal component containing Al and Ti as unavoidable elements and the compound of B, C, N, O, etc., one composed of a nitride, cemented carbide, carbonitride, boride, nitroxide, or carbonitroxide containing Al and Ti and at least one element selected from the group consisting of metals of the groups IVa (except Ti), Va, and VIa and Si as unavoidable components may be adapted. In this case, one consisting of TiAlCrN is particularly preferably used.

Further, the laminate coating according to the present invention may comprise an oxide-containing layer the outermost surface side of which is substantially composed of alumina, the layer being formed by providing a hard coating composed of a metal component containing Al as an unavoidable element and a compound of B, C, N, O, etc. and oxidizing the hard coating, and an alumina coating composed mainly of α-type crystal structure formed on the oxide-containing layer (hereinafter often referred to as a Mode 1-b).

As the hard coating composed of a metal component containing Al as an unavoidable element and a compound of B, C, N, O, etc., one composed of a nitride, cemented carbide, carbonitride, boride, nitroxide, or carbonitroxide containing Al and at least one element selected from the group consisting of metals of the groups IVa, Va and VIa and Si as unavoidable elements is preferably used.

In the alumina coating formed on the oxide-containing layer, the α-type crystal structure preferably accounts for 70% or more.

In the present invention, a tool clad with laminate coating having such a laminate coating formed on the surface is also included in a protection object.

In addition to the laminate coating having an alumina coating composed mainly of α-type crystal structure in the above Mode 1-a or 1-b, the present invention also regulates a process for producing the alumina coating composed mainly of α-type crystal structure or the laminate coating, which is characterized by forming a hard coating, oxidizing the surface of the hard coating to thereby form an oxide-containing layer, and forming an alumina coating composed mainly of α-type crystal structure on the oxygen-containing layer.

The formation of the oxide-containing layer is preferably carried out while retaining the substrate temperature at 650-800° C. in an oxidizing gas-containing atmosphere, and the formation of the alumina coating composed mainly of □-type crystal structure is preferably carried out by the PVD method. The "substrate temperature" in this oxidation treatment means a temperature of a base material such as cemented carbide, carbon steel, or tool steel, and the hard coating formed on the base material (hereinafter the same applies to).

The formation of the oxide-containing layer and the formation of the alumina coating composed mainly of α-type crystal structure are preferably carried out within the same apparatus from the point of improvement in productivity. More preferably, the formation of the hard coating, the formation of the oxide-containing layer, and the formation of the alumina coating composed mainly of α-type crystal structure are all carried out within the same apparatus throughout.

The present invention regulates the following process in order to provide a laminate coating having an alumina coating composed mainly of □-type crystal structure. Namely, the present invention involves a process for producing a laminate coating having an alumina coating formed on a hard coating composed of a metallic compound, comprising forming a hard coating composed of a metal having a standard free energy of oxide generation larger than that of aluminum and a compound (e.g., nitride, cemented carbide, carbonitride, boride, nitroxide, or carbonitroxide) of B, C, N, O, etc., oxidizing the surface of the hard coating to thereby form an oxide-containing layer, and forming an alumina coating composed mainly of α-type crystal structure while being accompanied by reduction of the oxide at the surface of the oxide-containing layer (hereinafter often referred to as Mode 1-c).

As the metal having a standard free energy of oxide generation larger than that of aluminum, Ti is preferably used. In this case, a laminate of one or more layers selected from the group consisting of TiN, TiC and TiCN is preferably formed.

Further, it is desirable to form a composition gradient layer of both material constituting elements to be connected to the connecting interface between the hard coating and the base material or between the hard coatings, since the adhesion between the base material and the hard coating or between the hard coatings can be enhanced.

When the hard coating containing Ti having a standard free energy of oxide generation larger than that of aluminum as a metal component is used as the hard coating, the process for producing the laminate coating (the alumina coating composed mainly of α-type crystal structure) preferably comprises oxidizing the surface of this hard coating to form a titanium oxide-containing layer, and forming an alumina coating while being accompanied by reduction of the titanium oxide on the layer surface. More specifically, it is preferable to form a $TiO_2$-containig layer as the oxide-containing layer (the titanium oxide-containing layer), and then form the alumina coating while being accompanied by reduction of $TiO_2$ at the layer surface to $Ti_3O_5$ in the formation of alumina.

The formation of the oxide-containing layer is preferably carried out while retaining the substrate temperature at 650-800° C. under an oxidizing gas-containing atmosphere. The formation of the alumina coating composed mainly of α-type crystal structure is preferably carried out by the PVD method.

In the above process, the formation of the oxide-containing layer and the formation of the alumina coating composed mainly of α-type crystal structure are also preferably carried out within the same apparatus from the point of improvement in productivity. More preferably, the formation of the hard coating, the formation of the oxide-containing layer, and the formation of the alumina coating composed mainly of α-type crystal structure are all carried out within the same apparatus throughout.

A laminate coating excellent in wear resistance and heat resistance produced in Mode 1-c, comprising an alumina coating composed mainly of α-type crystal structure formed on a hard coating composed of a metallic compound, and a tool clad with laminate coating excelling in wear resistance and heat resistance, comprising the laminate coating formed on the surface are also included in the protection object of the present invention.

<Second Mode>

As another process for producing an alumina coating composed mainly of α-type crystal structure, the present invention regulates a process for producing an alumina coating composed mainly of α-type crystal structure on a base material (including a base material having a primary coating preliminarily formed thereon), which has the gist in the point that at least any one coating of (a)-(c) described below is formed prior to the deposition process of alumina, the resulting surface is oxidized, and the alumina coating is formed thereon (hereinafter often referred to as Mode 2).

(a) A coating composed of a pure metal or alloy
(b) A coating composed mainly of a metal solid-dissolving nitrogen, oxygen, carbon or boron
(c) A coating composed of a metal nitride, oxide, cemented carbide or boride containing nitrogen, oxygen, carbon or boron insufficient to the stoichiometric composition In the present invention, the oxidation treatment is preferably carried out while retaining the base material temperature at 650-800° C. under an oxidizing gas atmosphere in a vacuum chamber.

The present invention regulates also a clad member including an alumina coating composed mainly of α-type crystal structure formed on a base material (including a base material having a primary coating preliminarily formed thereon), which has the gist in the point that at least any one of the coatings (a)-(c) is formed on the base material surface as an intermediate layer, and an oxide-containing layer and an alumina coating composed mainly of α-type crystal structure are successively formed on the surface side of the intermediate layer.

At the production of such a clad member, the following is advantageous:

(I) To successively carry out the process of forming at least any one of the coatings (a)-(c) on the base material as an intermediate layer, the process of oxidizing the surface of the intermediate layer, and the process of forming the alumina coating composed mainly of α-type crystal structure within the same deposition apparatus; or (II) To successively carry out the process of forming a primary coating on the base material, the process of forming at least any one of the coatings (a)-(c) on the surface of the primary coating as an intermediate layer, the process of oxidizing the surface of the intermediate layer, and the process of forming the alumina coating composed mainly of α-type crystal structure with the same deposition apparatus.

<Third Mode>

The present invention also regulates a process for forming an alumina coating composed mainly of α-type crystal structure by use of a sintered cBN as a base material (hereinafter also referred to as Mode 3). This process is a process for producing an alumina coating composed mainly of α-type crystal on a sintered cBN base material composed of a binder phase and a cubic boron nitride dispersed phase, which has the gist in the point that the surface of the sintered cBN base material is oxidized, and an alumina coating is then formed.

In this process, the binder phase in the sintered cBN, for example, includes one or more selected from the group consisting of TiC, TiN, TiCN, AlN, $TiB_2$ and $Al_2O_3$.

The oxidation treatment is preferably carried out while retaining the base material temperature at 650-800° C. in an oxidizing gas atmosphere, and the formation of the alumina coating composed mainly of α-type crystal structure is preferably carried out by applying the PVD method at a base material temperature of 650-800° C.

The present invention further regulates a clad member clad with an alumina coating composed mainly of α-type crystal structure. The clad member means a clad member clad with an alumina coating composed mainly of α-type crystal on a sintered cBN base material composed of a binder phase and a cubic boron nitride dispersed phase, which has the gist in the point that an oxide-containing layer is interposed in the interface between the sintered cBN and the alumina coating.

In such a clad member, the binder phase preferably includes one or more selected from the group consisting of TiC, TiN, TiCN, AlN, $TiB_2$ and $Al_2O_3$, and the binder phase is preferably included in a ratio of 1-50 vol % to the whole sintered body.

The alumina coating composed mainly of α-type crystal structure formed on the surface of the clad member has a residual stress of compression.

At the production of the above member, the process of oxidizing the surface of the sintered cBN base material and the process of forming the alumina coating composed mainly of α-type crystal structure are preferably carried out successively within the same deposition apparatus.

<Fourth Mode>

The present invention regulates the following process as the process for producing an alumina coating composed mainly of α-type crystal structure. Namely, this process is a process for forming an alumina coating composed mainly of α-type crystal structure on a base material (including a base material having a primary coating preliminarily formed thereon, hereinafter the same applies to), which has the gist in the point that a gas ion bombardment treatment is performed to the surface of the base material, the resulting surface is oxidized, and the alumina coating is formed on the oxidized surface (hereinafter often referred to as Mode 4).

As the base material, a steel product, a cemented carbide, a cermet, a sintered cBN or a sintered ceramic is preferably used.

When a base material having a primary coating formed thereon is used, it is recommended that one or more of compounds of one or more elements selected from the group consisting of elements of the groups 4a, 5a and 6a of the periodic table, Al, Si, Fe, Cu and Y with one or more elements of C, N, B and O, and a mutual solid solution of such compounds are formed as the primary coating on the base material.

The gas ion bombardment treatment is preferably carried out by applying a voltage to the base material in a gas plasma within a vacuum chamber. The oxidation treatment is preferably carried out while retaining the base material temperature at 650-800° C. in an oxidizing gas-containing atmosphere.

The present invention also regulates a process for producing a member clad with the alumina coating composed mainly of α-type crystal structure, and this method comprises successively carrying out, within the same apparatus, the following processes:

① forming a primary coating on a base material;
② performing a gas ion bombardment treatment to the surface of the primary coating;
③ oxidizing the gas ion bombardment-treated surface of the primary coating; and
④ forming an alumina coating composed mainly of α-type crystal structure.

As the primary coating, one or more kinds selected from the group consisting of Ti(C,N), Cr(C,N), TiAl(C,N), CrAl(C,N) and TiAlCr(C,N) are preferably formed. The above-mentioned Ti(C,N), Cr(C,N), TiAl(C,N), CrAl(C,N) and TiAlCr(C,N) show cemented carbides, nitrides or carbonitrides of Ti, Cr, TiAl, CrAl, and TiAlCr respectively (hereinafter the same applies to).

<Fifth Mode>

As a process for producing an alumina coating composed mainly of α-type crystal structure, the present invention further regulates a method for forming an alumina coating composed mainly of α-type crystal structure on a base material (including a base material having a primary coating preliminarily formed thereon), which has the gist in the point that a metal ion bombardment treatment is performed to the surface of the base material, the resulting surface is oxidized, and the alumina coating is then formed thereon (hereinafter often referred to as Mode 5).

The metal ion bombardment treatment can be carried out by generating a metal plasma while applying a voltage to the base material within a vacuum chamber. The oxidation treatment is preferably carried out while retaining the base material temperature at 650-800° C. in an oxidizing gas-containing atmosphere.

As the metal plasma, a plasma of Cr or Ti is preferably generated from a vacuum arc evaporation source.

The present invention also regulates a member clad with the alumina coating composed mainly of α-type crystal structure formed in the fifth mode. This member comprises an alumina coating composed mainly of α-type crystal structure formed on a base material (including a base material having a primary coating preliminarily formed thereon), wherein a concentration gradient layer in which the concentration of the metal used for the metal ion bombardment treatment is increased toward the surface layer in the vicinity of the base material surface, and an oxide-containing layer and the alumina coating composed mainly of α-type crystal structure are successively formed on the surface side of the concentration gradient layer.

The present invention also regulates a process for producing a member clad with the alumina coating composed mainly of α-type crystal structure formed in the fifth mode. When no primary coating is formed on the base material, this method comprises successively carrying out, within the same apparatus, the following processes:

① performing the metal ion bombardment treatment to the surface of the base material;
② oxidizing the metal ion bombardment-treated surface of the base material; and
③ forming the alumina coating composed mainly of α-type crystal structure thereon.

When the primary coating is preliminarily formed on the base material, this method comprises successively carrying out, within the same apparatus, the following processes:

① forming the primary coating on the base material;
② performing the metal ion bombardment treatment to the surface of the primary coating;
③ oxidizing the metal ion bombardment-treated surface of the primary coating; and
④ successively forming the alumina coating composed mainly of α-crystal structure thereon.

As the primary coating formed in the fifth mode, one or more of a compound of one or more elements selected from the group consisting of elements of the groups 4a, 5a and 6a of the periodic table, Al, Si, Cu and Y with one or more elements of C, N, B and O, a mutual solid solution of such compounds, and a single body or compound comprising one or more elements of C, N, and B is preferably formed. As the base material, a steel product, a cemented carbide, a cermet, a sintered cBN, a sintered ceramic, a crystal diamond, or a Si wafer can be used.

<Alumina Coating of the Present Invention>

The present invention regulates an alumina coating of α-type crystal structure formed in the above-mentioned mode. The alumina coating of α-type crystal structure is an alumina coating formed on a base material (including a base material having a primary coating preliminarily formed thereon) by a physical vapor deposition method, which has the gist in the point that at least a coating growth start part is formed of alumina grains of minute structure in the observation of the crystal structure of the alumina coating by cross-sectional transmission electron microscopy (magnification: 20000 times), and no other crystal structure than α-type crystal structure is substantially observed in the minute crystal area.

The "substantially" means that the present invention is never limited to 100% α-crystal structure, but inclusion of impurities inevitably included in the deposition process or an extremely trace amount of other crystal structures is permitted.

The alumina coating of the present invention shows a structure such that (A) the grain size of alumina crystals of minute structure is 0.3 μm or less within the range from the initial stage of development to a thickness direction 0.5 μm, (B) crystal structures other than α-type crystal structure are not substantially observed over the whole alumina coating, (C) the alumina of α-type crystal structure is developed in a columnar shape on the coating surface side, and the like. The alumina coating of the present invention preferably has a film thickness of 0.5-20 μm.

<Physical vapor deposition Apparatus (Deposition Apparatus)>

The present invention further regulates a physical vapor deposition apparatus used for production of the alumina coating or the like.

The physical vapor deposition apparatus of the present invention comprises a vacuum chamber, a base material holder (planetary rotary jig) for retaining a plurality of base materials, the holder being rotatably disposed in the vacuum chamber; an introduction mechanism of inert gas and oxidizing gas to the vacuum chamber, a plasma source disposed in a position opposed to the base material holder (planetary rotary jig), a sputtering evaporation source disposed in a position opposite to the base material holder (planetary rotary jig), a radiation type heating mechanism capable of heating the base material, the heating mechanism being disposed in a position opposite to the base material holder (planetary rotary jig), and a bias power supply capable of applying a negative pulse bias voltage to the base material holder (planetary rotary jig), the power source being connected to the base material holder (planetary rotary jig).

According to such a structure, all processes of physical vapor deposition relevant treatments such as the ion bombardment treatment to the base material, a thermal oxidation treatment and a deposition treatment of high heat resistance and high wear resistance coating by reactive sputtering can be efficiently and stably executed. By use of this apparatus, an alumina coating composed mainly of α-type crystal structure can be formed in a relatively low-temperature treatment condition of about 650-800° C., and the wear resistance and heat resistance of an alumina coating to be applied to, for example, a cutting tool can be enhanced.

Instead of the plasma source, or in addition to the plasma source, an arc evaporation source may be disposed in a position opposed to the base material holder (planetary rotary jig). According to this structure, the deposition treatment of the hard coating by arc ion plating, and the formation of the alumina coating can be carried out within the same apparatus. Accordingly, the kinds of depositable coatings can be diversified, and deposition of multiple layers can be also effectively carried out.

The radiation type heating mechanism may be composed of a cylindrical heating source disposed concentrically with the rotating center of the base material holder (planetary rotary jig), and a flat heating source disposed on a side surface of the base material holder (planetary rotary jig).

According to the above structure, a compact apparatus structure capable of uniformly heating the base materials from outside and inside can be provided. Further, since the distance between the base material and the heating source can be shortened, the heating efficiency can be improved.

The vacuum chamber can be formed into a square, hexagonal, or octagonal sectional shape to arrange a pair of the sputtering evaporation sources and a pair of the flat heating sources on mutually opposed inside surfaces of the vacuum chamber.

According to the above structure, a physical vapor deposition treatment apparatus having a further compact apparatus structure can be provided. Since the sputtering evaporation sources and the flat heating sources can be equally arranged, and the shape of the vacuum chamber can be matched to the shapes of the sputtering evaporation sources and flat heating sources, the internal capacity of the vacuum chamber can be reduced.

Otherwise, the vacuum chamber may be formed into a hexagonal or octagonal sectional shape to arrange a pair of the sputtering evaporation sources, a pair of the flat heating sources and a pair of the arc evaporation sources on mutually opposed inside surfaces of the vacuum chamber. According to this structure, the apparatus can have a further compact apparatus structure.

As the plasma source, a thermal electron emitting filament arranged within the vacuum chamber so that the longitudinal direction adjacent to the base material holder (planetary rotary jig) is opposed thereto may be used. According to this structure, a physical vapor deposition apparatus having a further compact device structure can be provided. The thermal electrons emitted from the filament can be efficiently guided to the base material.

BRIEF DESCRIPTION OF THE DRAWINGS

FIG. 16 is a graph showing the grazing incidence X-ray diffraction result (deposition temperature: 750° C.) of an alumina coating formed on a TiAlN coating (Comparative Case);

FIG. 17 is a graph showing the grazing incidence X-ray diffraction result (deposition temperature: 750° C.) of an alumina coating formed on a TiAlN coating (Inventive Case);

FIG. 19 is a graph showing the grazing incidence X-ray diffraction result (deposition temperature: 750° C.) of an alumina coating formed on a CrN coating (Comparative Case);

FIG. 20 is a graph showing the grazing incidence X-ray diffraction result (deposition temperature: 750° C.) of an alumina coating formed on a CrN coating (Inventive Case);

FIG. 24 is a graph showing the grazing incidence X-ray diffraction result of an alumina coating on a TiAlN coating obtained by a working example of the present invention.

BEST MODE FOR CARRYING OUT THE INVENTION (1) First Mode

As a result of studies into a process for forming an alumina composed mainly of α-type crystal structure in a temperature range of about 800° C. or lower where the characteristics of a hard coating, a base material or the like can be kept in the situation as described above, the present inventors found that either one of the following processes can be adapted to attain the present invention.

a. A first means comprising forming a hard coating composed of a metal component containing Al as an unavoidable element and a compound of B, C, N, O, etc., oxidizing the surface of the hard coating to thereby form an oxide-containing layer, and then forming an alumina coating.

b. A second means comprising forming a hard coating composed of a metal having a standard free energy of oxide generation larger than that of aluminum and a compound of B, C, N, O, etc., oxidizing the surface of the hard coating to thereby form an oxide-containing layer, and then forming an alumina coating while being accompanied by reduction of the oxide on the surface of the oxide-containing layer.

The first and second means will be further described below.

<First means (Mode 1-a and 1-b)>

As described above, as the result of studies into the process for forming the alumina coating composed mainly of α-type crystal structure (hereinafter often referred simply to as α-type-based alumina coating or a -alumina coating) in a temperature range of about 800° C. or lower where the characteristics of the hard coating, the base material or the like can be kept in the situation as described above, the present inventors found that, as the first means, an oxide-containing layer formed by forming a hard coating containing Al such as TiAlN, TiAlCrN, etc. and oxidizing the surface of the coating can be used as a bed for forming the alumina coating composed mainly of α-type crystal structure, and attained the present invention.

Although a detailed mechanism capable of providing such an effect is uncertain, the effect of the present invention is attributable to the following reason based on the high-temperature oxidizing behavior of a TiAlN coating disclosed by Ikeda et al., in "Thin Solid Films" [195 (1991) 99-110].

Figure 12:
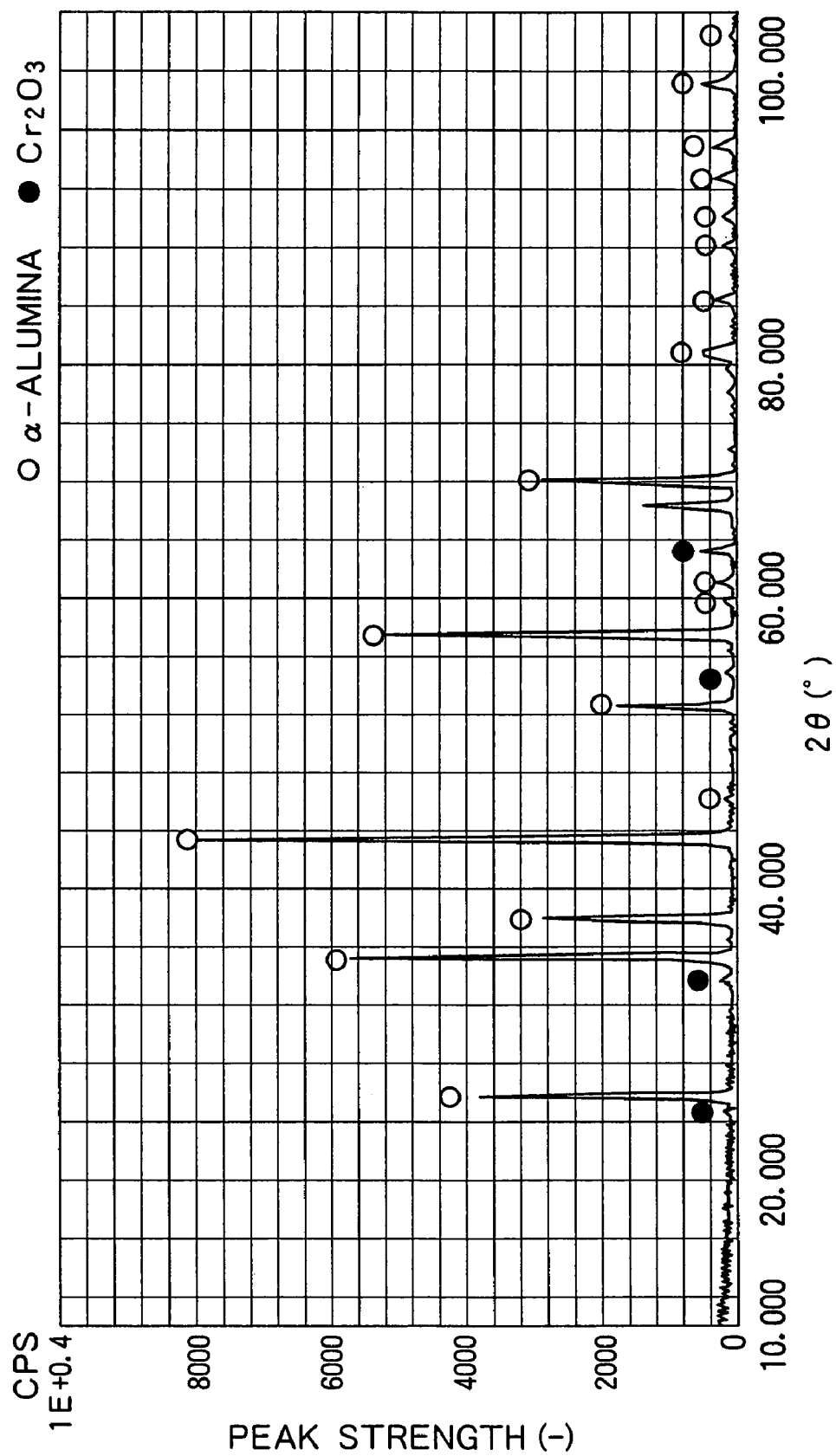
FIG. 12 is a graph showing the grazing incidence X-ray diffraction result of Comparative Case 1 in Example 1 for the first mode.

Namely, Ikeda et al. indicate in the literature that when the TiAlN coating is oxidized in a high-temperature oxygen-containing atmosphere, a thin alumina coating is deposited on the outermost surface of the TiAlN coating. As the observation result leading to this conclusion, the result of Auger depth directional analysis of the TiAlN coating (Ti:Al=50:50 by atomic ratio) oxidized by heating up to 800° C. in the atmosphere is shown in FIG. 12. FIG. 12 shows that as the membrane composition extending from the outermost surface to the coating inner part, a layer composed mainly of alumina is present in the outermost surface, a mixed oxide layer of Ti and Al in the inner side, and an oxide layer composed mainly of Ti further in the inner part.

As is apparent from working examples by the present inventors described later, since the oxidation temperature (740-780° C.) of a hard coating of TiN is relatively close to the oxidation temperature (800° C.) in the experiments by Ikeda et al., it can be estimated that the same layer as the above experimental result will be formed also in the present invention.

The present inventors further oxidized hard coatings containing various metal elements and carried out the same measurement therefor. As a result, it was found that when the surface of a hard coating containing Al is oxidized, Al in the hard coating preferentially comes up to the surface and is oxidized there, consequently easily forming alumina on the outermost surface of the formed oxidized layer; therefore, that use of such an oxide layer containing alumina as the bed for forming the alumina coating enables the formation of an alumina coating composed mainly of □-type crystal structure even in a relatively low temperature range of 800° C. or lower. The reason of causing such a phenomenon will be that when the alumina coating is formed on the oxide-containing layer formed by oxidizing the hard coating, for example, by reactive sputtering, the crystal nucleus of α-type alumina is selectively formed on the oxide-containing layer.

<Hard Coating in First Means (Mode 1-a and b)>

As a hard coating effective for ensuring excellent wear resistance for a cutting tool or the like and useful for oxidizing the hard coating to form an oxide layer effective for forming the alumina coating composed mainly of α-type crystal structure, a hard coating composed of a metal component containing Al and Ti as unavoidable elements and a compound of B, C, N, O, etc. is adapted (Mode 1-a).

As the hard coating composed of a metal component containing Al and Ti as unavoidable elements and a compound of B, C, N, O, etc., a hard coating composed of a nitride, cemented carbide, carbonitride, boride, nitroxide, carbonitroxide or the like of the metal component containing Al and Ti as unavoidable elements is given. Concretely, for example, TiAlN, TiAlCN, TiAlC, TiAlNO and the like can be used. Particularly, a hard coating composed of TiAlN is preferred. When the TiAlN coating is used as the hard coating, the composition ratio of Ti:Al may be optionally set, but is preferably within 40:60-25:75 by atomic ratio.

Further, in the present invention, the hard coating may be composed of a nitride, cemented carbide, carbonitride, boride, nitroxide, or carbonitroxide containing Al and Ti as unavoidable elements and, further, as a third element, at least one selected from the group consisting of elements of the groups IVa (except Ti), Va and VIa and Si as an unavoidable component. Examples of such a hard coating include TiAlCrN, TiAlVN, TiAlSiN, TiAlCrCN and the like. More preferably, the hard coating is composed of a nitride, cemented carbide, carbonitride, boride, nitroxide or carbonitroxide of Al, Ti and Cr, and examples thereof include TiAlCrN, TiAlCrCN, TiAlCrON, TiAlCrBN and the like. In this case, a hard coating composed of TiAlCrN is further preferably used, and it is particularly recommended that this hard coating has the following composition.

Namely, the hard coating is composed of $(Ti_a, Al_b, Cr_c)(C_{1-d}N_d)$, which satisfies $0.02 \leq a \leq 0.30$
$0.55 \leq b \leq 0.765$
$0.06 \leq c$
$a+b+c=1$ $0.5 \leq d \leq 1$ (wherein a, b, and c represent the atomic ratios of Ti, Al and Cr, respectively, and d represents the atomic ratio of N. Hereinafter the same applies to), or $0.02 \leq a \leq 0.175$
$0.765 \leq b$
$4(b-0.75) \leq$
$a+b+c=1$
$0.5 \leq d \leq 1$ The present invention further regulates a laminate coating comprising an oxide-containing layer the outermost surface side of which is substantially composed of alumina, the layer being formed by oxidizing a hard coating composed of a metal component containing Al as an unavoidable element and a compound of B, C, N, O, etc., and an alumina coating composed mainly of α-type crystal structure formed on the oxide-containing layer Node 1-b).

As the hard coating composed of a metal component containing Al as an unavoidable element and a compound of B, C, N, O, etc., a hard coating composed of a nitride, cemented carbide, carbonitride, boride, nitroxide or carbonitroxide containing Al and at least one element selected from the group consisting of elements of the groups IVa, Va, and VIa and Si as unavoidable components is preferably used. For example, in addition to those containing Al and Ti as metal components as described above, AlCrN, AlCrCN and the like are also usable.

The film thickness of the hard coating is preferably set to 0.50 □m or more in order to sufficiently exhibit the wear resistance and heat resistance expected for the hard coating, more preferably to 1 □m or more. When the film thickness of the hard coating is too large, the hard coating is apt to be cracked at the time of cutting, and the life cannot be extended. The film thickness of the hard coating is thus preferably controlled to 20 □m or less, more preferably to 10 μm or less.

The method of forming the hard coating is not particularly limited. However, when a hard coating with a high Al atomic ratio is formed in order to enhance the wear resistance and heat resistance, it is preferably formed by the PVD method (physical vapor deposition method), and AIP (ion plating) or reactive sputtering is more preferably adapted as the PVD method. The adaptation of the PVD method to form the hard coating is preferable from the point of improvement in productivity since the formation of the hard coating and the formation of the α-type-based alumina coating described later can be carried out within the same apparatus.

<Oxide-Containing Layer in First Means (Mode 1-a and b)>

In the present invention, since it is preferable to form the hard coating, oxidize the surface of the hard coating to form an oxide-containing layer thereon, particularly, to form an oxide-containing layer the outermost surface side of which is substantially composed of alumina on the surface of a hard coating containing Al, the oxidation of the hard coating is preferably carried out in the following condition.

Namely, the oxidation is preferably carried out in an oxidizing gas-containing atmosphere, for example, an atmosphere containing an oxidizing gas such as oxygen, ozone, or $H_2O_2$, including the atmosphere, because the oxidation can be efficiently performed.

As the oxidation, thermal oxidation is desirably carried out while retaining the substrate temperature at 650-800° C. This is because the oxidation is insufficient at an extremely low substrate temperature. The oxidation is desirably carried out at a temperature raised preferably to 700° C. or higher. Although the oxidation is promoted as the substrate temperature is raised, it is necessary to control the upper limit of the substrate temperature to lower than 1000° C. in light of the purpose of the present invention. In the present invention, an oxide-containing layer useful for formation of the α-type-based alumina coating can be formed even at 800° C. or lower.

In the present invention, other conditions of the oxidation treatment are not particularly limited. As a concrete oxidation method in addition to the thermal oxidation, it is also effective to make an oxidizing gas such as oxygen, ozone or $H_2O_2$ into plasma followed by irradiation.

<Alumina Coating Composed Mainly of □-Type Crystal Structure in First Mode (Mode 1-a and b>

When the oxide-containing layer is used as the bed, an alumina coating composed mainly of α-type crystal structure can be surely formed on the oxide-coating layer as described above.

This α-type-based alumina coating can exhibit excellent heat resistance when the α-type crystal structure accounts for preferably 70% or more thereof, more preferably, 90% or more, and most preferably 100%.

The film thickness of the α-type-based alumina coating is desirably set to 0.1-20 μm. In order to continue the excellent heat resistance of the alumina coating, it is effective to ensure a thickness of 0.1 μm or more, preferably 1 μm or more. However, when the film thickness of the α-type-based alumina coating is too large, an internal stress is undesirably generated in the alumina coating to make it easy to crack. Accordingly, the film thickness is preferably set to 20 μm or less, more preferably 10 μm or less, and further preferably 5 μm or less.

The method of forming the α-type-based alumina coating is not particularly limited. However, the CVD method is not preferable because it must be carried out in a high temperature range of 1000° C. or higher, and the PVD method capable of forming it in a low temperature range is desirably adapted. Sputtering is preferable as the PVD method, and reactive sputtering is particularly preferable because a high-speed deposition can be performed by use of an inexpensive metal target.

The substrate temperature in the formation of the alumina coating is not particularly regulated. However, a temperature range of about 650-800° C. is preferable because the α-type-based alumina coating can be easily formed. The α-type-based alumina coating is preferably formed while retaining the substrate temperature in the oxidation treatment constant successively to the oxidation treatment process, because the characteristic of the base material or hard coating can be maintained, and excellent productivity can be provided.

In the formation of the laminate coating according to the present invention, the formation of the oxide-containing layer and the formation of the alumina coating composed mainly of α-type crystal structure are preferably carried out within the same apparatus from the point of improvement in productivity. More preferably, all the processes of the formation of the hard coating, the formation of the oxide-containing layer and the formation of the alumina coating composed mainly of α-type crystal structure are carried out within the same apparatus.

Concretely, a base material of cemented carbide is set in a deposition apparatus (physical vapor deposition apparatus) equipped with for example an AIP evaporation source, a magnetron sputtering cathode, a heater heating mechanism, a base material rotating mechanism, etc., described later to form a hard coating such as TiAlN by use of the AIP method or the like, the surface of the hard coating is thermally oxidized in the oxidizing gas atmosphere such as oxygen, ozone or $H_2O_2$ as described above, and the alumina coating composed mainly of α-type crystal structure is then formed by use of reactive sputtering or the like.

The present invention regulates also a tool clad with laminate coating comprising such a laminate coating formed thereon. Concrete application examples thereof include a cutting tool such as a throwaway tip including a hard coating of TiAlN formed on a cemented carbide base material, an end mill including a hard coating of TiAlCrN formed on a cemented carbide base material, or a throwaway tip having a hard coating of TiAlN formed on a cermet base material a hot working metal mold used under a high temperature and the like.

<Second Means (Mode 1-c)>

As described above, the prevent inventors found that, as another means for forming an α-type-based alumina coating on a hard coating in a low temperature condition of about 800° C. or lower, the alumina coating can be formed by forming a hard coating composed of a metal having a standard free energy of oxide generation larger than that of aluminum or an element more difficult to oxidize than Al and a compound of B, C, N, O, etc., oxidizing the surface of the hard coating to thereby form an oxide-containing layer, and forming the alumina coating while being accompanied by reduction of the oxide on the surface of the oxide-containing layer.

Although the mechanism of the above means could not be perfectly clarified yet, the following mechanism is conceivable from the experimental results described below.

(a) The present inventors firstly formed a TiN coating as a hard coating on a cemented carbide base material, as shown in a working example for the first mode described later, the resulting base material was retained in an oxygen atmosphere for 20 minutes while retaining its temperature at about 760° C. to oxidize it, and an Al target was sputtered with argon in the oxygen atmosphere to thereby form an alumina coating on the oxidized film.

Figure 1:
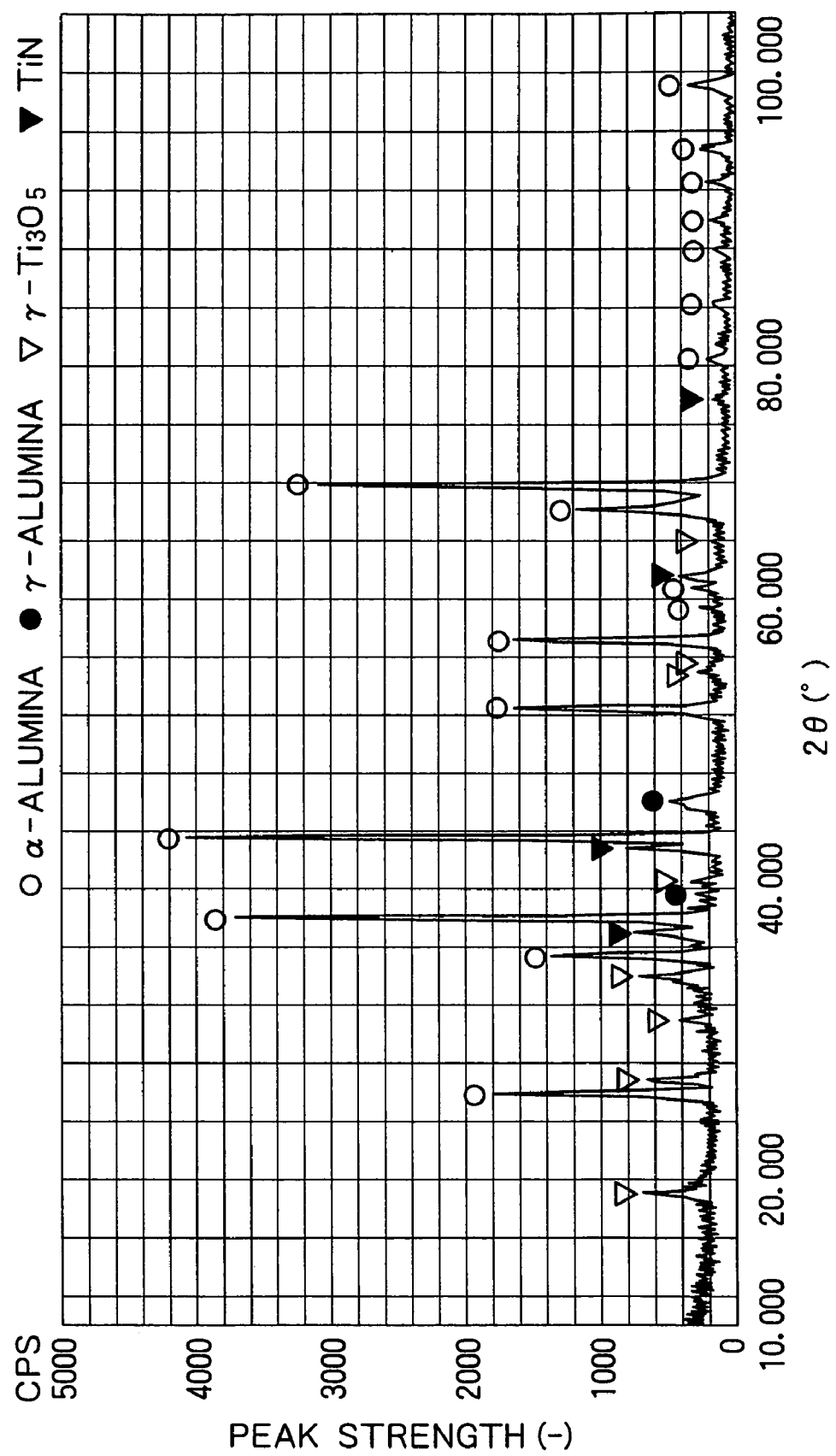
FIG. 1 is a graph showing the grazing incidence X-ray diffraction result of Inventive Case 1' (TiN coating) in Example 2 for the first mode.

FIG. 1 described later shows the result of grazing incidence X-ray diffraction of the thus-formed laminate coating. Most of peaks confirmed from FIG. 1 show alumina of α-type crystal structure, from which it is found that an alumina coating composed mainly of α-type crystal structure is formed. In case of using TiCN as the hard coating, also, the same result was obtained.

In order to pursuit the mechanism of formation of the alumina coating composed mainly of α-type crystal structure on a TiN film or TiCN film as a base, the grazing incidence X-ray diffraction result of FIG. 1 described above was examined. Consequently, peaks of TiN and γ-$Ti_3O_5$ which are conceivably compounds constituting the primary coating of the alumina coating were confirmed. It is considered that TiN is a compound constituting the hard coating, and γ-$Ti_3O_5$ is an oxide-containing layer present between the alumina coating and the TiN film.

Figure 2:
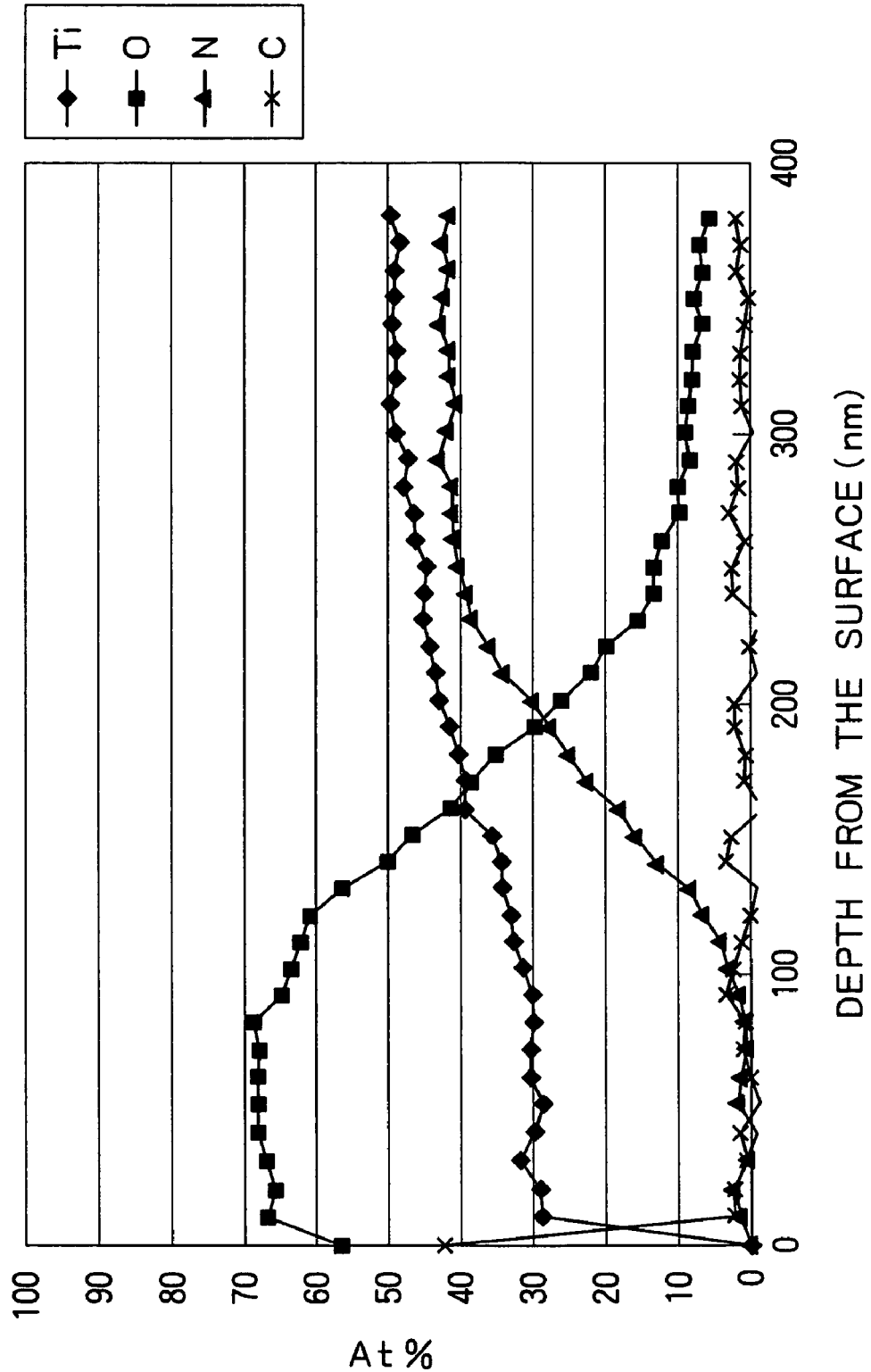
FIG. 2 is a view showing the XPS depth profile of a coating obtained by oxidizing TiN.

(b) For a coating obtained by forming a TiN film as a hard coating and oxidizing it in the same condition as in FIG. 1, its depth profile was observed by XPS. The result is shown in FIG. 2. The grazing incidence X-ray diffraction result of the coating after the oxidation treatment is also shown in FIG. 3.

Figure 3:
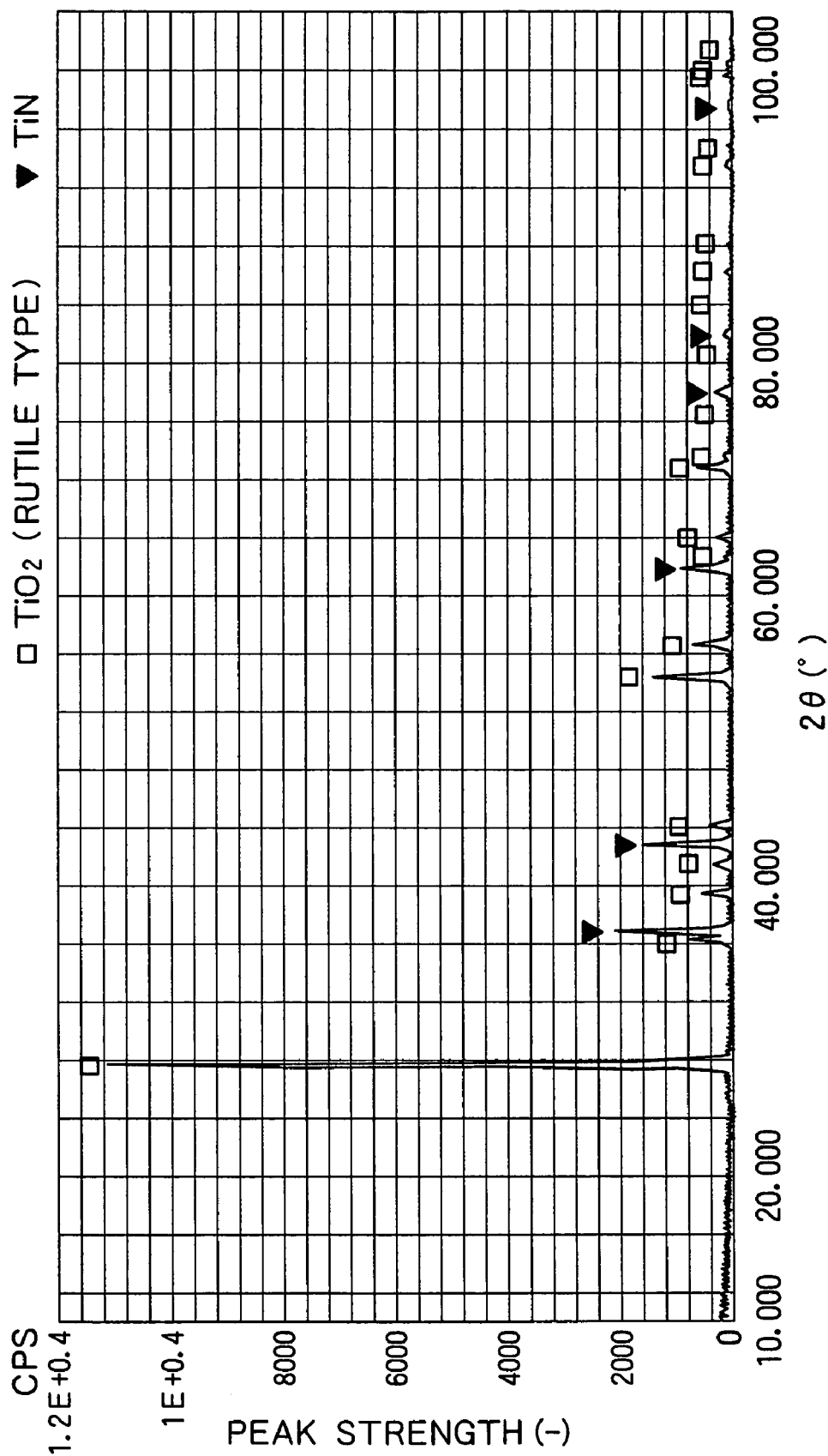
FIG. 3 is a graph showing the grazing incidence X-ray diffraction result of the coating obtained by oxidizing TiN.

It is found from FIGS. 2 and 3 that $TiO_2$ (rutile type) is formed to a depth of about 100 nm from the surface layer of the coating after the oxidation treatment. The same result was obtained in the oxidation treatment of a TiCN coating.

The results of the above (a) and (b) show that the $TiO_2$ formed by the oxidation treatment is reduced to $Ti_3O_5$ in the following forming process of the alumina coating.

(c) The present inventors already confirmed by the experiment of forming an alumina coating on a $Cr_2O_3$ coating that the alumina formed more easily takes the α-crystal structure as the oxygen concentration in the deposition atmosphere is higher, or the alumina of α-type crystal structure is more difficult to obtain as the oxygen concentration is lower.

The present inventors found from the results of (a)-(c) that the crystal growth of alumina of α-type crystal structure is promoted in the alumina coating forming process (particularly at its initial stage) by the action of the oxygen generated by the reduction of the oxide in the coating, in addition to the oxygen supplied to form the deposition atmosphere, that is the crystal growth of alumina of α-type crystal structure can be promoted by creating a state capable of promoting the reduction reaction of the oxide formed in the oxidation treatment of the hard coating to enhance further the oxygen concentration of the deposition atmosphere. Conditions for realizing such a mechanism will be described in detail.

<Hard Coating in Second Means (Mode 1-c)>

It was found that, in order to promote the supply of oxygen from the alumina coating side, or the reduction of the oxide in the oxide-containing layer in the alumina coating forming process, the hard coating preferably contains an element such that "it is oxidized in the oxidation treatment process to form an oxide, but the oxide is easily reduced in the presence of Al in the alumina coating forming process" as a metal element, and it is highly effective therefor to adapt an element having a standard free energy of oxide generation larger than that of aluminum.

Examples of the element having a standard free energy of oxide generation larger than that of aluminum include Si, Cr, Fe, Mn and the like. Among them, a hard coating containing Ti as a metal component is preferably used since Ti has a larger standard free energy for oxide formation of about −720 kJ/(g·mol) at about 750° C., compared with the standard free energy for oxide formation of aluminum of about −900 kJ/(g·mol), and is easily reduced in the presence of Al. From the point that an alumina coating of α-type crystal structure can be formed on a hard coating such as TiC or TiN generally used in the cutting tool or the like, the use of the hard coating containing Ti as the metal component is also preferable.

The hard coating may be composed of this metal and a compound of B, C, N, O, etc. For example, the hard coating can be composed of a nitride, cemented carbide, carbonitride, boride, nitroxide, or carbonitroxide containing this metal as an unavoidable component. Concrete examples thereof include TiN, TiCN, TiC, TiCNO, TiCrN, TiSiN and the like.

In the present invention, TiN, TiCN and TiC are preferably used among them. Concretely, TiN, TiCN or TiC can be laminated in two layers or more on a base material, in addition to its single formation on a base material.

In this case, a composition gradient layer of both material constituting elements to be connected may be formed in the connecting interface between the hard coating and the base material or between the hard coatings to enhance the adhesion between the base material and the hard coating or between the hard coatings.

As a concrete example of providing the composition gradient layer, when a TiN coating is formed on a base material, a layer in which the composition ratio of N to the Ti metal coating is increased continuously or stepwise from the base material side is provided, and the TiN coating is formed on this composition gradient layer. Further, when a TiCN coating is formed on a TiN coating, for example, a layer in which the composition ratio of C to the TiN coating is increased continuously or stepwise from the TiN coating side is provided on the TiN coating as the composition gradient layer, and the TiCN film is formed on this composition gradient layer.

When a hard coating containing Ti as a metal component is used to form an alumina coating composed mainly of α-type crystal structure on the hard coating, preferably, a hard coating composed of a compound such as a nitride containing Ti as an unavoidable element such as TiN or TiCN is formed, the surface of the hard coating is oxidized to form a titanium oxide-containing layer, and an alumina coating is formed while reducing the titanium oxide at the surface layer in the following alumina coating forming process. Concretely, the surface of the hard coating is oxidized to form $TiO_2$, the alumina coating is formed while reducing the $TiO_2$ on the layer surface to $Ti_3O_5$, whereby the alumina composed mainly of α-type crystal structure can be efficiently formed.

The film thickness of the hard coating is preferably set to 0.5 μm or more in order to sufficiently exhibit the wear resistance and heat resistance expected for the coating film, more preferably to 1 μm or more. When the film thickness of the hard coating is too large, the hard coating is apt to crack at the time of cutting, and the life cannot be extended. Therefore, the film thickness of the hard coating is preferably controlled to 20 μm or less, more preferably to 10 μm or less.

Although the method of forming the hard coating is not particularly limited, the hard coating is preferably formed by the PVD method, and AIP (ion plating) or reactive sputtering is more preferably adapted as the PVD method. The adaptation of the PVD method to form the hard coating is preferable from the point of improvement in productivity, since the formation of the hard coating and the formation of the α-type-based alumina coating described later can be carried out within the same apparatus.

<Formation of Oxide-Containing Layer in Second Means (Mode 1-c)>

In the present invention, in order to form a hard coating, and oxidize the surface of the hard coating to form an oxide-containing layer (an oxide-containing layer the outermost surface side of which is substantially composed of $TiO_2$ particularly in the use of a hard coating containing Ti), the oxidation of the hard coating is preferably carried out in the following condition.

Namely, the oxidation is preferably carried out in an oxidizing gas-containing atmosphere, for example, an atmosphere containing oxidizing gas such as oxygen, ozone, or $H_2O_2$, including the atmosphere, because the oxidation can be efficiently performed.

As the oxidation, thermal oxidation is desirably carried out while retaining the substrate temperature at 650-800° C. Since the oxidation is insufficient at a low substrate temperature lower than 650° C., the oxidation is desirably carried out at a temperature raised preferably to 700° C. or higher. Although the oxidation is promoted as the substrate temperature is raised, it is necessary to control the upper limit of the substrate temperature to lower than 1000° C. in light of the purpose of the present invention. In the present invention, an oxide-containing layer useful for formation of the α-type-based alumina coating described later can be formed even at 800° C. or lower.

In the present invention, other conditions of the oxidation treatment are not particularly limited. As a concrete oxidation method, it is also effective to make oxidizing gas such as oxygen, ozone or $H_2O_2$ into plasma followed by irradiation in addition to the thermal oxidization.

The oxidation treatment is desirably carried out in a deposition apparatus for an alumina coating to be formed in the following process.

<Formation of Alumina Coating Composed Mainly of α-Type Crystal Structure in Second Means (Mode 1-c)>

As described above, in the second means (Mode 1-c), when an oxide-containing layer obtained by forming a hard coating composed of a metal having a standard free energy for oxide formation larger than that of aluminum and a compound of B, C, N, O, etc. and oxidizing the surface of the hard coating is used as the bed, an alumina coating composed mainly of α-type crystal structure can be surely formed on the oxide-containing layer. Accordingly, although the method of forming the alumina coating composed mainly of α-type crystal structure is not particularly limited, the following method is recommended to efficiently perform the deposition without having a bad influence on the substrate or apparatus.

Namely, the CVD method is not preferable because it must be carried out in a high temperature range of 1000° C. or higher, and the PVD method capable of performing the deposition in a low temperature range is desirably adapted. Sputtering is preferable as the PVD method, and reactive sputtering is particularly preferable because a high-speed deposition can be performed by use of an inexpensive metal target.

The substrate temperature in the alumina coating formation is not particularly regulated. However, a temperature range of about 650-800° C. is preferable because the α-type-based alumina coating can be easily formed. It is also preferable to form the α-type-based alumina coating while retaining the substrate temperature in the oxidation treatment constant successively to the oxidation treatment process since the characteristics of the base material or hard coating can be kept, and excellent productivity can be also provided.

In the α-type-based alumina coating to be formed, the α-type crystal structure accounts for preferably 70% or more, more preferably 90% or more, and most preferably 100%.

The film thickness of the α-type-based alumina coating is desirably set to 0.1-20 μm. In order to continue the excellent heat resistance and the like of the alumina coating, it is effective to ensure a thickness of 0.1 μm or more, more preferably 0.5 μm or more, and further preferably 1 μm or more. However, when the film thickness of the α-type-based alumina coating is too large, an internal stress is generated in the alumina coating to make it easy to crack. Accordingly, the film thickness is preferably set to 20 μm or less, more preferably 10 μm or less, and further preferably 5 μm or less.

When the laminate coating is formed in the second means (Mode 1-c), formation of the oxide-containing layer and formation of the alumina coating composed mainly of α-type crystal structure are also preferably carried out within the same apparatus, similarly to the case of the first means, from the point of improvement in productivity. More preferably, all processes of formation of the hard coating, formation of the oxide-containing layer, and formation of the alumina coating composed mainly of α-type crystal structure are carried out within the same apparatus.

Concretely, a base material of cemented carbide, for example, is set in a deposition apparatus (physical vapor deposition apparatus), described later, equipped with an AIP evaporation source, a magnetron sputtering cathode, a heater heating mechanism, a base material rotating mechanism, etc. to form a hard coating of TiN or the like by means of AIP or the like, the surface of the hard coating is thermally oxidized in the oxidizing gas atmosphere described above such as oxygen, ozone or $H_2O_2$, and an alumina coating composed mainly of α-type crystal structure is then formed by means of reactive sputtering or the like.

The present invention also regulates a laminate coating excellent in wear resistance and heat resistance comprising an alumina coating composed mainly of α-type crystal structure formed on a hard coating composed of a metallic compound, the alumina coating being formed by such a method according to the second means (Mode 1-c), and a tool clad with laminate coating comprising this laminate coating formed thereon. Concrete application examples of the tool clad with laminate coating include a cutting tool such as a throwaway tip including a hard coating of TiN and TiAlN formed on a cemented carbide base material, an end mill including a hard coating of TiN and TiCN formed on a cemented carbide base material, or a throwaway tip including a hard coating of TiN and TiCN formed on a cermet base material, a hot working metal mold to be used under a high temperature and the like.

(2) Second Mode

The present inventors examined a method capable of forming a coating mainly composed of α-alumina by a relatively short-time oxidation treatment in the oxidation treatment process from various angles, and consequently found that at least one of the following coatings (a)-(c) can be formed as an intermediate layer on a base material instead of a nitride such as CrN as described above to complete the present invention.

(a) A coating composed of a pure metal or alloy (b) A coating composed mainly of a metal solid-solving nitrogen, oxygen, carbon or boron (c) A coating composed of a metal nitride, oxide, cemented carbide or boride containing nitrogen, oxygen, carbon or boron insufficient to a stoichiometric composition.

According to the confirmation by experiments by the present inventors, when a nitride such as CrN was used as the intermediate layer, and it was oxidized at an oxidation temperature of 750° C. in an oxidizing gas atmosphere of 0.75 Pa, α-alumina was formed in an oxidation treatment time of 20 minutes, while a mixed coating of α-alumina and γ-alumina was formed in about 5 minutes. In contrast, when an intermediate layer as (a)-(c) was formed, and the surface of the intermediate layer was oxidized, an oxide coating could be sufficiently formed in a treatment time of about 5 minutes to form an alumina coating composed mainly of α-type crystal structure on the surface.

The reason why the above effect was exhibited is conceivable as follows although it could not be perfectly clarified. Namely, when the nitride such as CrN is formed as the intermediate layer, a sufficient oxide coating cannot be grown only by the exposure to the oxidizing gas atmosphere for about 5 minutes because the CrN is a stoichiometric nitride in which Cr and N are firmly bonded, and the alumina developed thereon could not be composed mainly of α-type crystal structure. In contrast, conceivably, each of the intermediate layers as (a)-(c) is chemically unstable, compared with a stoichiometric nitride, and as the result, formation of the oxide coating in the oxidation treatment process rapidly progresses.

The concrete forms of the intermediate layers of (a)-(c) will be then described.

The intermediate layer of (a) is a coating composed of a pure metal or alloy, and the kind thereof is not particularly limited if an oxide can be formed. However, the following metallic materials are preferable from the viewpoint of facilitating the formation of the oxide.

To easily form the α-alumina coating in the following process, a coating capable of forming an oxide having corundum structure by oxidation treatment is preferable as the intermediate layer. From this point, preferable examples thereof include coatings composed of Al, Cr, Fe, or mutual alloys thereof, or alloys composed mainly of these metals. From the point of facilitating the formation of the α-alumina coating in the following process, it is also effective to select a metal having a standard free energy for oxide formation larger than that of aluminum. Suitable examples of such a metal include Ti.

As the base material used in the present invention, various materials described later are suitably usable. The base material includes one having a primary coating formed on the surface. When the formation of such a primary coating and the formation of the intermediate layer are carried out within the same apparatus, the metallic material for forming the primary coating (e.g., Ti in case of forming TiN) is used as the intermediate layer, whereby the structure of the deposition apparatus can be simplified.

In the use of a pure metal as the intermediate layer, a pure metal film part formed might affect the characteristic of the whole coating member if its thickness is relatively large, because the pure metal film has weak points of low hardness, low strength, and poor sliding characteristic. In such a case, the coating of (b) or (c) can be effectively used as the intermediate layer instead of or in combination with the pure metal intermediate layer.

The coating of (b) is composed mainly of a metal, and its strength as the intermediate layer is remarkably improved by solid solution of nitrogen or the like. Since the oxidation resistance as coating is not so high, it is easily oxidized in the oxidation treatment process. As an element to be solid-solved at this time, nitrogen is preferable, but oxygen, carbon, boron or a mixture thereof may be solid-solved. The metals usable as the main component of the coating of (b) may be the same as the pure metals described in the coating (a).

Examples of the coating of (c) include a coating composed of a compound having a small nitrogen content, compared with a perfect nitride (stoichiometric nitride) such as CrN, a mixture of $Cr_2N$ and CrN, or the like and a coating composed of a compound having a CrN type crystal structure but stoichiometrically minimized in nitrogen and the like. For example, a $Cr_2N$ coating is easily oxidized because its oxidation resistance is inferior to CrN, but remarkably improved in the strength as the coating. As the kind of compounds, nitride is preferable, but oxide, cemented carbide, boride, or their mutual solid-solutions are also effective. For the metals constituting these compounds, the same kinds of pure metals in the coating of (a) can be adapted.

Each of the intermediate layers shown in (a)-(c) exhibits the effect even when singly formed, but one or two or more of them can be combined as occasion demands (for example, when the strength is reduced only with a pure metal coating).

The film thickness of the intermediate layer (the total film thickness in case of two or more layers) is set preferably to at least 0.005 μm or more, more preferably to 0.01 μm or more, and further preferably to 0.02 μm or more. When the film thickness of the intermediate layer is less than 0.005 μm, the layer thickness of the oxide-containing layer formed in the oxidation treatment process is too small, and the effect of the present invention is difficult to attain. However, when the film thickness of the intermediate layer is too large, the intermediate layer coating is apt to crack when applied to a cutting tool or the like, and the life cannot be extended. Accordingly, the film thickness of the intermediate layer is controlled preferably to 20 μm or less, more preferably to 10 μm or less.

When the pure metal coating (the coating of (a) described above) is used as the intermediate layer, the film thickness is set preferably to 1 μm or less since its strength is relatively reduced. When the clad member according to the present invention is used for a purpose other than the cutting tool, the relation between the intermediate layer film thickness and the alumina coating thickness (described below) is not particularly limited. However, in case of requiring particularly wear resistance and heat resistance as in the cutting tool, the thickness of the intermediate layer is desirably set to the thickness or less of the alumina coating to be formed thereon.

As the method of forming the intermediate layer, various PVD methods such as AIP (arc ion plating), sputtering, and ion plating can be applied. For example, in the formation of the coating of (a), deposition is performed without particularly introducing reactive gas, and when the coating of (b) or (c) is formed, proper reactive gas can be introduced according to the respective processes.

For example when an intermediate layer of two-layer structure (laminate structure) consisting of the coatings (b) and (a) is formed by use of the PVD method, nitrogen or the like is introduced as the reactive gas to form the coating (b), and the introduction of the reactive gas is stopped when forming the coating (a) thereon, whereby the intermediate layer of the laminate structure can be formed within the same apparatus. When the coatings (b) and (a) are formed with a gradient composition between them, the reactive gas is introduced in the initial stage of forming the coating (b), and the introduction amount of the reactive gas is gradually reduced, whereby the coating (a) (or the metal film) can be formed while retaining the gradient composition.

In the present invention, after forming the intermediate layer, the surface of the intermediate layer is oxidized (oxidization treatment process) to form an oxide-containing layer. The oxidation treatment process is desirably carried out in an apparatus for formation of an alumina coating to be formed in the following process from the point of efficiently oxidizing the surface, and thermal oxidation is preferably carried out while raising the substrate temperature under an oxidizing gas atmosphere. Examples for the oxidizing gas atmosphere include an atmosphere containing oxidizing gas such as oxygen, ozone, $H_2O_2$ or the like, including the atmosphere.

As the oxidation, it is preferable to perform the thermal oxidation while retaining the base material temperature at 650-800° C. Since the oxidation is insufficient at an extremely low base material temperature, the temperature is preferably raised to 700° C. or higher.

Although the oxidation is promoted as the base material temperature is raised, the upper limit of the base material temperature must be controlled to less than 1000° C. in light of the purpose of the present invention. In the present invention, an oxide-containing layer useful for formation of the α-type-based alumina coating described later can be formed even at 800° C. or lower.

Other conditions of the oxidation treatment are not particularly limited. As a concrete oxidization method, it is also effective to adapt a method for making oxidizing gas such as oxygen, ozone or $H_2O_2$ into plasma followed by irradiation in addition to the thermal oxidization.

When the oxide-containing layer as described above is formed, the alumina coating composed mainly of α-type crystal structure can be surely formed on the surface. In the alumina coating, the α-type crystal structure accounts for preferably 70% or more, more preferably 90% or more, and most preferably 100% to exhibit excellent heat resistance.

The film thickness of the α-type-based alumina coating is desirably set to 0.1-20 μm. In order to continue the excellent heat resistance of this alumina coating, it is effective to ensure a thickness of 0.1 μm or more, preferably 1 μm or more. However, when the film thickness of the α-type-based alumina coating is too large, an internal stress is undesirably generated in the alumina coating to make it easy to crack. Accordingly, the film thickness is set preferably to 20 μm or less, more preferably to 10 μm or less, and further preferably to 5 μm or less.

The means of forming the alumina coating composed mainly of α-type crystal structure in the second mode is not particularly limited. However, the CVD method is not preferable because it must be carried out at a high temperature of 1000° C. or higher, and the PVD method capable of performing deposition at a relatively low temperature is desirably adapted. Sputtering, particularly, reactive sputtering is suitable as the PVD method since a high-speed deposition can be realized by use of an inexpensive metal target. The temperature in the formation of the alumina coating is not particularly limited. However, the same level as in the oxidation treatment process is preferable, considering the continuity from the oxidation treatment of the preprocess, and a temperature of 650-800° C. is suitable. This temperature range is preferable because the alumina coating composed mainly of □-type crystal structure is easily formed in the range.

The alumina coating composed mainly of α-type crystal structure is formed on the base material surface as described above, whereby a member clad with alumina coating including an intermediate layer, an oxide-containing layer, and an α-alumina coating successively formed on a base material can be realized. Such a member is useful as a material for cutting tool or the like with excellent wear resistance and heat resistance.

In the production of such a member, each forming process of the intermediate layer, the oxide-containing layer, and the alumina coating composed mainly of α-type crystal structure is preferably carried out within the same apparatus from the point of improvement in productivity. When a primary coating is formed on the base material, and the intermediate layer, the oxide-containing layer, and the alumina coating layer composed mainly of α-type crystal structure are formed thereon, all the forming processes of a series of laminate coatings are preferably carried out within the same apparatus.

Concretely, for example, a cemented carbide substrate is set in a deposition apparatus (refer to FIG. 4) equipped with an AIP evaporation source, a magnetron sputtering cathode, a heater heating mechanism, a substrate rotating mechanism, etc., a hard coating such as TiAlN is formed by means of AIP or the like, a deposition treatment with Cr (formation of the intermediate layer) is executed, the surface of the resulting intermediate layer is thermally oxidized in an oxidizing gas atmosphere such as oxygen, ozone, or $H_2O_2$, and an alumina coating composed mainly of α-type crystal structure is formed thereon by means of reactive sputtering or the like.

As the base material used in the present invention, a steel-based material such as high speed steel, a cemented carbide or cermet, a sintered body containing cubic boron nitride (cBN) or ceramics, a hard material such as crystalline diamond, and various base materials for electronic parts including Si can be used. Such a base material may include a primary coating preliminarily formed on the surface separately from the intermediate layer, and can be applied to the present invention regardless of the presence and the kind of the primary coating and the kind and type of single layer or multi-layer thereof.

Examples of the primary coating which may be preliminarily formed on the base material surface include a single-layer or multi-layer hard coating of one or more selected from compounds and mutual solid solutions of one or more metal elements selected from the group consisting of metals of the groups 4a, 5a and 6a of the periodic table, Cu, Al, Si, and Y and one or more elements of C, N, B, and O. Among them, a hard coating of single-layer or multi-layer structure composed of TiN, TiC, TiCN, TiAlN, CrN, CrAlN and TiAlCrN is preferably formed on the base material surface. Diamond grown in gas phase, cBN and the like are also preferably used as the primary coating.

The film thickness of the primary coating is set preferably to 0.5 μm or more to sufficiently exhibit the wear resistance expected as the hard coating, more preferably to 1 μm or more. However, when the film thickness of the primary coating is too large, the primary coating is apt to crack at the time of cutting, and the life cannot be extended. Therefore, the film thickness is controlled preferably to 20 μm or less, more preferably to 10 μm or less.

As another kind of primary coating, a so-called thermal barrier coating such as oxide ceramics (e.g., yttrium stabilized zirconia) can be used. In this case, the film thickness is not particularly limited.

The method of forming the primary coating is not particularly limited. However, to form the hard coating with satisfactory wear resistance, the PVD method is preferably used, and AIP or reactive sputtering is more preferably adapted as the PVD method. The adaptation of the PVD method to form the primary coating is preferable from the point of improvement in productivity since the formation of the primary coating and the formation of the α-type-based alumina coating can be formed within the same apparatus.

(3) Third Mode

As a result of examinations from various angles for a technique capable of realizing the application of an alumina coating composed mainly of α-type crystal structure onto a sintered cBN base material without depending on a high temperature as in the CVD or specifying the composition of the sintered cBN, the present inventors found that the surface of the sintered cBN is exposed to an oxidizing gas atmosphere and oxidized, and deposition treatment is performed at a base material temperature of 650-800° C. by the PVD method, whereby an alumina coating composed mainly of α-type crystal structure can be formed on the surface of the sintered cBN base material, and completed the present invention.

According to the present invention, the alumina coating composed mainly of α-type crystal structure excellent in oxidation resistance can be effectively formed on the sintered cBN base material excellent in wear resistance, and a surface clad member excellent in wear resistance and oxidation resistance can be realized. Further, the surface clad member can be produced without requiring the exposure to a high-temperature atmosphere as in the application of the CVD method, or restricting the composition of the sintered cBN.

The reason why such an effect is exhibited may be considered as follows although it could not be entirely clarified. The sintered cBN contains, as a binder phase, TiC, TiN, TiCN, AlN, $TiB_2$, $Al_2O_3$ or the like, a part of which is exposed also to the surface layer which forms the coating. When such a sintered body base material is exposed to the oxidizing atmosphere at a high temperature and oxidized, the part exposed to the surface of a non-oxide binder phase of the above binder phase is oxidized. Even an oxide binder phase such as $Al_2O_3$, which is also laid in a state where impurities such as hydrocarbon are microscopically adhered to the surface, is exposed to the oxidizing atmosphere at a high temperature and oxidized, whereby the impurities are conceivably removed to expose a pure oxide surface.

Accordingly, the surface of the sintered cBN after passed through the oxidation treatment process would be laid in the state where an oxide formed by the oxidation of the binder phase, or the surface of a binder phase originally consisting of the oxide would laid in a state where an oxide with pure surface is dispersed over the whole area of the substrate surface. Further, the cBN in the sintered body itself also might form an oxide on the surface.

Since an oxide area which is an area suitable for crystal growth of α-alumina is formed over the whole surface of the sintered cBN substrate in this way, and the crystal growth of α-alumina is caused starting from this area, the alumina coating composed mainly of α-type crystal structure can be formed at a relatively low deposition temperature.

As the binder phase contained in the sintered cBN used as the base material in the present invention, one containing at least one selected from the group consisting of TiC, TiN, TiCN, AlN, $TiB_2$ and $Al_2O_3$ can be adapted without being limited to a specified kind. Further, those containing a nitride, cemented carbide or boride of a metal of the groups 4a, 5a and 6a of the periodic table or a metal such as Al or Si, a mutual solid solution of these metals, or a metal (e.g., Al, Ti, Cr, and Fe or an alloy containing them) can be also used. When the effect by the oxidation treatment of the present invention is considered, a compound as the binder phase preferably contains at least a non-oxide-based one.

The content of the binder phase in the sintered cBN is preferably set to 1-50 vol % to the whole sintered body. When the content of the binder phase is less than 1 vol %, a desired strength cannot be ensured, and when the content exceeds 50 vol %, the wear resistance of the base material is deteriorated.

In the present invention, the surface of the sintered cBN base material is oxidized to form an oxide-containing layer on the surface (or the part which forms an interface between the sintered cBN and the alumina coating). This oxidation treatment process is desirably carried out in a deposition apparatus for formation of the alumina coating to be formed in the following process from the point of efficiently producing the clad member, and a thermal oxidation which is performed at a raised base material temperature in an oxidizing gas atmosphere is a preferred method. As the oxidizing gas atmosphere at this time, an atmosphere containing an oxidizing gas such as oxygen, ozone, or $H_2O_2$, including the atmosphere is given.

As the oxidation, the thermal oxidation is desirably carried out while retaining the base material temperature at 650-800° C. Since the oxidation is insufficient at an extremely low base material temperature, the temperature is desirably raised to preferably 700° C. or higher. Although the oxidation is promoted as the base material temperature is raised, it is necessary to control the upper limit of the base material temperature to lower than 1000° C. in light of the purpose of the present invention. In the present invention, an oxide-containing layer effective for formation of the α-type-based alumina coating can be formed even at 800° C. or lower.

In the present invention, other conditions of the oxidation treatment are not particularly limited. As a concrete oxidation method, it is also effective to make an oxidizing gas such as oxygen, ozone or $H_2O_2$ into plasma followed by irradiation in addition to the thermal oxidization.

When the oxide-containing layer as described above is formed, the alumina coating composed mainly of α-type crystal structure can be surely formed on the surface thereof. The alumina coating can exhibit excellent heat resistance when the α-type crystal structure accounts for preferably 70% or more, more preferably 90% or more, and most preferably 100%.

The film thickness of the alumina coating composed mainly of α-type crystal structure is desirably set to 0.1-20 μm. In order to continue the excellent heat resistance of the alumina coating, it is effective to ensure a thickness of 0.1 μm or more, more preferably 1 μm or more. However, when the film thickness of the alumina coating composed mainly of α-type crystal structure is too large, an internal stress is undesirably generated in the alumina coating to make it easy to crack. Accordingly, the film thickness is set preferably to 20 μm or less, more preferably to 10 μm or less, and further preferably to 5 μm or less.

The means of forming the alumina coating composed mainly of α-type crystal structure in the third mode is not particularly limited. However, the CVD method is not preferable because it must be carried out in a high temperature of 1000° C. or higher, and the PVD method capable of performing the deposition in a relatively low temperature range is desirably adapted. Sputtering, particularly, reactive sputtering is suitable as the PVD method since a high-speed deposition can be performed by use of an inexpensive metal target. The temperature in the formation of the alumina coating is not particularly regulated. However, when the continuity from the oxidation treatment of the preprocess is considered, the same level as in the oxidation treatment process or 650-800° C. is preferable. The formation of alumina coating is preferably carried out in this temperature range, since the alumina coating composed mainly of α-type crystal structure can be easily formed.

By forming the α-type-based alumina coating on a substrate surface as described above, a member clad with alumina coating including the substrate, the oxide-containing layer and the α-type-based alumina coating successively formed thereon can be realized. Such a member is excellent in the wear resistance and heat resistance, and useful as a material for cutting tool or the like.

Since the alumina coating composed mainly of α-type crystal structure is formed by means of the PVD method, more preferably, reactive sputtering, a residual stress of compression can be imparted by selecting a cladding condition, and this is preferable to ensure the strength of the whole clad member. The alumina coating composed mainly of α-type crystal structure formed by the reactive sputtering contains a trace amount of Ar in addition to Al and O.

The alumina coating composed mainly of α-type crystal structure is formed on the surface of the sintered cBN base material as described above, whereby a member clad with alumina coating including the oxide-containing layer and the α-alumina coating successively formed thereon can be realized. Such a member is excellent in wear resistance and heat resistance, and useful as a material for cutting tool or the like. In the production of this member, the respective forming processes of the oxide-containing layer and the α-alumina coating are preferably carried out within the same apparatus from the point of improvement in productivity.

(4) Fourth Mode

The present inventors further continued studies for a process for forming an alumina coating composed mainly of α-type -crystal structure with minute and uniform crystal grains (hereinafter often referred to as "☐-type-based alumina coating simply) in a temperature range of about 800° C. or lower where the characteristic of the base material or primary coating (in the fourth mode, the "base material" hereinafter will include one having the primary coating preliminarily formed thereon unless stated) can be kept (the fourth mode).

As the result, it was found that the base material surface is gas ion bombardment-treated and then oxidized, at the formation of the alumina coating, whereby the ratio of α-type in the crystal structure of the alumina coating is remarkably improved, and the alumina crystal grain becomes minute and uniform to attain the present invention. The mechanism of this method effectively acting on the formation of α-type-based alumina coating is estimated as follows from the experimental results in working examples for the fourth mode described later.

According to a conventional method, as described above, at the formation of an alumina coating on a CrN coating, the surface of the CrN coating is oxidized, whereby an alumina coating composed mainly of α-type crystal structure can be formed.

As the mechanism of this process, it is supposed that the surface of the CrN coating that is a deposition object is exposed to an oxidizing atmosphere prior to formation of the alumina coating, whereby $Cr_2O_3$ having the same crystal structure as alumina of α-type crystal structure is formed on the surface, and this surface state is suitable for generation of the alumina crystal nucleus of α-type crystal structure in the alumina coating formation.

However, when the surface of the alumina coating formed in this process is observed by SEM, the alumina grains on the surface are rough and uneven as shown as a comparative case in a working example for the fourth mode described later. As the reason, since all the area of the oxidized surface is not suitable for generation of the alumina crystal nucleus of α-type crystal structure, concretely, the surface state of the CrN coating before oxidation treatment is not necessarily uniform, the surface after oxidation treatment would be also laid in the uneven state.

In contrast, when the surface of the alumina coating formed by performing the gas ion bombardment treatment prior to the oxidation treatment as in the present invention is observed by SEM, the alumina grains of α-type crystal structure are more minute and uniform than those formed by the conventional method as shown as the example of the present invention described later.

It can be estimated from these results that the gas ion bombardment treatment is carried out prior to the oxidation treatment, whereby more generation points of the alumina crystal nucleus of α-type crystal structure to be formed by the oxidation treatment can be present more uniformly.

This mechanism can be considered as follows although the details were not clarified. Namely, in the fourth mode, since the surface laid in a state easily reactable with oxygen by removing the adsorbed moisture, contaminations, and a natural oxide film present on the coating surface of CrN or the like by the gas ion bombardment treatment is oxidized, an oxide which forms the generation point of the alumina crystal nucleus of α-type crystal structure would be formed minutely and uniformly.

Preferred embodiments in the fourth mode will be further described in detail.

<Gas Ion Bombardment Treatment>

The fourth mode is characterized, as described above, by performing the gas ion bombardment treatment to a base material surface at the formation of an alumina coating, and then oxidizing the surface. The condition of the gas ion bombardment treatment is not particularly limited in detail, and a condition capable of etching the surface of the base material can be properly adapted.

Figure 5:
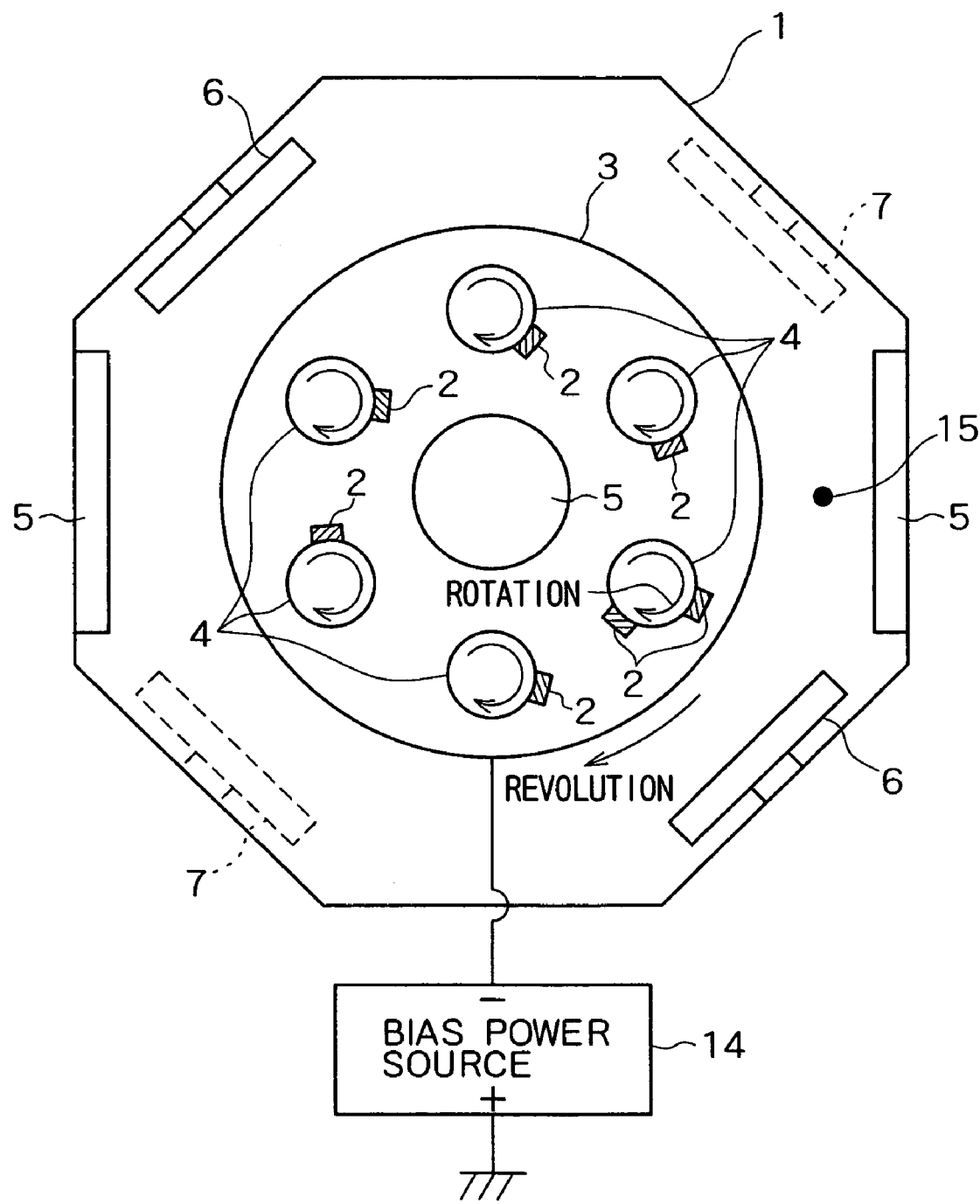
FIG. 5 is a schematic illustrative view (top view) showing an example of the apparatus used in the fourth mode.

As a concrete method, for example, the following method using a filament-excited plasma is given, as shown in FIG. 5 described later. Namely, a thermal electron is generated from a filament in the state where inert gas such as Ar is introduced into a vacuum chamber to generate a discharge, and the gas ion of Ar or the like in the plasma generated by the discharge is accelerated by a negative voltage applied to the base material and collided, whereby the surface of the base material is etched.

In the application of the voltage, a high frequency AC voltage may be applied, in addition to the continuous or intermittent application of the negative DC voltage as described above.

In order to accelerate the generated gas ion of Ar or the like toward the base material to sufficiently etch the surface of the base material, the negative DC voltage is set to −100V or more (preferably, −300V or more). Since a bad influence such as generation of arc discharge might be caused when the negative voltage is too high, the voltage is preferably controlled to −2000V or less (preferably −1000V or less). In the application of the high frequency AC voltage, the self-bias to be generated is preferably set to the same level as the DC voltage.

The kind of the gas ion to be used is not particularly limited when it has the etching effect, and a rare gas such as Ar, Kr or Xe can be used. Particularly, relatively inexpensive and generally available Ar gas is preferably used.

The generation of the plasma may be performed by means of hollow cathode discharge or RF (radio frequency) discharge, in addition to the method by the filament.

As an easier method, the etching may be carried out by applying a negative DC voltage or high frequency AC voltage to the base material in the state where inert gas such as Ar is introduced into the vacuum chamber to generate a glow discharge, and accelerating the gas ion (Ar ion, etc.) in the plasma generated by this discharge by the applied voltage.

As another concrete mode of the gas ion bombardment treatment, it can be adapted to collide a highly accelerated gas ion generated from an ion beam source to the surface of the base material.

<Base Material and Primary Coating in Fourth Mode>

In the fourth mode, a base material having a single-layer or multi-layer primary coating preliminarily formed thereon can be used in order to impart characteristics of wear resistance and the like, in addition to the use of a base material constituting a member of cutting tool or the like as it is. When this method of the present invention is applied to production of a cutting tool, a sliding member, a metal mold or the like for which excellent heat resistance or wear resistance is required, the following materials are preferably used as the base material or primary coating, although they are not meant to concretely regulate the kind of the base material or the primary coating.

As the base material, a steel-based material such as high speed steel, a cemented carbide, a cermet, a cBN (cubic boron nitride) sintered body, a sintered ceramic and the like can be used.

When a base material having a primary coating formed thereon is used, the kind of the base material is not particularly limited. As the primary coating, either one or more of a compounds of one or more element selected from the group consisting of elements of the groups 4a, 5a and 6a of the periodic table, Al, Si, Fe, Cu and Y with one or more element of C, N, B and O, or a mutual solid solution of these compounds is formed, whereby an oxide layer advantageous for formation of the alumina of α-type crystal structure can be preferably formed.

Typical examples of the primary coating include Ti(C,N), Cr(C,N), TiAl(C,N), CrAl(C,N), and TiAlCr(C,N), or respective cemented carbides, nitrides and carbonitrides of Ti, Cr, TiAl, CrAl and TiAlCr. As a hard coating generally used in a cutting tool or the like, for example, TiN, TiC, TiCN, TiAlN, CrN, CrAlN, and TiAlCrN can be formed in a single layer or multi-layers.

In order to sufficiently exhibit the wear resistance or heat resistance expected in the primary coating, the film thickness of the primary coating is set preferably to 0.5 μm or more, more preferably to 1 μm or more. When the film thickness of the primary coating is too large, the coating is apt to crack at the time of cutting, and the life cannot be extended. Accordingly, the film thickness of the primary coating is controlled preferably to 20 μm or less, more preferably to 10 μm or less.

Although the method of forming the primary coating is not particularly limited, the primary coating is preferably formed by the PVD method, and AIP (ion plating) or reactive sputtering is more preferably adapted as the PVD method. The adaptation of the PVD method to form the primary coating such as the hard coating is preferable from the point of improvement in productivity since the formation of the primary coating and the formation of the α-type-based alumina coating described later can be carried out within the same apparatus.

<Oxidation Treatment in Fourth Mode>

In the fourth mode, the oxidation treatment of the surface of the primary coating is carried out after the gas ion bombardment treatment. The condition of the oxidation treatment is also not particularly limited. However, in order to efficiently form an oxide-containing layer advantageous for formation of the alumina crystal nucleus of α-type crystal structure, the oxidation is preferably carried out in the following condition.

Namely the oxidation is preferably carried out in an oxidizing gas-containing atmosphere, for example, an atmosphere containing an oxidizing gas such as oxygen, ozone or $H_2O_2$, including the atmosphere, because the oxidation can be efficiently carried out.

As the oxidation, a thermal oxidation is desirably carried out while retaining the base material temperature at 650-800° C. Since the oxidation is insufficient at an extremely low base material temperature, the oxidation is desirably carried out at a temperature raised to 700° C. or higher. Although the oxidation is promoted as the base material temperature is raised, it is necessary to control the upper limit of the base material temperature to less than 1000° C. in light of the purpose of the present invention. In the present invention, an oxide-containing layer useful for formation of the α-type-based alumina coating described later can be formed even at 800° C. or lower.

Other conditions of the oxidation treatment are not particularly limited. As a concrete oxidation method, in addition to the above-mentioned thermal oxidation, it is also effective to make an oxidizing gas such as oxygen, ozone or $H_2O_2$ into plasma followed by irradiation.

The oxidation treatment process is desirably carried out in a deposition apparatus for alumina coating to be used in the following process. The method of carrying out the thermal oxidation while raising the base material temperature in the oxidizing gas atmosphere is given as a preferable embodiment.

<Formation of Alumina Coating in Fourth Mode>

The method of forming the α-type-based alumina coating is not particularly limited. However, the CVD method is not preferable because it must be carried out in a high temperature range of 1000° C. or higher, and the PVD method capable of performing the deposition in a low temperature range is desirably adapted. The PVD method includes sputtering, ion plating, evaporation and the like, and the sputtering is preferred among them. Particularly, reactive sputtering is preferable because a high-speed deposition can be performed by use of an inexpensive metal target.

The base material temperature in the formation of the alumina coating is not particularly regulated. However, a temperature range of about 650-800° C. is preferable because the α-type-based alumina coating can be easily formed. The α-type-based alumina coating is preferably formed while retaining the base material temperature in the oxidation treatment constant successively to the oxidation treatment process, since the characteristic of the base material or the hard coating can be kept, and excellent productivity can be provided.

The film thickness of the α-type-based alumina coating is desirably set to 0.1-20 μm. In order to continue the excellent heat resistance and the like of the alumina coating, it is effective to ensure a thickness of 0.1 μm or more, more preferably 1 μm or more. However, when the film thickness of the -type-based alumina coating is too large, an internal stress is undesirably generated in the alumina coating to make it easy to crack. Accordingly, the film thickness is preferably set to 20 μm or less, more preferably to 10 μm or less, and further preferably to 5 μm or less.

<Deposition Process in Fourth Mode>

All processes of the formation of the primary coating (the case of using a base material having the primary coating formed thereon), the gas ion bombardment treatment, the oxidation treatment and the formation of the alumina coating composed mainly of α-type crystal structure are carried out within the same apparatus. According to this, since a treatment material can be continuously treated without being moved, a member clad with the alumina coating composed mainly of α-type crystal structure can be efficiently produced.

When the processes are carried out within the same apparatus in this way, since the gas ion bombardment treatment or the oxidation treatment can be performed successively without lowering the base material temperature in the formation of the primary coating (about 350-600° C.), the time or energy required for heating of the base material can be suppressed.

Concretely, a base material of cemented carbide, for example, is set in a physical vapor deposition apparatus, described later, equipped with an AIP evaporation source, a magnetron sputtering cathode, a heater heating mechanism, a base material rotating mechanism, etc. to form a hard coating of TiAlN or the like as a primary coating by means of AIP or the like, a gas ion bombardment treatment Ls carried out by introducing Ar into a vacuum chamber and applying a negative DC voltage to the base material, the surface of the hard coating is thermally oxidized in the oxidizing gas atmosphere described above such as oxygen, ozone or $H_2O_2$, and an alumina coating composed mainly of α-type crystal structure is then formed by means of reactive sputtering or the like.

(5) Fifth Mode

The present inventors further continued studies for a process for forming an alumina coating composed mainly of α-type crystal structure (hereinafter often referred to as "α-type-based alumina coating simply) in a temperature range of about 800° C. or lower where the characteristic of the base material or primary coating (in the fifth embodiment, the "base material" hereinafter will also include one having the primary coating preliminarily formed thereon unless stated) can be kept without forming a complicated intermediate layer on a hard coating of TiAlN or the like that is the primary coating or on various base materials of cemented carbide or a Si wafer.

As the result, it was found that an alumina coating can be formed by metal ion-bombarding the surface of the base material, and then oxidizing the resulting surface, to attain the present invention.

The process for producing an alumina coating according to the present invention will be summarized. When the metal ion bombardment treatment is performed to, for example, a cemented carbide tool (uncoated), a base material such as a Si wafer, or one having a hard coating of CrN, TiN, TiAlN, diamond, etc. as a primary coating applied onto the base material, as a base material resistant to the temperature of deposition process under the condition described later, an accelerated metal ion collides with the base material to simultaneously cause etching of the surface of the base material by the metal ion (M), accumulation of the metal ion (M), and implantation of the metal ion to the base material (not shown) as shown in the enlarged drawing of FIG. 6(a). Consequently, a concentration gradient layer 22 in which the concentration of the metal used for the metal ion bombardment treatment is gradually raised toward the surface layer side is formed in the vicinity of the surface of the base material 21 after the metal ion bombardment treatment (denoted at 15 is the position of the surface of the base material before the metal ion bombardment treatment) [FIG. 6(*b*)].

Figure 6:
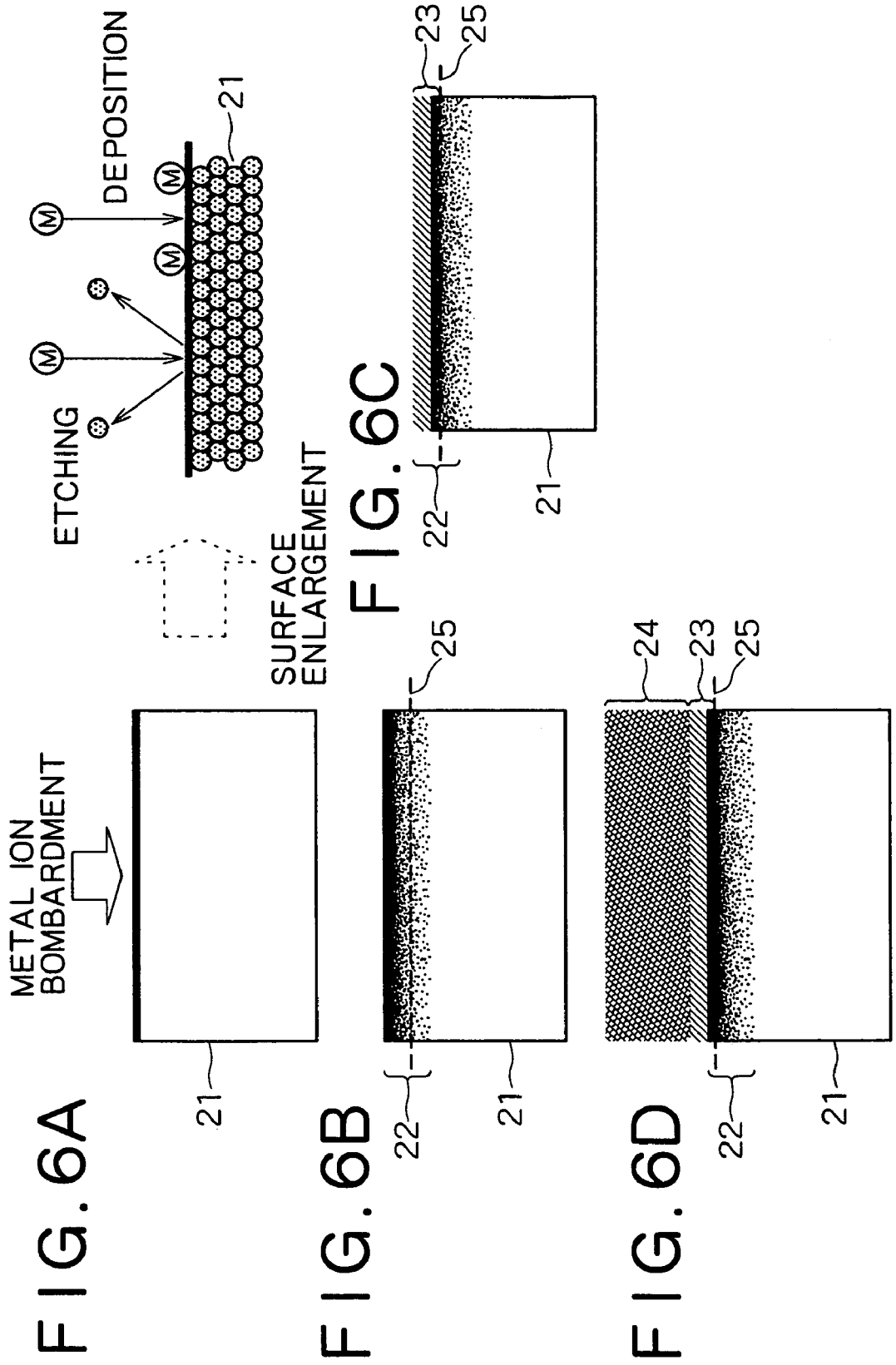
FIG. 6 is an illustrative view schematically showing a process of an inventive method (the fifth mode)

After the surface of the concentration gradient layer 22 is oxidized to form an oxide-containing layer 23 as shown in FIG. 6(*c*) on the surface of the concentration gradient layer 22, an alumina coating 24 is formed, whereby a member including the oxide-containing layer 23 and the alumina coating 24 composed mainly of α-type crystal structure successively formed on the surface side of the concentration gradient layer 22 as shown in FIG. 6(*d*) can be obtained.

This process for producing an alumina coating composed mainly of □-type crystal structure has the following characteristics, compared with the above-mentioned conventional method shown in Japanese Patent Laid-Open No. 2002-53946.

(A) The concentration gradient layer formed by the metal ion bombardment treatment is easily oxidized, compared with the conventional method for oxidizing a nitride coating, because its surface consists of a non-nitrided metal layer or a metal layer with a small amount of nitrogen or the like solid-solved therein and, consequently, the load to the apparatus by heating can be reduced in addition to the shortening of the time required for the oxidation treatment.

(B) Since the concentration gradient layer to be formed consists of a mixed layer with the base material as shown in FIG. 6(*b*), the thickness of layers other than the alumina coating can be reduced, compared with the conventional method comprising the nitride coating on the base material, and a bad influence on the characteristics of the member by the layers other than the alumina coating can be consequently suppressed.

The concentration gradient layer to be formed is essentially excellent in adhesion because it consists of a mixed layer of the metal and the base material, and no clear interface is present between the base material and the mixed layer. Accordingly, the adaptation of the above structure is preferable to further enhance the adhesion with the base material.

(C) The metal ion bombardment treatment is carried out at a base material temperature suitable for the oxidation treatment of the next process, whereby the oxidation treatment can be rapidly carried out only by forming the oxidizing atmosphere without raising the base material temperature by additional radiation heating or the like, and the productivity can be enhanced.

Applicable conditions and suitable conditions for the formation of the alumina coating in the fifth mode will be described in detail.

<Metal Ion Bombardment Treatment>

As described above, the method of the present invention is characterized by metal ion-bombarding the surface of the base material prior to oxidation. An alumina of α-type crystal structure can be efficiently formed by adapting the following conditions, although they are not meant to define the detailed conditions of the metal ion bombardment treatment.

As a generation source of metal ion, a metallic material for forming an oxide having corundum structure is preferably used because the alumina of α-type crystal structure can be easily formed. Examples of the metallic material include Al, Cr, Fe, alloys of these metals and alloys composed mainly of these metals. Further, a metal having a standard free energy for oxidation generation larger than that of aluminum may be also selected, and for example Ti or the like are usable.

The use of a vacuum arc evaporation source for generation of a metal ion involves a high level of droplet release as a disadvantage. To solve this problem, a metallic material having a relatively high melting point (e.g., elements of the groups 4a, 5a and 6a of the periodic table) is preferably used. When the metal ion is generated without using the vacuum arc evaporation source, the metallic material can be selected regardless of the melting point since the above problem is not caused.

From the points as described above, Cr, Ti or an alloy containing them is particularly preferably used as the generation source of metal ion.

When the primary coating is formed, a target containing a metal constituting the primary coating is used in the metal ion bombardment treatment, whereby the deposition apparatus can be further simply constituted. For example, when TiN is formed as the primary coating, the metal ion bombardment treatment is carried out by use of a Ti target.

The generation of the metal ion can be performed by a method capable of generating a highly ionized metal plasma. For example, a metal target material is evaporated by vacuum arc discharge by use of a vacuum arc evaporation source. The vacuum arc evaporation source is particularly desirably equipped with a filter mechanism so that macro particles can be reduced.

In addition to the generation of the metal plasma by use of the vacuum arc evaporation source, for example, a method to add a metal ionizing mechanism to a crucible type ion plating method, a method to add an RF (radio frequency) coil to a sputtering evaporation source to improve the ionization rate, or high-power pulse sputtering for concentrating a high power in a short time to promote the ionization of vapor can be adapted.

The metal ion bombardment treatment needs application of a negative bias voltage to the base material. The bias voltage is applied to the base material to thereby give an energy to the metal ion generated in the vacuum arc evaporation source, and the metal ion is collided with the surface of the base material at high speed, whereby the etching or the like of the base material as shown in the enlarged drawing of FIG. 6(*a*) can be performed.

The etching or the like can be realized at a low voltage of about −100V. However, a bias voltage of preferably −300V or more, more preferably −600V or more is applied. Although the upper limit of the bias voltage is not particularly provided, excessive application of a high voltage causes a trouble such as generation of arc discharge, which may damage the base material, or necessity of an X-ray interrupting measure for the apparatus because of generation of X-ray. Accordingly, the upper limit of the bias voltage is realistically controlled to about −2000V, and the concentration gradient layer described above can be sufficiently formed even at −1000V or less. The bias voltage can be applied continuously or intermittently.

When the surface to be metal ion-bombarded is an insulating material such as diamond, cBN, or a nitride, it is difficult to effectively apply the bias voltage, and the metal ion bombardment treatment cannot be sufficiently performed. In such a case, a conductive layer can be formed on the surface of the base material prior to the application of the bias voltage, or after a conductive metal-containing layer is formed on the surface of the base material by irradiation of the metal ion at a low bias voltage (about several tens V), the bias voltage of the above level can be applied.

In addition to the continuous or intermittent application of DC voltage described above, pulse-like application of bias voltage at a high frequency (1-several hundreds kHz) or application of RF may be adapted. Further, these methods can be adapted also to application of bias voltage to an insulating surface.

In case of using a vacuum arc evaporation source, the metal ion bombardment treatment is generally carried out without introduction of atmospheric gas. However, inert gas atmosphere of Ar or the like or a nitrogen atmosphere may be adapted from the point of ensuring the operation stability of the vacuum arc evaporation source.

Further, in case of using a vacuum arc evaporation source, in order to prevent inclusion of macro particles generated from the vacuum arc evaporation source to a forming layer, a small amount of reactive gas, e.g., nitrogen can be introduced to perform the treatment under a nitrogen atmosphere. However, when the partial pressure of the reactive gas in such a reactive gas atmosphere exceeds 1 Pa, the atmosphere undesirably becomes the same as in the formation of the nitride coating, in which the etching effect is weakened. Accordingly, the partial pressure of the reactive gas is set to 0.5 Pa or less, preferably 0.2 Pa or less, and more preferably 0.1 Pa or less.

The metal ion bombardment treatment is preferably carried out by heating the base material to 300° C. or higher. Concretely, for example, a base material 2 is set in a base material holder (planetary rotary jig) 4 within a deposition apparatus shown in FIG. 7, the apparatus is evacuated until vacuum forms, and the temperature of the base material 2 is raised by a (radiation) heater 5 while rotating the base material holder (planetary rotary jig) 4.

Since the gas adsorbed by the surface of the base material can be released by raising the base material temperature in this way before starting the metal ion bombardment treatment, generation of arc or the like in the metal ion bombardment treatment can be suppressed to perform a stable operation.

Since the substrate temperature in the metal ion bombardment treatment depends on the heating by the heater and the energy corresponding to the bias voltage given to the base material during the metal ion bombardment treatment, the upper limit of the heating temperature by the heater is preliminarily determined, considering the temperature rise during the metal ion bombardment treatment, whereby the loss of energy or the like can be suppressed.

<Base Material and Primary Coating in Fifth Mode>

In the fifth mode, in addition to the use of the base material for constituting a member such as a cutting tool as a base material, a base material with a single-layer or multi-layer primary coating preliminarily formed thereon can be also used as the base material in order to impart characteristics such as wear resistance. In order to apply this inventive method to production of a cutting tool, a sliding member, a metal mold or the like for which excellent heat resistance or wear resistance is required, the following materials are preferably used as the base material or the primary coating, although they are not meant to concretely restrict the kind of the base material or the primary coating.

As the base material, various base materials including a steel-based material such as high speed steel, a cemented carbide, a cermet, a sintered body containing cBN (cubic boron nitride) or ceramics, a hard material such as crystalline diamond, and a Si wafer for electronic part can be used.

In case of using a base material having a primary coating formed thereon, for example, a coating composed of at least one selected from the group consisting of a compound of one or more elements selected from the group consisting of elements of the groups 4a, 5a and 6a of the periodic table, Al, Si, Cu and Y with one or more elements of C, N, B and O, a mutual solid solution of these compounds, and a single body or compound composed of one or more of C, N and B (e.g., gas-phase developed diamond, cBN, etc.) can be formed as the primary coating.

Typical examples of the primary coating include Ti(C,N), Cr(C,N), TiAl(C,N), CrAl(C,N), and TiAlCr(C,N), or respective cemented carbides, nitrides and carbonitrides of Ti, Cr, TiAl, CrAl and TiAlCr. As a hard coating generally used in a cutting tool or the like, for example, TiN, TiC, TiCN, TiAlN, CrN, CrAlN, and TiAlCrN can be formed in a single layer or multi-layers.

Further, a so-called thermal barrier coating such as an oxide ceramic (e.g., yttrium stabilized zirconia) may be also formed as the primary coating.

In order to sufficiently exhibit the wear resistance and heat resistance expected for the primary coating, the film thickness of the primary coating is set preferably to 0.5 μm or more, more preferably to 1 μm or more. In case of a primary coating consisting of a wear-resistant hard coating, however, when the film thickness is too large, the coating is apt to crack at the time of cutting, and the life cannot be extended. Accordingly, the film thickness of the primary coating is controlled preferably to 20 μm or less, more preferably to 10 μm or less. In case of a primary coating except the hard coating, it is not necessary to provide the upper limit of the film thickness particularly.

Although the method of forming the primary coating is not particularly limited, the PVD method is preferably adapted to form a primary coating with satisfactory wear resistance, and AIP or reactive sputtering is more preferably adapted as the PVD method. The adaptation of the PVD method to form the primary coating is preferable from the point of improvement in productivity since the formation of the primary coating and the formation of the α-type-based alumina coating described later can be carried out within the same apparatus.

<Oxidation Treatment in Fifth Mode>

In the fifth mode, oxidation treatment of the bed surface is carried out after the metal ion bombardment treatment. In order to efficiently form an oxide-containing layer advantageous for generation of the alumina crystal nucleus of α-type crystal structure, the oxidation is preferably carried out under the following condition, although the condition of the oxidization is not particularly limited.

Namely, the oxidation is preferably carried out in an oxidizing gas-containing atmosphere, for example, an atmosphere containing an oxidizing gas such as oxygen, ozone or $H_2O_2$, including the atmosphere, because the oxidation can be efficiently carried out.

As the oxidation, a thermal oxidation is desirably carried out while retaining the base material temperature at 650-800° C. Since the oxidation is insufficient at an extremely low base material temperature, the oxidation is desirably carried out at a temperature raised to 700° C. or higher. Although the oxidation is promoted as the base material temperature is raised, it is necessary to control the upper limit of the base material temperature to lower than 1000° C. in light of the purpose of the present invention. In the present invention, an oxide-containing layer useful for formation of the α-type-based alumina coating described later can be formed even at 800° C. or lower.

When the oxidation treatment is continuously carried out without cooling the base material heated in the metal ion bombardment treatment, the time or energy required for heating can be suppressed. It is recommended therefor to lay the inner part of the apparatus into the oxidizing atmosphere immediately after the metal ion bombardment treatment to perform the oxidation treatment.

Other conditions of the oxidation treatment in the fifth mode are not particularly limited. As a concrete oxidation method, in addition to the above-mentioned thermal oxidation, it is also effective to make oxidizing gas such as oxygen, ozone or $H_2O_2$ into plasma followed by irradiation.

<Formation of Alumina Coating in Fifth Mode>

Although the method of forming the α-type-based alumina coating is not particularly limited, the CVD method is not preferable because it must be carried out in a high temperature range of 1000° C. or higher, and the PVD method capable of performing the deposition in a low temperature range is desirably adapted. The PVD method includes sputtering, ion plating, evaporation and the like, and the sputtering is preferred among them. Particularly, reactive sputtering is preferable because a high-speed deposition can be performed by use of an inexpensive metal target.

The base material temperature in the formation of the alumina coating is not particularly regulated. However, a temperature range of about 650-800° C. is preferable because the α-type-based alumina coating can be easily formed. The alumina coating is preferably formed while retaining the base material temperature in the oxidation treatment constant, since the characteristics of the base material or the hard coating can be kept, and excellent productivity can be provided.

The film thickness of the alumina coating to be formed is desirably set to 0.1-20 μm. In order to continue the excellent heat resistance of the alumina coating, it is effective to ensure a thickness of 0.1 μm or more, more preferably 1 μm or more. However, when the film thickness of the α-type-based alumina coating is too large, an internal stress is undesirably generated in the alumina coating to make it easy to crack. Accordingly, the film thickness is set preferably to 20 μm or less, more preferably to 10 μm or less, and further preferably to 5 μm or less.

<Deposition Process in Fifth Mode>

All processes of the metal ion bombardment treatment, the oxidation treatment and the formation of the alumina coating composed mainly of α-type crystal structure are carried out within the same apparatus. According to this, since a treatment material can be continuously treated without being moved, a member clad with the alumina coating composed mainly of α-type crystal structure can be efficiently produced.

In case of using a base material with a primary coating formed thereon, all processes of the formation of the primary coating, the metal ion bombardment treatment, the oxidation treatment and the formation of the alumina coating composed mainly of α-type crystal structure are carried out within the same apparatus. According to this, since the metal ion bombardment treatment, the oxidation treatment and the formation of the alumina coating composed mainly of α-type crystal structure can be performed successively without lowering the base material temperature (about 350-600° C.) in the formation of the primary coating, a member clad with the alumina coating composed mainly of α-type crystal structure can be produced efficiently while suppressing the time or energy required for heating of the base material.

Concretely, a base material of cemented carbide, for example, is set in a physical vapor deposition apparatus, described later, equipped with an AIP evaporation source, a magnetron sputtering cathode, a heater heating mechanism, a base material rotating mechanism, etc. to form a hard coating of TiAlN or the like as the primary coating by means of AIP or the like, the metal ion bombardment treatment with Cr ion is carried out in a vacuum chamber, the surface of the hard coating is thermally oxidized in an oxidizing gas atmosphere such as oxygen, ozone or $H_2O_2$ as described above, and an alumina coating composed mainly of α-type crystal structure is then formed by means of reactive sputtering or the like.

<Member Clad with Alumina Coating Composed Mainly of α-Type Crystal Structure Formed in Fifth Mode>

The present invention also regulates a member including an alumina coating composed mainly of α-type crystal structure formed on a base material (including a base material having a primary coating preliminarily formed thereon) in the fifth mode, wherein a concentration gradient layer in which the concentration of a metal used in the metal ion bombardment treatment is gradually increased toward the surface layer side is present in the vicinity of the surface of the base material as schematically shown in FIG. 6(d), and an oxide-containing layer and the alumina coating composed mainly of α-type crystal structure are successively formed on the surface side of the concentration gradient layer.

Concrete examples of such a member of the present invention include a cutting tool such as a turning or milling throwaway tip including a primary coating (hard coating) of TiN, TiCN, TiAlN, polycrystalline diamond, or cBN formed on a cemented carbide base material, a drill or end mill including a primary coating (hard coating) of TiN or TiCN formed on a cemented carbide base material, a cutting tool such as a throwaway chip including a primary coating (hard coating) of TiN or TiCN formed on a cermet base material, a semiconductor component including a Si wafer as a base material, a sintered cBN tool, a diamond tool, a metal mold including a cemented carbide base material or a metal mold further including a primary coating formed on this base material, a high-temperature member including a base material of heat-resistant alloy or a metal mold further including a primary coating formed on this base material, and the like.

(6) Sixth Mode

As described above, O. Zywitzki, G. Hoetzsch, et al. report that a coating containing α-alumina can be formed on an iron base material at a base material temperature of 700-760° C. by reactive sputtering using a high-output pulse power source (11-17 kW), and that an α-alumina coating could be substantially formed at a base material temperature of 750-770° C. by observation by X-ray diffraction [Surf. Coat. Technol., 86-87 (1996) p. 640-647]. O. Zywitzki et al. further report the growth process of α-alumina by detailed observation of an alumina coating formed by the same deposition as described above by transmission electron microscopy (TEM) [Surf. Coat. Technol., 94-95 (1997) p. 303-308].

On the other hand, Y. Yamada-Takaumra et al. report that an α-alumina coating can be formed at a base material temperature of 780° C. by a reactive deposition by a filter type vacuum arc method, and that α-alumina can be generated even at 460° C. by applying a RF (radio frequency) bias [Surf. Coat. Technol., 142-144 (2001) p. 260-264].

In this report, the sectional observation of alumina coating by TEM is also executed, and the detailed observation result that α-alumina is formed at the initial stage of coating growth (or in the vicinity of the interface with the base material in the coating), and α-alumina crystal grows therefrom is reported similarly to the above report by O. Zywitzki et al.

In each of the techniques reported hitherto, γ-alumina is included in the coating at the initial stage of growth. Even in case of such a coating partially including γ-alumina, when a member clad with the coating is exposed to a high temperature of 1000° C. or higher, the γ-alumina of this part may cause a phase transformation to γ-alumina. Since this phase transformation is caused with a volume change, it might cause the cracking of the coating. It is sufficiently predicted that occurrence of such a phase transformation with the volume change in the interface between the coating and the base material badly affects the adhesion of the coating.

As another technique, it is also proposed to use $\alpha$-$Cr_2O_3$ having the same crystal structure as $\alpha$-alumina as a template of crystal nucleus generation of $\alpha$-alumina ($\alpha$-$Al_2O_3$), thereby enabling the low-temperature deposition of $\alpha$-alumina [e.g., Japanese Patent Laid-Open No. 2001-335917 (claims, working examples, etc.) and "J. Vac. Sci. Technol." (A20(6), November/December, 2002, p. 2134-2136)]. It is shown in Japanese Patent Laid-Open No. 2001-335917 that, when an $\alpha$-$Cr_2O_3$ primary layer was formed on a Si wafer, $\alpha$-alumina was formed in a thickness of 0.18 µm at a base material temperature of 400° C. with deposition at a vacuum atmosphere of about $2 \times 10^{-6}$ Pa and a low deposition rate of 1 nm/min as a requirement.

With an intention of solving the problem of the treatment temperature as described above, for example, it is disclosed in Japanese Patent Laid-Open No. 2002-53946 that an oxide coating of corundum structure having a lattice constant of $\geq 4.779$ Å and $\leq 5.000$ Å and a film thickness of at least 0.005 µm is used as a primary layer, and an alumina coating of $\alpha$-type crystal structure is formed on the primary coating. It is also shown that it is effective to form a composite nitride coating of one or more elements selected from the group consisting of Ti, Cr and V with Al as a hard coating, form a coating of $(Al_2,Cr_{(1-z)})N$ (wherein z is $0 \leq z \leq 0.90$) thereon as an intermediate layer, oxidize this coating to thereby form an oxide coating of corundum structure, and then form alumina of $\alpha$-type crystal structure on the oxide coating. According to this method, crystalline $\alpha$-alumina can be formed at a relatively low base material temperature.

However, in these techniques of Japanese Patent Laid-Open No. 2001-335917 and "J. Vac. Sci. Technol." (A20(6), November/December, 2002, p. 2134-2136), it cannot be said that detection of a micro crystal phase is performed for the alumina coating to be formed, and the crystal structure of alumina in the vicinity of the interface is entirely uncertain. From this, it is conceived that, in an alumina coating formed by the conventional PVD method, $\gamma$-alumina is present at least in an area in the initial stage of coating formation where crystals are minute, and alumina of $\alpha$-type crystal structure is developed from this $\gamma$-alumina.

Therefore, the present inventors examined a means for producing an alumina coating composed substantially of $\alpha$-type crystal structure, paying attention to the surface property of the base material (or the primary coating formed on the surface of the base material) that becomes the crystal growth start part of the alumina coating.

As a result, it was found that a pretreatment such as an ion bombardment or a surface flawing treatment with an oxide powder of corundum structure is performed to the surface of the base material to form a number of minute flaws or dents on the surface of the base material, the resulting surface is oxidized at a predetermined temperature, and formation of the alumina coating is carried out, whereby at least the growth start part of the coating (or the interface between the oxide-containing layer and the alumina coating) can be formed of an assembly of $\alpha$-alumina crystals of minute structure, and crystal phases other than $\alpha$-alumina are not observed in the crystal minute part. It is also found that, even if the pretreatment as described above is not performed, the oxidation treatment condition (treatment temperature) is more strictly set, whereby the alumina coating formed thereafter can have the same crystal form as the above.

Since such an alumina coating is formed of only $\alpha$-alumina having the most thermally stable structure, the transformation of crystal form is never caused any more even if used under a high-temperature atmosphere of 1000° C. or higher, and cracking or peeling in the vicinity of the interface of the coating by a volume change of the crystal can be eliminated.

In the alumina coating of the present invention, it is preferable that crystals other than $\alpha$-alumina are not observed not only in the coating growth start part having the minute structure but also in every position of the coating, and such an alumina coating can be formed by properly setting the treatment condition.

The film thickness of the alumina coating of $\alpha$-type crystal structure is set preferably to 0.5-20 µm, more preferably to about 1-5 µm. The thickness of 0.5 µm is a thickness corresponding to the "coating growth start part" in the present invention and also a minimum thickness capable of exhibiting the performance as a heat resistant coating. By setting the coating thickness to 20 µm or less, a bad influence by the coating internal stress (generation of cracks) can be avoided. From the viewpoint of preventing the extreme roughing of the growing crystals, the thickness is preferably set to 5 µm or less.

As the means of forming the alumina coating having $\alpha$-type crystal structure in the sixth mode, the CVD method is not preferable because it must be carried out in a high temperature range of 1000° C. or higher, and the PVD method capable of performing the deposition in a low temperature range is adapted. Sputtering, particularly, reactive sputtering is suitable as the PVD method to form a high-insulating coating as alumina in a proper deposition rate, and preferable also from the viewpoint of productivity. The deposition rate can be set to 0.5 µm/hr or more in order to ensure at least 0.1 µm/hr and further enhance the productivity.

The optimum value of the base material temperature in the formation of the alumina coating is varied depending on the presence/absence of the pretreatment, the kind of the base material or primary coating, and the like. When the pretreatment is performed, it is necessary to ensure at least 700° C. or more. At a temperature lower than this, it is difficult to form the alumina coating of $\alpha$-type crystal structure.

From the viewpoint of a "reduction in temperature of process" given as one of the purposes of forming $\alpha$-alumina by the PVD method, for example, alumina is preferably deposited at a temperature of 800° C. or lower where the characteristic of a coating such as TiAlN to be formed as the primary coating is never deteriorated. The "base material temperature" referred to herein means the temperature of a base material made of cemented carbide, carbon steel, tool steel, etc. and the primary coating formed on the base material.

In the sixth mode, prior to the formation of the alumina coating, the surface of the base material or the surface of the primary coating preliminarily formed on the base material is oxidized (oxidation treatment process) to form an oxide-containing layer. This oxidation process is desirably carried out in an apparatus for forming the alumina coating to be deposited in the next process (vacuum chamber) from the point of the efficiency of treatment, or from the viewpoint of preventing the adsorption of atmospheric steam to the surface of the oxide-containing layer formed, and a thermal oxidation which is carried out at a raised base material temperature under an oxidizing gas atmosphere is preferable. As the oxidizing gas atmosphere, an atmosphere containing oxidizing gas such as oxygen, ozone, or $H_2O_2$, including the atmosphere is given.

In the oxidation, the optimum base material temperature is varied depending on the presence/absence of the pretreatment, the kind of the base material or primary coating, and the like. For example, when the primary coating is CrN, and a pretreatment by gas ion bombardment or flawing is performed thereto, the thermal oxidation must be carried out while retaining the temperature at 700° C. or higher. In contrast, when the primary coating is CrN, but no pretreatment is performed, or when the primary coating is TiAlN and a pretreatment by gas ion bombardment or flawing is performed, or when a pretreatment by metal ion bombardment with Cr is performed although the base material or primary coating is not limited, the base material temperature must be set to 750° C. or higher to perform the oxidation treatment. When the base material temperature is excessively lower than each of the temperatures described above, the oxidation cannot be sufficiently carried out, and the desired α-alumina cannot be formed even if the alumina coating forming condition is properly set.

Although the oxidation is promoted as the base material temperature is raised, it is necessary to control the upper limit of the base material temperature to lower than 1000° C. in light of the purpose of the present invention. The oxide-containing layer effective for formation of the alumina coating of the present invention can be formed even at 800° C. or lower. Accordingly, to obtain the α-alumina coating of the present invention, the base material temperature in the oxidation treatment process and the alumina coating forming process can be set in a proper base material temperature range according to the presence/absence of the pretreatment to continuously perform the processes (preferably at the same base material temperature within the same apparatus).

In the formation of the alumina coating in the sixth mode, other conditions except the base material temperature in the oxidation treatment are not particularly limited. As a concrete oxidation method, for example, it is also effectively adapted to make oxidizing gas such as oxygen, ozone or $H_2O_2$ into plasma followed by irradiation in addition to the thermal oxidization. By forming the oxide-containing layer as described above, a coating film of alumina of α-type crystal structure can be surely formed on the surface thereof.

In the sixth mode, a pretreatment such as gas ion bombardment or surface flawing with an oxide powder of corundum structure is preformed to the surface of the base material if necessary. By performing such a pretreatment, an alumina coating of α-type crystal structure can be obtained even if the following oxidation treatment and alumina coating formation are carried out at a relatively low temperature (700° C. or higher). The effect of the pretreatment may be as follows.

The ion bombardment treatment, as described above, comprises applying a negative bias voltage (DC voltage or high-frequency AC voltage) to the base material in the state where inert gas such as Ar is introduced in a vacuum chamber to generate a glow discharge at high speed, and colliding the gas ion of Ar or the like in the plasma generated by the glow discharge, thereby etching the surface of the base material. This treatment enables the further more and uniform formation of generation points (oxide points) of the alumina crystal nucleus of α-type crystal structure to be formed in the oxidation treatment of the next process.

The surface flawing treatment with an oxide powder of corundum structure comprises polishing the surface of the base material by use of, for example, alumina powder of α-type crystal structure (corundum structure) or dipping the base material in a dispersion fluid of the power to perform an ultrasonic application, thereby forming flaws or dents of a minute shape reflecting the shape of the powder on the surface of the base material.

An ultramicro amount of alumina powder of α-type crystal structure might be left on the surface of the base material by this treatment. These flaws or dents or the remaining of the ultramicro amount of alumina powder enable the uniform formation of the further more generation points (oxide points) of the alumina crystal nucleus of α-type crystal structure to be formed in the oxidation treatment of the next process similarly to the above.

As the powder used for such a treatment, a powder of corundum structure such as $Cr_2O_3$ or $Fe_2O_3$ can be applied in addition to the alumina powder of α-type crystal structure. The same alumina powder of α-type crystal structure as the alumina coating formed on the outermost surface is preferably used. The smaller size of the powder is preferable from the point of forming a minute alumina coating, and a powder having an average particle size of 50 μm or less, more preferably 1 μm or less is suitably used.

The metal ion bombardment treatment is given as another means of the pretreatment. The metal ion bombardment treatment, as described above, comprises using, for example, a vacuum arc evaporation source to evaporate a metal target material by vacuum arc discharge, and giving an energy to the generated metal ion by a bias voltage to collide it with the base material at a high temperature, thereby forming a mixed layer of the base material (or the primary coating) with a high content of the metal with the metal on the outermost surface.

The film thickness of the primary coating is set preferably to 0.5 μm or more, in order to sufficiently exhibit the wear resistance expected as the hard coating, more preferably to 1 μm or more. When the film thickness of the primary coating is too large, the primary coating is apt to crack at the time of cutting, and the life cannot be extended. Accordingly, the film thickness of the hard coating is controlled preferably to 20 μm or less, more preferably to 10 μm or less.

As another kind of primary coatings, a so-called thermal barrier coating such as an oxide ceramic (e.g., yttrium stabilized zirconia) can be also used. In this case, the film thickness is not particularly restricted.

The method of forming the primary coating is not particularly limited. However, the PVD method is preferably used to form a hard coating with satisfactory wear resistance, and AIP or reactive sputtering is more preferably adapted as the PVD method. The adaptation of the PVD method to form the primary coating is preferable from the point of improvement in productivity since the formation of the primary coating and the formation of the α-type-based alumina coating can be carried out within the same apparatus.

(7) Deposition Apparatus (Physical vapor deposition Apparatus)

As a result of research and development for a process for forming the □-alumina coating without forming any special intermediate layer such as a primary coating for forming an oxide of corundum structure on a hard coating as TiAlN, TiN, or TiCN frequently used as the hard coating, as described above, it was found that the α-alumina coating can be formed by exposing the surface of the hard coating such as TiAlN, TiN, or TiCN formed on the surface of the base material to an oxidizing atmosphere of about 650-800° C., and then forming an alumina coating at a temperature of about 650-800° C. by means of, for example, reactive sputtering.

Further, it is also found that when an alumina coating composed mainly of α-type crystal structure is particularly formed on a TiAlN coating, the surface of the coating is bombarded, the resulting surface is exposed to an oxidizing atmosphere of 650-800° C., and an alumina coating is formed thereon at a temperature of about 650-800° C. by means of reactive sputtering, whereby an alumina coating with further minute and compact crystal grains in which crystal phases other than α-type crystal are reduced can be obtained.

In order to concretely and efficiently realize such working effect of the present invention, the present inventors made examinations also for the apparatus to be used. As a result, it was found that the adaptation of the structure described blow enables efficient and stable formation of a high-purity oxide-based coating particularly excellent in high-heat resistance such as an alumina coating composed mainly of α-type crystal structure on a practical hard coating (primary coating) such as TiN, TiCN or TiAlN without arranging the special intermediate layer, and the execution of all treatment processes to the formation of the alumina coating within the same apparatus. The physical vapor deposition apparatus of the present invention which could achieve the above object will be described in detail.

The summary of an embodiment of the present invention is described. The apparatus of the present invention comprises, as a basic structure, a vacuum chamber, a base material holder (planetary rotary jig), an introducing mechanism of inert gas and oxidizing gas, a plasma source, a sputtering evaporation source, a radiation type heating mechanism, and a bias power supply.

The base material holder (planetary rotary jig) for retaining a plurality of base materials is provided rotatably on the bottom of the vacuum chamber. A rotary table is disposed on the bottom of the vacuum chamber, and the plurality of base material holders (planetary rotary jigs) are preferably disposed on the rotary table so as to be rotatable (around its own axis) on the rotary table. The base material holders may be disposed not on the bottom of the vacuum chamber but on the upper surface thereof.

The introducing mechanism of inert gas and oxidizing gas is provided to lay the inner part of the vacuum chamber in an inert gas and/or oxidizing gas atmosphere. The introducing mechanism is composed of inlet pipes for connecting the respective gas sources to the upper part of the vacuum chamber, each of which is provided with a flow control valve. As the inert gas, for example, argon can be used. Argon is excited by the plasma source to generate argon plasma, and the surface of the hard coating (primary coating) such as TiAlN, TiN, or TiC that is the base material can be bombarded with this argon ion to clean the surface.

As the oxidizing gas, oxygen, ozone, hydrogen peroxide or the like can be used. Such a gas is supplied into the vacuum chamber, whereby the cleaned hard coating (primary coating) can be oxidized. Further, when a mixed gas of the oxidizing gas with the inert gas such as argon is supplied into the vacuum chamber, this gas is made into plasma gas, so that deposition by reactive sputtering, or the formation of a so-called high-heat resistance oxide-based coating such as α-alumina having α-crystal structure on the surface of the hard coating (primary coating) can be performed.

The plasma source is provided with a mechanism for generating the plasma gas for the ion bombardment or the deposition by reactive sputtering, and disposed in a position opposed to the base material holder (planetary rotary jig). As the plasma source, various types such as filament excitation, hollow cathode discharge or RF discharge can be adapted.

The sputtering evaporation source includes a target material used for reactive sputtering as a cathode, and it is also preferably disposed in a position opposed to the base material holder (planetary rotary jig). When a highly heat-resistant coating such as α-alumina is formed, metal aluminum is used.

The radiation heating mechanism adapted to heat the base material to a predetermined temperature is preferably disposed in a position opposed to the base material holder (planetary rotary jig). The radiation type heating mechanism needs to have a heating capacity capable of heating and retaining the base material supported by the base material holder (planetary rotary jig) at 650-800° C. The hard coating (primary coating) preliminarily formed on the surface of the base material is heated to a temperature of 650-800° C., whereby the surface of the hard coating (primary coating) can be sufficiently oxidized.

The formation of the highly heat-resistant coating on the hard coating (primary coating) by reactive sputtering which is carried out successively to the oxidation treatment can be also attained advantageously by heating and retaining the hard coating in this temperature range.

This formation of the highly heat-resistant coating on the hard coating (primary coating) by thermal oxidation or reactive sputtering is insufficient at a temperature lower than 650° C. and therefore undesirable. On the other hand, in the oxidation treatment or alumina coating forming process (reactive sputtering process), the oxidation treatment or the formation of alumina coating can be carried out even if the temperature of the radiation type heating mechanism does not exceed 800° C. A high temperature exceeding 800° C. might deteriorate the characteristic of the hard coating. However, when a hard coating such as TiAlN, TiN or TiC is formed on the base material by use of AIP (arc ion plating) in the same apparatus, the radiation type heating mechanism preferably has a heating capacity suitable also for the execution of the AIP.

The bias power supply connected to the base material holder (planetary rotary jig) must be able to apply a negative pulse bias voltage to the base material holder (planetary rotary jig). According to this, even if a base material holder (planetary rotary jig) with an insulating film adhered thereto is used in the ion bombardment process, a stable voltage can be applied.

This apparatus further can include an arc evaporation source. The arc evaporation source is also arranged in a position opposed to the base material holder (planetary rotary jig) similarly to the sputtering evaporation source. By providing the arc evaporation source, the deposition by AIP can be also performed in this apparatus.

Figure 8:
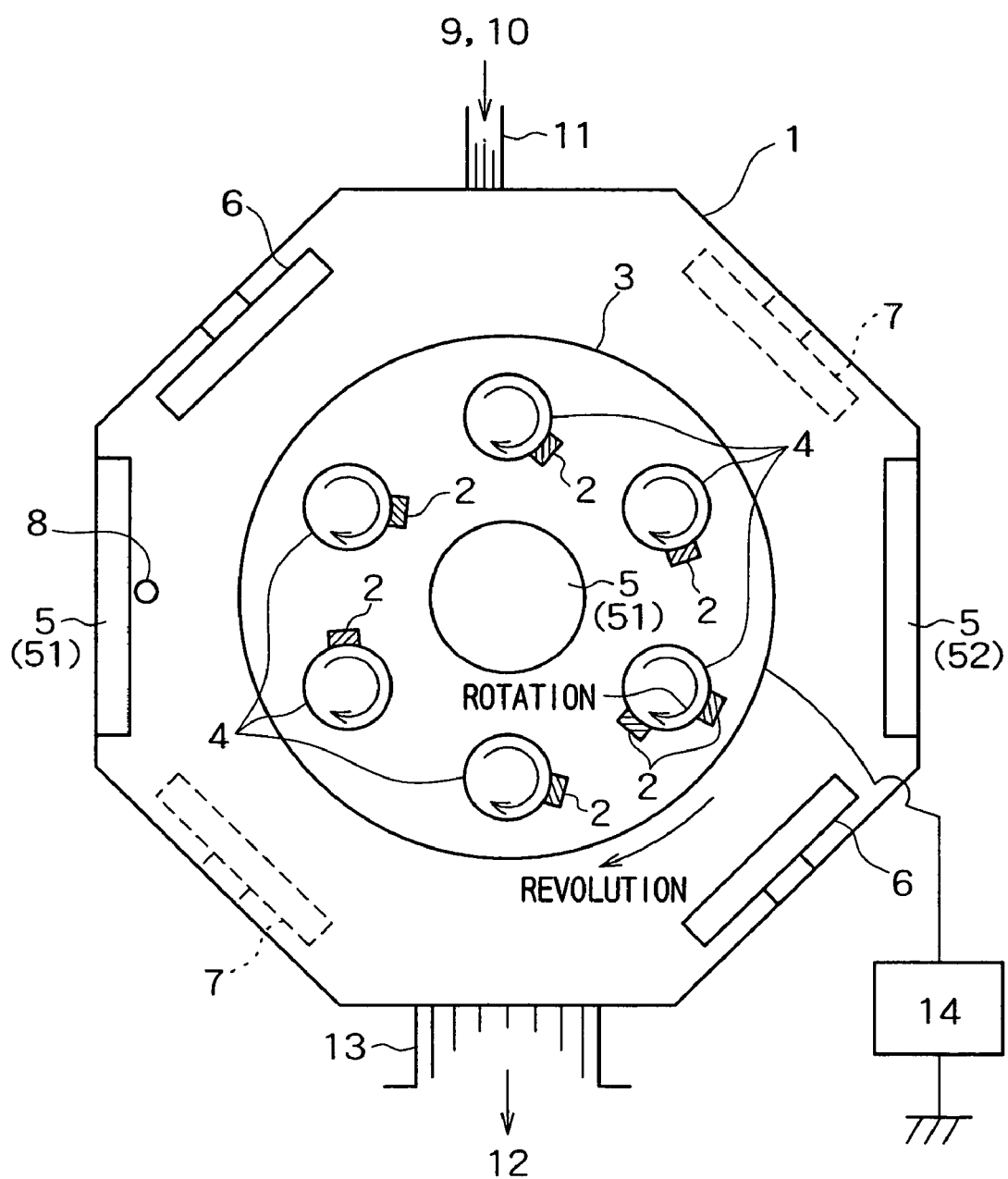
FIG. 8 is a sectional schematic illustrative view showing the outline of a physical vapor deposition apparatus according to an embodiment of the present invention.

A concrete example of the embodiment of the present invention will be described in detail with reference to the drawings. FIG. 8 is a sectional illustrative view of the physical vapor deposition apparatus of the present invention. This apparatus comprises a circular rotary table 3 set within a vacuum chamber 1 having a regular octagonal section (cross section), and a plurality (six in this example) of base material holders (planetary rotary jigs) 4 arranged circumferentially at equal intervals on the circular rotary table 3. A base material 2 to be treated is retained by the base material holder (planetary rotary jig 4), and rotated in a planetary manner by the rotation of the rotary table 3 and the rotation of the base material holder (planetary rotary jig) 4.

A cylindrical radiation type heating heater 51 is disposed in the center part on the rotary table 3, or the inside center opposed to the base material holder (planetary rotary jig) 4, and flat radiation type heating heaters 52, 52 each opposed to base material holders (planetary rotary jigs) 4. are also provided on two mutually opposed surfaces of the inside surfaces (eight surfaces) of the vacuum chamber 1 in a state where they are mutually opposed across the rotary table 3, and these heaters 51 and 52 constitutes a base material heating mechanism 5.

A plasma source 8 for exciting atmospheric gas to plasma gas (a filament set to generate the plasma is shown in the drawing) is disposed on the inside of the radiation type heating heater 52, and sputtering evaporation sources 6, 6 for reactive sputtering are provided in positions opposed to the base material holders (planetary rotary jigs) 4 on other two inside surfaces of the vacuum chamber 1 in a state where they are mutually opposed across the rotary table 3. Further, arc evaporation sources 7, 7 for AIP are similarly set in positions opposed to the base material holders (planetary rotary jigs) 4 on other two inside surfaces of the vacuum chamber 1 in the state where they are mutually opposed across the rotary table 3. Since the arc evaporation sources 7, 7 might not be required, they are shown by dotted lines in the drawing.

A gas inlet pipe 11 for introducing inert gas 9 for generating a plasma and oxidizing gas 10 for oxidation treatment into the chamber is connected to a proper position at the upper part of the vacuum chamber 1, and an exhaust gas pipe 13 for evacuation or discharge of exhaust gas 12 after treatment is connected to a proper position at the lower part of the vacuum chamber 1.

Denoted at 14 in FIG. 8 is a bias power supply connected to the base material holders (planetary rotary jigs) 4, which can apply a negative pulse bias voltage (100-2000V) to the base material holders (planetary rotary jigs) 4.

According to this embodiment, since the base material holder (planetary rotary jig) 4, the inert gas and oxidizing gas introducing mechanism, the plasma source, the sputtering evaporation source 6, the arc evaporation source 7, the radiation type heating heaters 51 and 52, the bias power supply 14, and the like are disposed within the vacuum chamber 1 as described above, all processes relevant to a physical vapor deposition treatment such as the process of forming a primary coating such as hard coating on the surface of the base material of a tool or wear-resistant member by AIP, the process of ion-bombarding the surface of the primary coating such as hard coating, the process of thermally oxidizing the surface of the primary coating such as hard coating, and the process of forming a highly heat resistant oxide-based coating such as α-alumina on the thermally oxidized surface of the hard coating by reactive sputtering can be executed by use of a single apparatus.

Since the base materials 2 can be rotated in a planetary manner within the chamber 1 by the rotary table 3 and the plurality of base material holders (planetary rotary jigs) 4 provided on the table, the treatment of the base materials 2 in each process can be uniformly performed. Namely, the hard coating can be ion-bombarded or thermally oxidized in a fixed ratio over the whole surface of the base material and, further, a film with a uniform thickness can be also formed over the whole surface of the base material can be also formed in the deposition of the hard coating or oxide-based coating by reactive sputtering or AIP. Accordingly, a highly heat-resistant coating excellent in adhesion can be obtained.

Further, both the radiation type heating heaters 51 and 52 are installed, whereby the materials 2 circulated and passed with the rotation of the rotary table 3 can be effectively heated at the same time from inside and outside, or from the center side of the table 3 and from the wall side of the chamber 1 to improve the productivity in a treatment process such as thermal oxidation, deposition or the like. Further, the bias power supply 14 capable of applying a negative pulse bias voltage is provided to connect with the base material holders (planetary rotary jigs) 4, whereby even if an alumina coating or the like which is apt to take on insulating property according to the continuous use of the base material holders (planetary rotary jigs) 4 is formed on the base material holders (planetary rotary jigs) 4 or the like, a stable voltage can be applied without causing an arc discharge resulted from charge-up. The deposition is carried out with such a stabilized application of voltage, whereby a product such as a cutting tool having a highly adhesive coating can be consequently obtained.

In this embodiment, further, since the vacuum chamber 1 having a regular octagonal section is adapted, and each necessary component such as the sputtering evaporation source 6, the arc evaporation source 7, or the flat radiation type heating heater 52 is arranged in pairs on six inside surfaces of the chamber 1 opposite to each other, respectively, this apparatus has a compact structure having no waste space.

Figure 9:
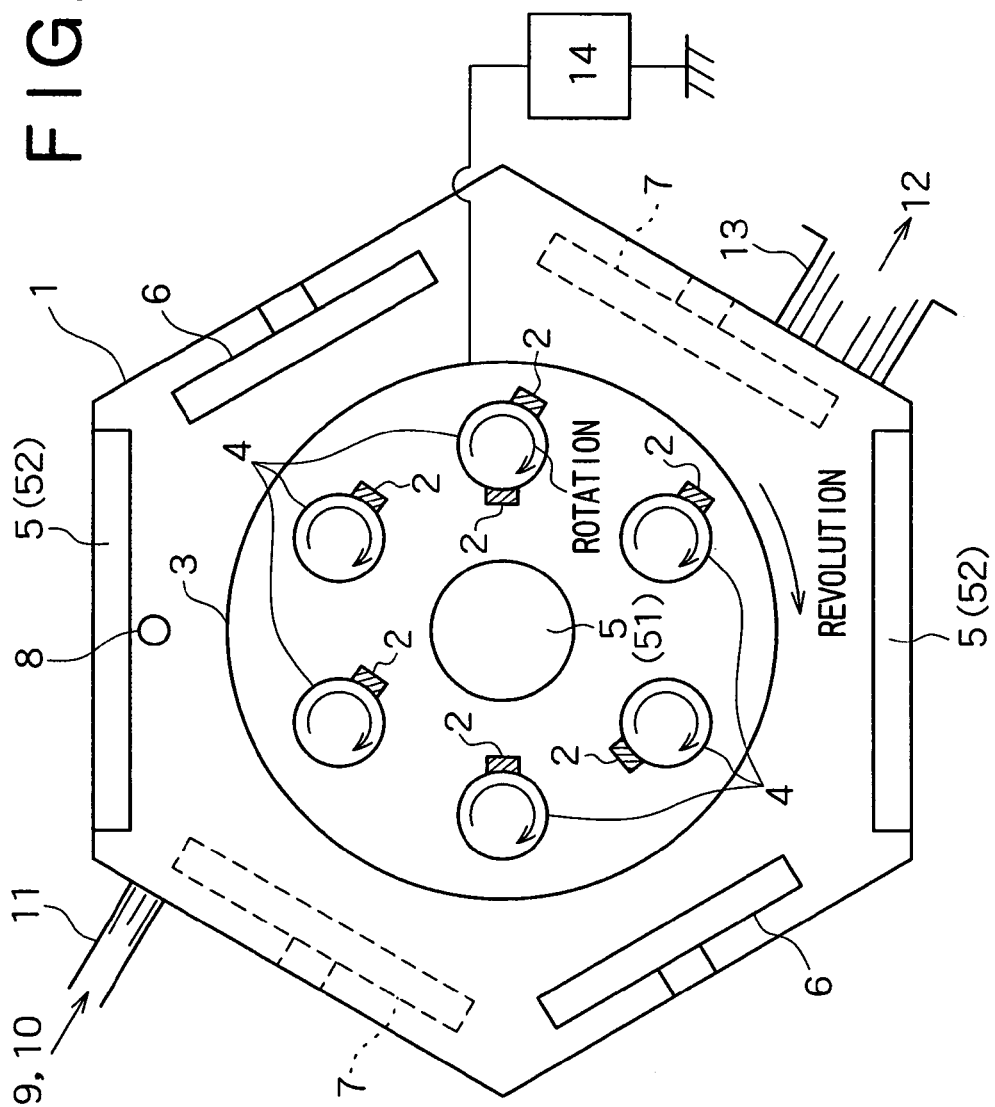
FIG. 9 is a sectional illustrative view showing the outline of a physical vapor deposition apparatus according to another embodiment of the present invention.
Figure 10:
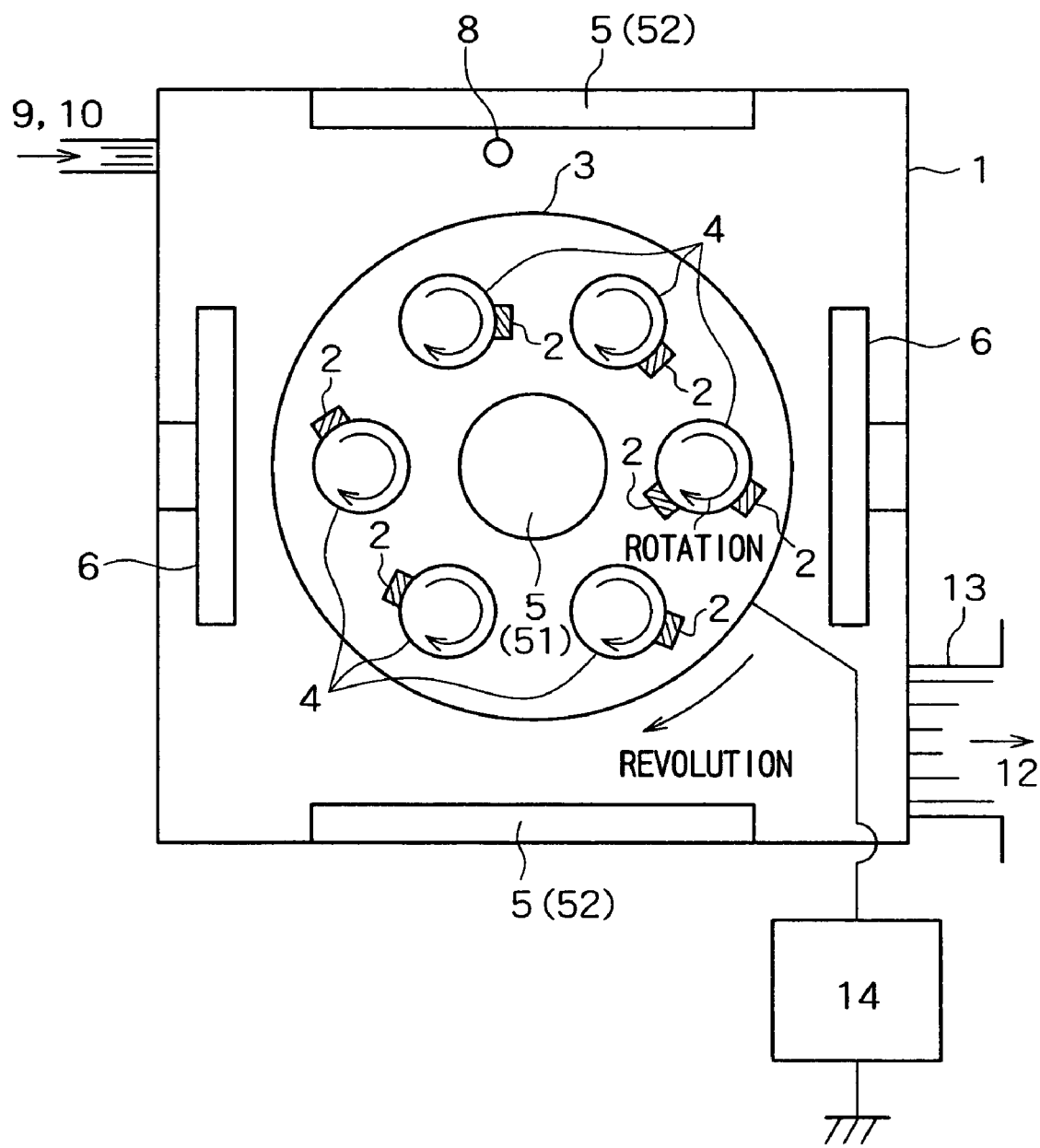
FIG. 10 is a sectional illustrative view showing the outline of a physical vapor deposition apparatus according to further another embodiment of the present invention.

FIGS. 9 and 10 are sectional illustrative views of physical vapor deposition apparatuses showing concrete embodiments. Since the basic structure of each apparatus is common to FIG. 8, only the points different from FIG. 8 will be described.

In the apparatus of FIG. 9, the vacuum chamber 1 has a regular hexagonal sectional shape, and the sputtering evaporation source 6, the arc evaporation source 7 and the flat radiation type heating heater 52 are disposed each in pairs on all the six inside surfaces of the chamber 1 opposite to each other, respectively. In the apparatus of FIG. 10, the vacuum chamber 1 has a square sectional shape, and the sputtering evaporation source 6 and the flat radiation type heating heater 52 are provided each in pairs on all the four inside surfaces of the chamber opposite to each other.

According to the embodiments of FIGS. 9 and 10, the structure can be made more compact than the embodiment of FIG. 8. Although the whole surface opposed to the base material holders (planetary rotary jigs) 4 of the radiation type heating heater 52 is flat in the embodiments of FIGS. 8-10, the shape of the radiation type heating heater 52 is not limited to this, and a curved surface matched to the curvature radius of the circumferential surface of the rotary table 3 may be adapted. The plasma source 8 needs not to be arranged in front of the heater 52.

WORKING EXAMPLES

The present invention will be described further concretely according to working examples. The present invention is never limited by the following examples, and modification and variation of the present invention are possible within the range adaptable to the gist of the previous and following descriptions, and naturally included in the technical scope of the present invention.

(1) Working Example for Fist Mode

Example 1

A working example for the first means (Mode 1-a and b) will be described. A cemented carbide base material of 12.7 mm×12.7 mm×5 mm, which was mirror-polished (Ra=about 0.02 □m) and ultrasonically cleaned in an alkali bath and a pure water bath followed by drying, was used for cladding of a laminate coating.

Figure 4:
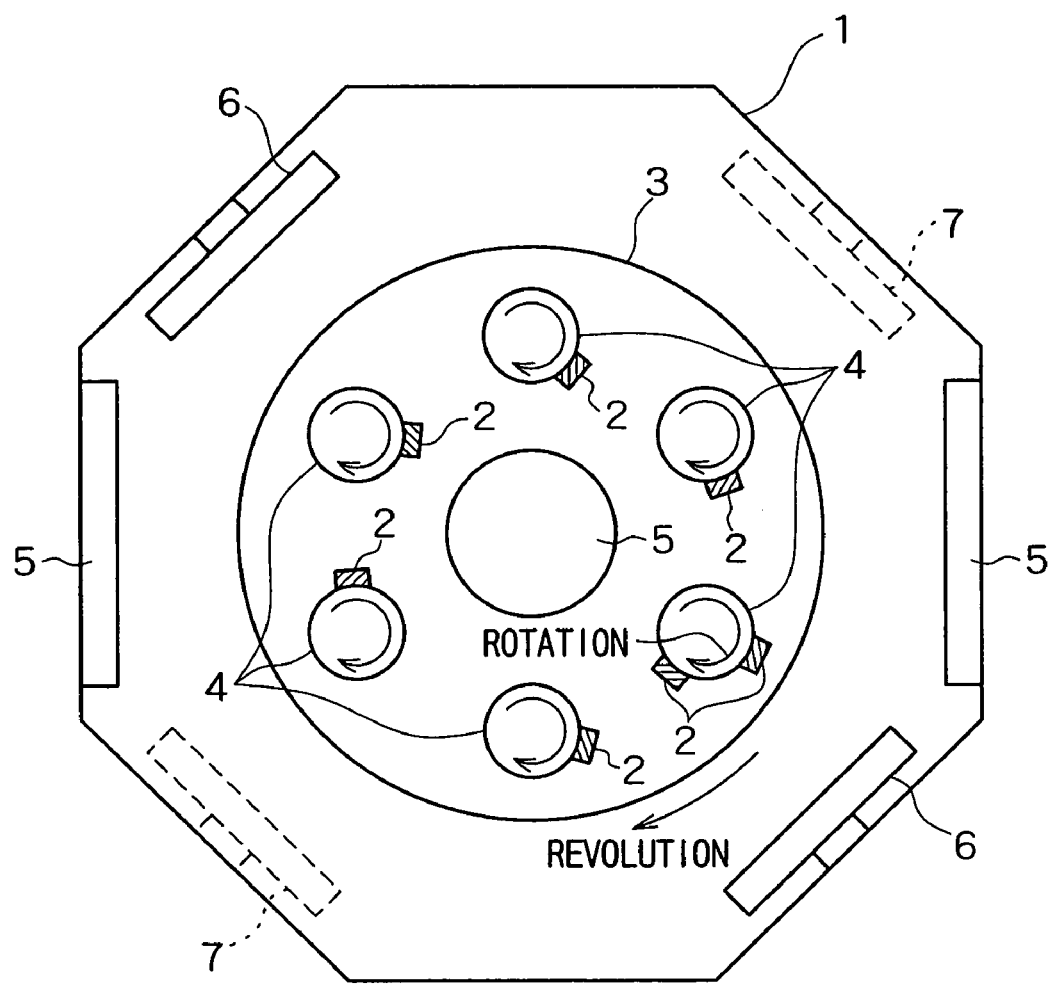
FIG. 4 is a schematic illustrative view (top view) showing of an example of the apparatus used in the first, second or sixth mode.

In this example, formation of a hard coating, oxidation treatment of the hard coating, and formation of an α-type-based alumina coating were carried out by use of a vacuum deposition apparatus shown in FIG. 4 (manufactured by Kobe Steel, Ltd. composite machine AIP-S40).

The formation of the hard coating on the base material was carried out in the apparatus 1 shown in FIG. 4 by AIP (arc ion plating) using an AIP evaporation source 7 to form a TiAlN hard coating with an atomic ratio of Ti:Al of 0.55:0.45 or a TiAlCrN hard coating with an atomic ratio of Ti:Al:Cr of 0.10:0.65:0.18 in a thickness of 2-3 μm. As Comparative Case 1, a CrN coating was further formed on the TiAlN coating by the AIP.

The oxidation of the hard coating or the oxidation of the CrN coating formed on the hard coating was carried out as follows. A sample (base material) 2 was set to a base material holders (planetary rotary jigs) 4 on a rotary table 3 within the apparatus 1, evacuation was performed until the inside of the apparatus is laid substantially in a vacuum state, the sample was heated by heaters 5 set on two side surfaces and the center part in the apparatus to a temperature shown in Table 1 (a substrate temperature in oxidation treatment process). When the temperature of the sample reached a predetermined temperature, oxygen gas was introduced into the apparatus 1 with a flow rate of 200 sccm and a pressure of 0.5 Pa, and the sample was heated and retained for 20 minutes or 60 minutes, and oxidized.

The formation of the hard coating, the oxidation treatment and the deposition of alumina described later were carried out while rotating (revolving) the rotary table 3 in FIG. 4 and also rotating the base material holders (planetary rotary jigs) 4 set thereon around its own axis. In this example, the oxidation treatment and the alumina deposition were carried out while rotating the rotary table 3 at a rotating speed of 3 rpm and the base material holders (planetary rotary jigs) 4 at a rotating speed of 20 rpm.

An alumina coating composed mainly of α-type crystal structure was then formed on the resulting oxide-containing layer. The formation of alumina coating was carried out at substantially the same base material temperature as in the oxidation treatment process in an atmosphere of argon and oxygen by a reactive sputtering method by applying a pulse DC power of about 3 kW to a sputtering cathode 4 provided with one or two aluminum targets. At the time of the formation of alumina coating, the sample (substrate) temperature became slightly higher than in the oxidation treatment. The formation of alumina coating was carried out while controlling the discharge voltage and the flow rate ratio of argon-oxygen by plasma emission spectrometry to set the discharge state to a so-called transition mode.

The surface of the thus-formed laminate coating was analyzed by use of a grazing incidence X-ray diffraction device to specify the crystal structure of the alumina coating formed as an outermost surface coating. Namely, a peak intensity Iα of $2\theta=25.5761(°)$ and a peak intensity Iγ of $2\theta=19.4502(°)$ were selected as an X-ray diffraction peak representing alumina of α-type crystal structure and an X-ray diffraction peak alumina of α-type crystal structure, respectively, from the X-ray diffraction measurement results as shown FIGS. 11 and 12 described later, and mutually compared, whereby the degree of formation of the alumina of α-type crystal structure was evaluated from the magnitude of the intensity ratio of the both : Iα/Iγ value. The results are also shown in Table 1.

Figure 11:
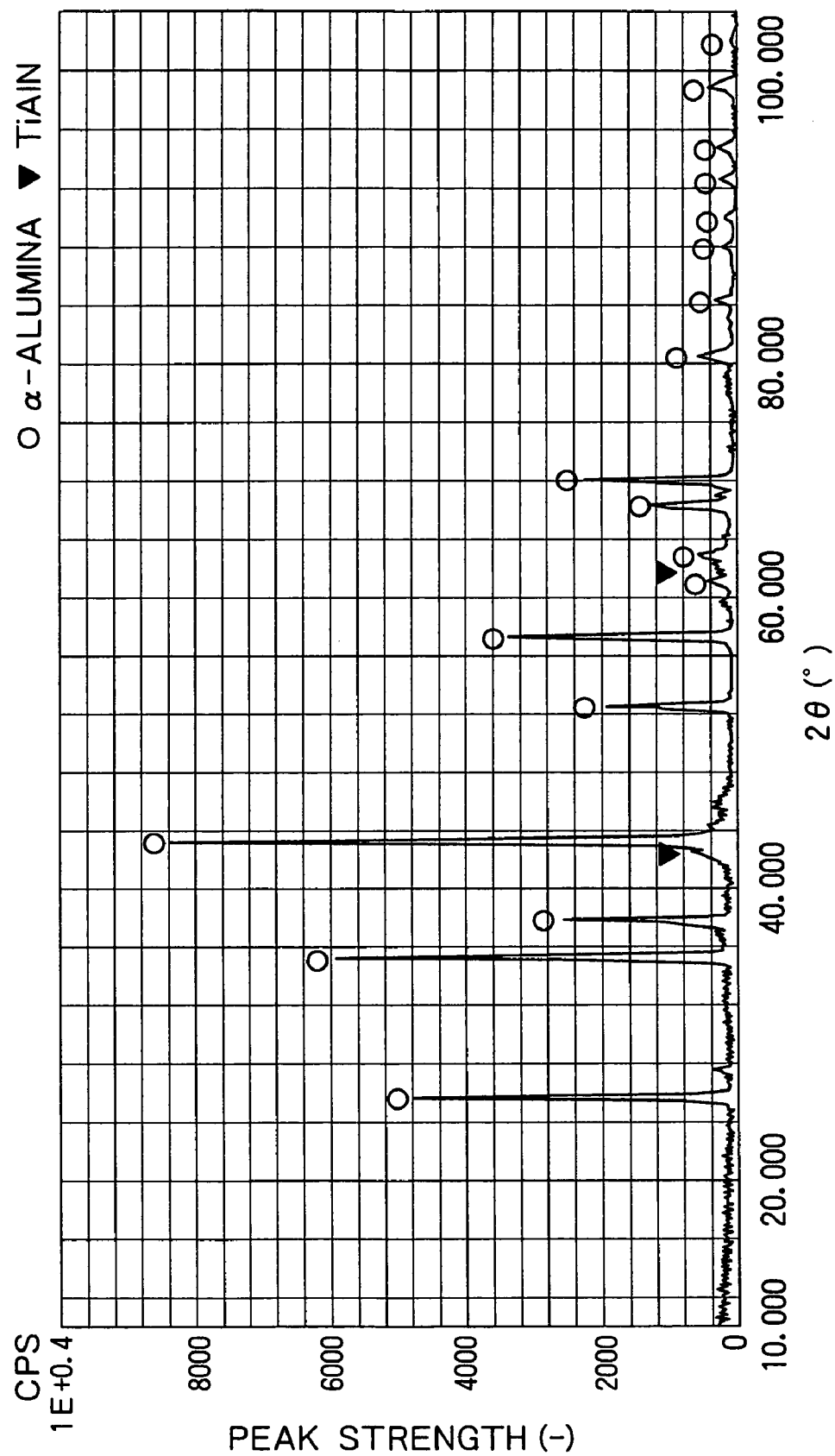
FIG. 11 is a graph showing the grazing incidence X-ray diffraction result of Inventive Case 1 in Example 1 for the first mode.

FIG. 11 shows the measurement result of the surface of the laminate coating of Inventive Case 1 by a grazing incidence X-ray diffraction device. The essential peaks of X-ray diffraction shown in FIG. 11 are the diffraction peaks resulted from TiAlN and the diffraction peaks of the alumina of □-type crystal structure formed on the outermost surface, and this shows that the coating of Inventive case 1 comprises an alumina coating composed mainly of α-type crystal structure formed on the hard coating.

FIG. 12 shows the grazing incidence X-ray diffraction result of the laminate coating surface of Comparative Case 1, wherein diffraction peaks resulted from $Cr_2O_3$ formed by oxidizing CrN that is an intermediate layer are observed with the diffraction peaks of alumina of α-type crystal structure.

This shows that an alumina coating composed mainly of α-type crystal structure is formed in Comparative Case 1 similarly to Inventive Case 1. However, the hard coating of the present invention is more excellent, because the process of providing the intermediate coating can be omitted to further enhance the productivity of the laminate coating, in addition to no necessity of concerns about deterioration of cutting performance by the Cr-containing coating formed as the intermediate layer.

In Inventive Cases 2 and 3, TiAlN or TiAlCrN was formed as the hard coating on the base material, and the deposition was carried out in the same condition as in Inventive Case 1 except setting the base material temperature in the oxidation treatment process to 750° C. lower than Inventive Case 1 by 30° C. As shown in Table 1, α-type-based alumina coatings are formed in Inventive Cases 2 and 3 although alumina of α-type crystal structure is slightly included in the formed coatings.

In Inventive Case 4, TiAlN was formed as the hard coating, and the deposition was carried out in the same condition as Inventive Case 1 except setting the base material temperature in the oxidation treatment process to 740° C. which is further lower than in Inventive Cases 2 and 3, and setting the oxidation treatment time to 60 minutes which is longer than in Inventive Cases 1-3. As shown in Table 1, the outermost surface of the coating obtained in Inventive Case 4 is covered with substantially pure alumina of α-type crystal structure.

In Comparative Cases 2 and 3, heating and retention were carried out for 20 minutes at an oxidation treatment temperature of 635° C. in Comparative Case 2 and at 580° C. in

TABLE 1

|  | Hard Coating | Oxidation Process | | Deposition Process of Alumina Coating | | Measurement Result of Alumina Coating | |
|---|---|---|---|---|---|---|---|
|  |  | Substrate Temp. | Heating Time Power | Number of sputtering sources used | Substrate Temp. | Film Thickness Iα/Iγ | Crystal Structure |
| Inventive Case 1 | TiAlN | 780° C. | 20 min 3 kW | 2 | 780° C. | 2 μm γ-peak not detected*[1] | α-type |
| Comparative Case 1 | TiAlN + CrN |  |  |  |  | 2 μm γ-peak not detected*[1] | α-type |
| Inventive Case 2 | TiAlN | 750° C. | 20 min 3 kW | 1 | 770° C. | 1.15 μm 2.8 | α-type: main, γ-type: sub |
| Inventive Case 3 | TiAlCrN |  |  |  |  | 1.15 μm 2.9 | α-type: main γ-type: sub |
| Inventive Case 4 | TiAlN | 740° C. | 60 min 3 kW | 1 | 770° C. | 0.9 μm γ-type not detected*[1] | α-type |
| Comparative Case 2 | TiAlN | 635° C. | 20 min 3 kW | 1 | 670° C. | 1.3 μm 1.4 | Mix of α-type and γ-type |
| Comparative Case 3 | TiAlN | 580° C. | 20 min 3 kW | 2 | 590° C. | 2 μm α-type not detected*[2] | γ-type |

*[1]Peak of $2\theta = 19.4502°$ is not detected.
*[2]Peak of $2\theta = 25.5761°$ is not detected.

Comparative Case 3. As is apparent from the result of Comparative Case 3 in which the oxidation treatment is carried out at 580° C., no alumina coating of α-type crystal structure can be formed even if the deposition of alumina coating is performed thereafter, and an alumina coating composed mainly of γ-type crystal structure is formed. In Comparative Case 2 in which the oxidation is carried out at 635° C., the alumina coating formed has a mixed crystal structure of α-type and γ-type although the α-type is slightly dominant, but it is hard to say that this coating is composed mainly of α-type.

Example 2

A working example for the second means (Mode 1-c) will be described. A cemented carbide base material of 12.7 mm×12.7 mm×5 mm, which was mirror-polished (Ra=about 0.02 μm) and ultrasonically cleaned in an alkali bath and a pure water bath followed by drying, was used for cladding of a laminate coating.

In this example, also, formation of a hard coating, oxidation treatment of the hard coating, and formation of an α-type-based alumina coating were carried by use of the vacuum deposition apparatus shown in FIG. 4 (manufactured by Kobe Steel, Ltd. composite machine AIP-S40).

The formation of the hard coating on the base material was carried out in the apparatus 1 shown in FIG. 4 by AIP (arc ion plating) using an AIP evaporation source 7 to form a TiN coating or TiCN coating with a thickness of 2-3 μm on the substrate. As a reference case, a CrN coating of the same thickness was formed on substrate.

The oxidation of the hard coating was carried out as follows. A sample (base material) 2 was set to a base material holder (planetary rotary jig) 4 on a rotary table 3 within an apparatus 1. After evacuation was carried out until the inside of the apparatus is laid substantially in a vacuum state, the sample was heated by heaters 5 set in two side surfaces and in the center part in the apparatus to about 760° C. When the temperature of the sample reached about 760° C., oxygen gas was introduced into the apparatus 1 with a flow rate of 200 sccm and a pressure of 0.5 Pa, and the sample was heated and retained for 20 minutes and oxidized.

The formation of the hard coating, the oxidization treatment and the deposition of alumina described later were carried out while rotating (revolving) the rotary table 3 in FIG. 4 and rotating the base material holders (planetary rotary jigs) 4 set thereon around its own axis. In this example, the oxidation treatment and the alumina deposition were carried out while rotating the rotary table 3 at a rotating speed of 3 rpm and rotating the base material holders (planetary rotary jigs) 4 at a rotating speed of 20 rpm.

An alumina coating composed mainly of □-type crystal structure was then formed on the oxide-containing layer. The formation of the alumina coating was carried out at substantially the same substrate temperature as in the oxidation treatment process in an atmosphere of argon and oxygen by reactive sputtering by applying a pulse DC power of an average of 5.6 kW to the sputtering cathode 6 mounted with two aluminum targets in FIG. 4. At the time of the formation of alumina coating, the sample (substrate) temperature became slightly higher than in the oxidation treatment.

The formation of alumina coating was carried out while controlling the discharge voltage and the flow rate ratio of argon-oxygen by use of plasma emission spectrometry to set the discharge state to a so-called transition mode.

The surface of the thus-formed laminate coating was analyzed by a grazing incidence X-ray diffraction device (grazing incidence XRD-analyzed) to specify the crystal structure of the alumina coating formed as an outermost surface coating. The grazing incidence X-ray diffraction result in the use of the TiN coating (Inventive Case 1') is shown in FIG. 1, and the grazing incidence X-ray diffraction result in the use of the TiCN coating (Inventive Case 2) is shown in FIG. 13.

Figure 13:
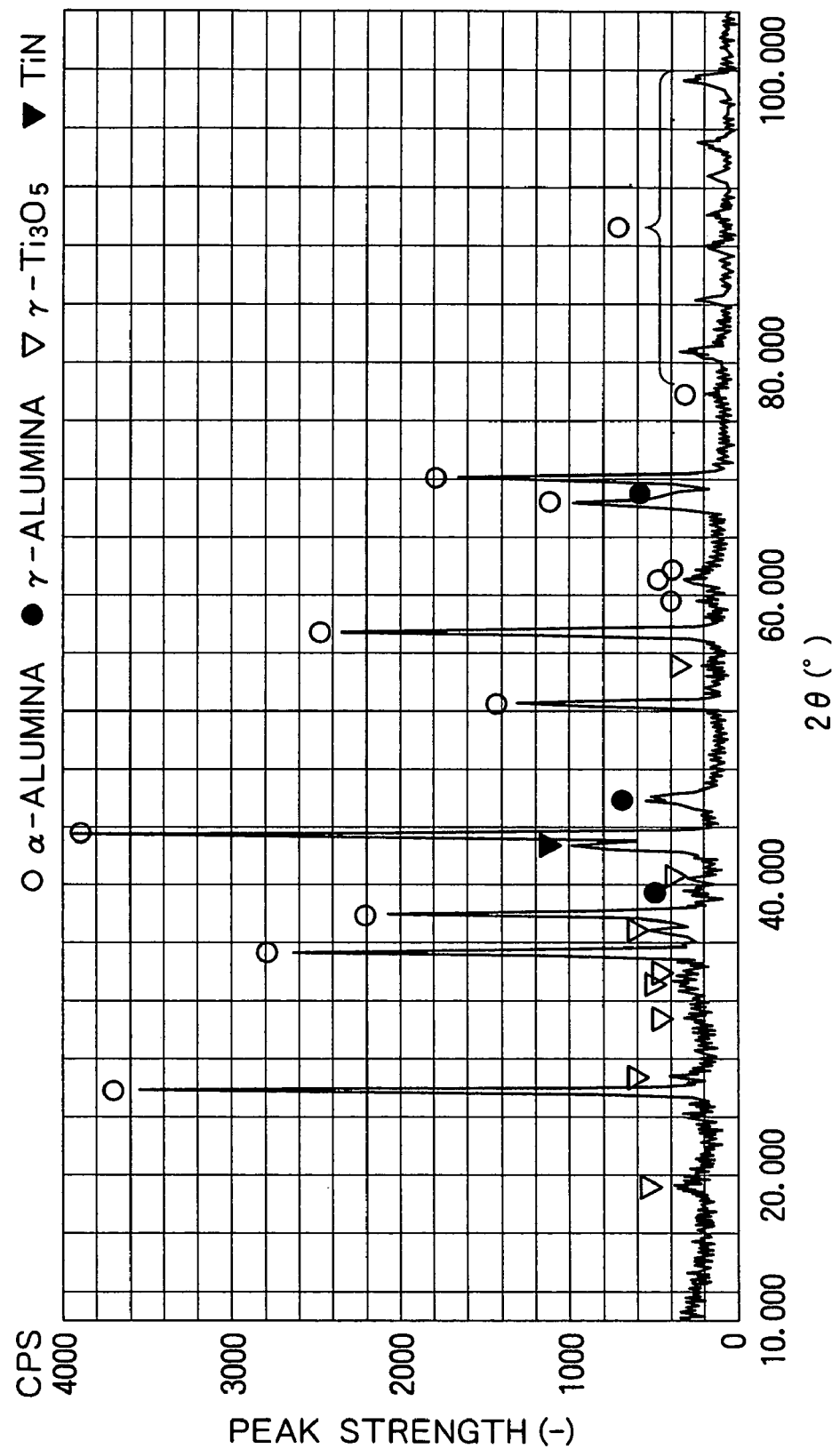
FIG. 13 is a graph showing the grazing incidence X-ray diffraction result of Inventive Case 2' (TiCN coating) in Example 2 for the first mode.

Similarly to Example 1, the Iα/Iγ values were determined from the grazing incidence X-ray diffraction results of FIG. 1 and FIG. 13 to evaluate the degree of formation of the alumina of α-type crystal structure. The results are shown in Table 2 with the deposition condition described above.

TABLE 2

| | | Oxidation Process | | Deposition Process of Alumina Coating | | | Measurement Result of Alumina Coating | | |
|---|---|---|---|---|---|---|---|---|---|
| | Hard Coating | Substrate Temp. | Heating Time | Substrate Temp. | Average Discharge Power (total of 2) | Deposition Time | Film Thickness | I α/I γ | Crystal Structure |
| Inventive Case 1' | TiN | 760° C. | 20 min | 770° C. | 5.6 kW | 3 hr | 2 μm | γ-peak not detected* | α-type: main γ-type: sub |
| Inventive Case 2' | TiCN | | | | | | | γ-peak not detected* | α-type: main γ-type: sub |
| Reference Case | CrN | | | | | | | I α/I γ = 6.4 | α-type: main γ-type: sub |

*Peak of 2 θ = 19.4502° is not detected

The essential peaks shown in FIGS. 1 and 13 are diffraction peaks resulted from the TiN coating or TiCN coating (in FIG. 13, only the TiN structure in the TiCN coating is detected by grazing incidence X-ray diffraction) and the diffraction peaks of the alumina of α-type crystal structure formed on the outermost surface, the X-ray diffraction peak (2θ=19.4502°) representing alumina of γ-type crystal structure was not confirmed from FIG. 1, FIG. 13 and Table 2, and peaks showing alumina of other γ-type crystal structures were also small. Accordingly, this shows that the laminate coatings of Inventive Cases 1' and 2' comprise an alumina coating composed mainly of a-type crystal structure formed on the hard coating in the laminate coating.

Further, from FIGS. 1 and 13, peaks of $Ti_3O_5$, which was conceivably formed by oxidizing the coating followed by reduction, can be confirmed between the TiN coating or TiCN coating and the alumina coating.

A reference case is an example in which an alumina coating is formed on a CrN coating containing Cr that is a metal having a standard free energy of oxide generation smaller than that of aluminum as a metal component. It is found from Table 2 that the resulting alumina coating has a high ratio of alumina of γ-type crystal structure to alumina of α-type crystal structure since the Iα/Iγ values are small, compared with Inventive Case 1 or 2.

(2) Working Example for the Second Mode

Cemented carbide base materials with various intermediate layers (A)-(E) below preliminarily formed thereon were prepared.

(A) Cr metal film: film thickness 0.1 μm (formed by AIP)

(B) Ti metal film: film thickness 0.1 μm (formed by AIP)

(C) TiAl film: film thickness 0.1 μm (Ti:Al-50:50, formed by sputtering)

(D) Fe film (containing Cr and Ni in addition):,film thickness 0.1 μm (formed by sputtering by use of a SUS 304 target)

(E) $CrN_x$ film: film thickness 3 μm [formed by AIP by evaporating chromium at a nitrogen pressure: 0.13, 0.27; 0.65, 1.3, 2.7 (Pa)]

With respect to the chromium/nitrogen coating of (E), composition analysis by XPS (X-ray photoelectron spectroscopy) and crystal structure analysis by XRD (X-ray diffraction) were executed. The results are shown in Table 3 below. Among those shown in Table 3, the CrN film formed at a pressure of 2.7 Pa has a composition close to the stoichiometric composition (x is 0.96 in $CrN_x$), which corresponds to the related art.

TABLE 3

| Deposition Pressure (Pa) | Composition | Crystal Structure |
|---|---|---|
| 0.13 | Cr:N = 1:0.31 | $Cr + Cr_2N$ |
| 0.27 | Cr:N = 1:0.59 | $Cr_2N$ |
| 0.65 | Cr:N = 1:0.75 | $Cr_2N + CrN$ |
| 1.3 | Cr:N = 1:0.85 | CrN |
| 2.7 | Cr:N = 1:0.96 | CrN |

The coating formation of the present invention was then carried out by use of the PVD apparatus (vacuum deposition apparatus) shown in FIG. 4. Namely, a sample (base material) 2 was set to a base material holder (planetary rotary jig) 4 within an apparatus 1.After evacuation was carried out until the inside of the apparatus 1 is laid substantially in a vacuum state, the sample was heated by heaters 5 set in side surfaces and the center part in the apparatus to 750° C. When the temperature of the sample reached 750° C., oxygen gas was introduced into the apparatus 1 with a flow rate of 300 sccm and a pressure of about 0.75 Pa to oxidize the surface for 5 minutes. Denoted at 7 in FIG. 4 is an AIP evaporation source for forming an intermediate layer by AIP.

Then, sputtering was carried out by applying a pulse DC power of about 2.5 kW to a sputtering cathode 6 mounted with two aluminum targets in an atmosphere of argon and oxygen to form aluminum oxide (alumina) in substantially the same temperature condition (750° C.) as the oxidation temperature. At the formation of alumina, an alumina coating of about 2□m was formed while keeping the discharge state in a so-called transition mode by use of discharge voltage control and plasma emission spectrometry. The coating formation was carried out while rotating (revolving) the rotary table 3 shown in FIG. 4 and also rotating the base material holders (planetary rotary jigs) 4 set thereon around its own axis.

Each treatment-completed sample was analyzed by grazing incidence X-ray diffraction to specify the crystal structure. The result is shown in Table 4. The result shows that an alumina coating having a satisfactory crystal structure (or a structure composed mainly of α-type crystal structure) can be formed when the coating formation is carried out in a condition satisfying requirements regulated in the present invention (Nos. 1-8).

TABLE 4

| No. | Intermediate Layer | Crystal Structure |
|---|---|---|
| 1 | Cr metal film (0.1 μm) | α |
| 2 | Ti metal film (0.1 μm) | α |
| 3 | TiAl alloy film (0.1 μm) | α + trace γ |
| 4 | Fe-based metal film | α + trace γ |
| 5 | $CrN_{0.31}$ | α |
| 6 | $CrN_{0.59}$ | α |
| 7 | $CrN_{0.75}$ | α |
| 8 | $CrN_{0.85}$ | α + trace γ |
| 9 | $CrN_{0.96}$ | α + γ |

(3) Working Example for the Third Mode

Figure 14:
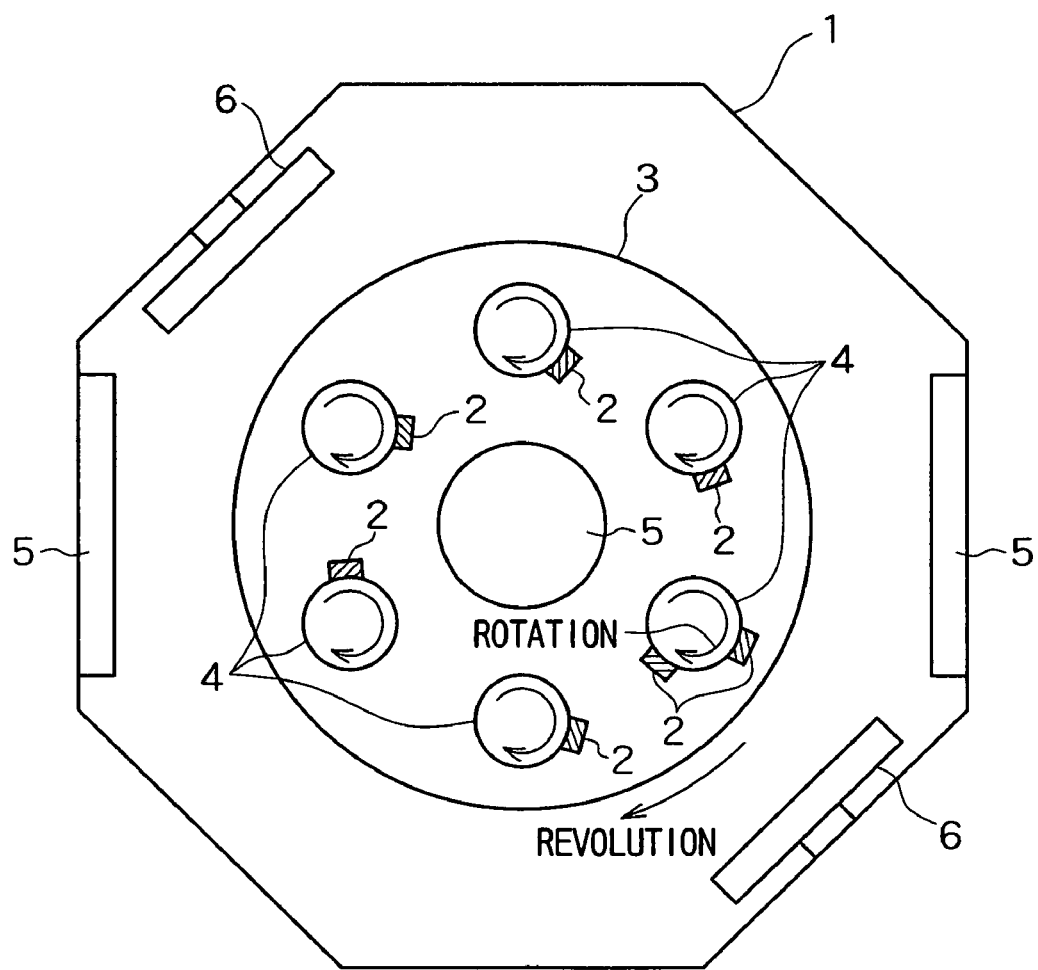
FIG. 14 is a schematic illustrative view (top view) showing an example of the apparatus used in the third mode.

By use of a commercially available sintered cBN cutting tool as a base material for forming an alumina coating, the alumina coating formation onto the base material was carried out in a PVD apparatus (vacuum deposition apparatus) shown in FIG. 14. A sample (base material) 2 was set to a base material holder (planetary rotary jig) 4 within an apparatus 1. After evacuation was carried out until the inside of the apparatus is laid substantially in a vacuum state, the sample was heated by heaters 5 set in side surfaces and the center part in the apparatus to 750° C. When the temperature of the sample reached 750° C., oxygen gas was introduced into the apparatus 1 with a flow rate of 300 sccm and a pressure of about 0.75 Pa to oxidize the surface for 20 minutes.

Then, sputtering was carried out by applying a pulse DC power of about 2.5 kW in a mixed atmosphere of argon and oxygen by use of a sputtering cathode 6 mounted with two aluminum targets to form an alumina coating in substantially the same temperature condition (750° C.) as the oxidation temperature. At the formation of alumina coating, an alumina coating of about 2 μm was formed while keeping the discharge state in a so-called transition mode by use of discharge voltage control and plasma emission spectrometry. The formation of alumina coating was carried out while rotating (revolving) the rotary table 3 shown in FIG. 14 and also rotating the base material holders (planetary rotary jigs) 4 set thereon around its own axis.

Figure 15:
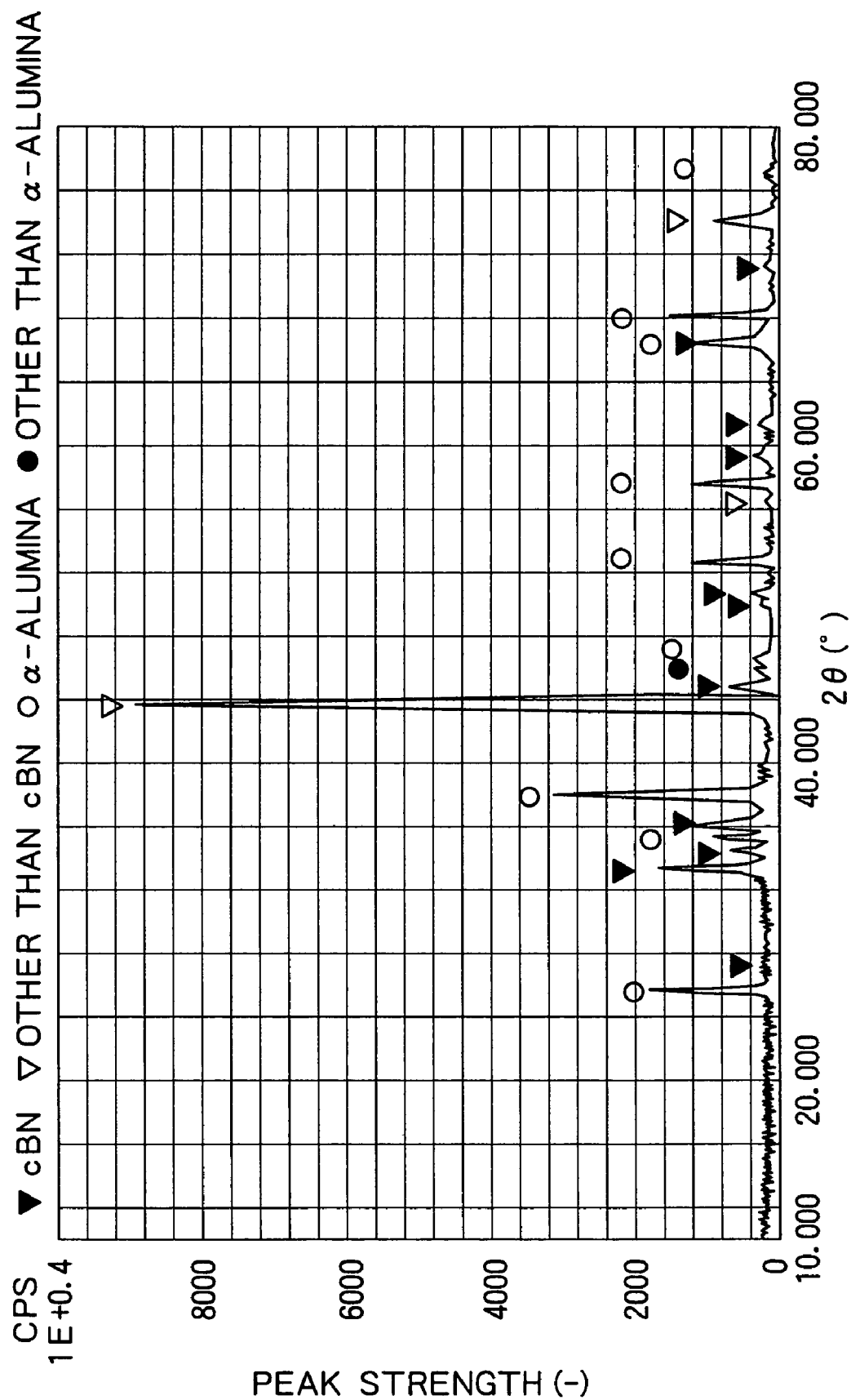
FIG. 15 is a graph showing the grazing incidence X-ray diffraction result of an alumina coating formed on a sintered cBN base material.

Each treatment-completed sample was analyzed by grazing incidence X-ray diffraction to specify the crystal structure. FIG. 15 is a graph showing the grazing incidence X-ray diffraction result of an alumina coating formed on the sintered cBN base material. In FIG. 15, many diffraction peaks are observed, including diffraction peaks from the sintered cBN of the base material. Therefore, the diffraction peaks from the coating are separated from the diffraction peaks from the base material by comparing with the independent X-ray diffraction result of the substrate. In FIG. 15, a triangular mark is given to the diffraction peaks resulted from the substrate, wherein "reversed black triangular mark" shows a diffraction peak by cBN, and "reversed blank triangular mark" shows a further diffraction peak except cBN. Further, a circular mark is given to the diffraction peaks resulted from the coating, wherein "blank circular mark" shows a diffraction peak from alumina of α-type crystal structure, and "black circular mark" shows a further diffraction peak except it.

As is apparent from FIG. 15, although many further diffraction peaks except cBN are observed also in the sintered cBN that is the base material, these are diffraction peaks resulted from a binder phase. Since some of diffraction peaks supposed to be the binder phase are observed at the angle matched to AlN of cubic crystal, the binder phase is supposed to contain at least AlN. Most of the diffraction peaks from the coating are resulted from α-alumina, as is apparent from FIG. 15, and an extremely weak peak was observed in a position matched to diffraction from γ-alumina although it is extremely small.

According to the result of composition analysis of this coating by XPS (X-ray photoelectron spectroscopy), it contains a trace amount (about 1 atomic %) of Ar, but contains Al and O in a composition ratio of 2:3 except it.

From these results, the coating formed on the sintered cBN base material can be specified as an alumina coating composed mainly of α-type crystal structure, and it could be determined that a clad member clad with an alumina coating composed mainly of α-type crystal structure on a sintered cBN base material could be produced.

In the thus-produced clad member, since an alumina coating excellent in oxidation resistance mainly composed of particularly thermally stable α-type crystal structure can be formed on a sintered cBN base material excellent in hardness, this member is suitably used for high-speed cutting of a high hardness material when applied to, for example, a cutting tool, and excellent performances can be expected.

(4) Working Example for the Fourth Mode

Example 1

A mirror-polished (Ra=about 0.02 μm) cemented carbide base material of 12.7 mm×12.7mm×5mm with a TiAlN coating with a thickness of 2-3 μm preliminarily formed as a primary coating by AIP was prepared. The composition of the TiAlN coating is $Ti_{0.55}Al_{0.45}N$.

As a comparative case, the formation of alumina coating was carried out after the surface of the TiAlN coating or a CrN coating was oxidized. The oxidation treatment and the formation of alumina coating were carried out in a vacuum deposition apparatus (manufactured by Kobe Steels, Ltd. composite machine AIP-S40) shown in FIG. 5.

The oxidation treatment was concretely carried out as follows. A sample (base material) 2 was set to a base material holder (planetary rotary jig) 4 on a rotary table 3 within a chamber 1.After evacuation was carried out until the inside of the chamber 1 is laid substantially in a vacuum state, the sample 2 was heated by heaters 5 set in two positions of side surfaces and in the center part in the chamber 1 to 750° C. (a base material temperature in the oxidation treatment process). When the temperature of the sample 2 reached a predetermined temperature, oxygen gas was introduced into the chamber 1 with a flow rate of 300 sccm and a pressure of 0.75 Pa, and the sample was heated and retained for 20 minutes and oxidized.

The formation of primary coating, the oxidation treatment and the deposition of alumina described later were carried out while rotating (revolving) the rotary table 3 in FIG. 5 and also rotating the base material holders (planetary rotary jigs) 4 set thereon around its own axis.

An alumina coating was formed on the oxidized primary coating. The formation of the alumina coating was carried out in an atmosphere of argon and oxygen at a base material temperature substantially equal to in the oxidation treatment process (750° C.) by means of reactive sputtering by applying a pulse DC power of about 2.5 kW to a sputtering cathode 6 mounted with two aluminum targets in FIG. 5. The formation of the alumina coating was carried out while controlling the discharge voltage and argon-oxygen flow rate ratio by use of plasma emission spectroscopy to set the discharge state to a so-called transition mode. According to this, an alumina coating with a thickness of about 2 μm was formed.

As an inventive case, the experiment was carried out in the same manner as the comparative case, except executing a gas ion bombardment treatment prior to the oxidation treatment. Namely, after the surface of the TiAlN coating or CrN coating was ion-bombarded and oxidized, alumina coating was formed thereon.

The gas ion bombardment treatment was carried out as follows. The sample (base material) 2 was set to the base material holder (planetary rotary jig) 4 on the rotary table 3 within the chamber 1.After evacuation was carried out until the inside of the chamber 1 is laid substantially in a vacuum state, the sample was heated by the heaters 5 set in two positions of side surfaces and in the center part within the chamber 1 to 550° C. When the temperature of the sample reached 550° C., Ar gas was introduced into the chamber 1 with a pressure of 0.75 Pa, and thermal electrons were released from a filament for emission of thermal electron 15 (wired vertically to the paper surface of FIG. 5) to make the Ar gas near the filament 15 to a plasma, whereby Ar plasma was generated.

A DC voltage (made to pulse at a frequency of 30 kHz) was applied from a bias power supply 14 to the base material within the Ar plasma for 15 minutes in total with −300V for 5 minutes and −400V for 10 minutes to perform the gas ion bombardment treatment. In this case, the treatment was also carried out while rotating the rotary table 3 and the base material holders (planetary rotary jigs) 4.

After the base material was then heated to 750° C. by the heater 5, the oxidation treatment and the formation of alumina coating were carried out in the same manner as in the comparative example to form an alumina coating with a thickness of about 2 μm.

An AIP evaporation source (arc evaporation source) 7 may be set, as shown in FIG. 5, to perform the formation of the primary coating in the apparatus 1 for performing the gas ion bombardment treatment, the oxidation treatment and the formation of alumina coating although it was not carried out in this example.

The surface of the thus-obtained alumina coating was analyzed by a grazing incidence X-ray diffraction device to specify the crystal structure of the alumina coating. The result is shown in FIG. 16 (the comparative case) and FIG. 17 (the inventive case).

As is apparent from FIG. 16, essential peaks of X-ray diffraction are diffraction peaks showing alumina of α-type crystal structure (hereinafter referred to as "α-alumina peak"), and diffraction peaks showing TiAlN of the primary coating and diffraction peaks showing alumina of γ-type crystal structure (hereinafter referred to as "γ-alumina peak") are also slightly observed. This shows that a mixed coating composed of alumina of α-type crystal structure and alumina of γ-type crystal structure is formed.

In FIG. 17 showing the result of the inventive case, generation of alumina of γ-type crystal structure is suppressed to a level where γ-alumina peaks can be barely observed, from which it is apparent that the ratio of alumina of α-type crystal structure is increased by this portion.

Figure 18A:
FIGS. 18(a) and (b) are SEM microphotographs (a: Comparative case, b: Inventive Case) of the surfaces of the alumina coatings formed on the TiAlN coatings.
Figure 18B:
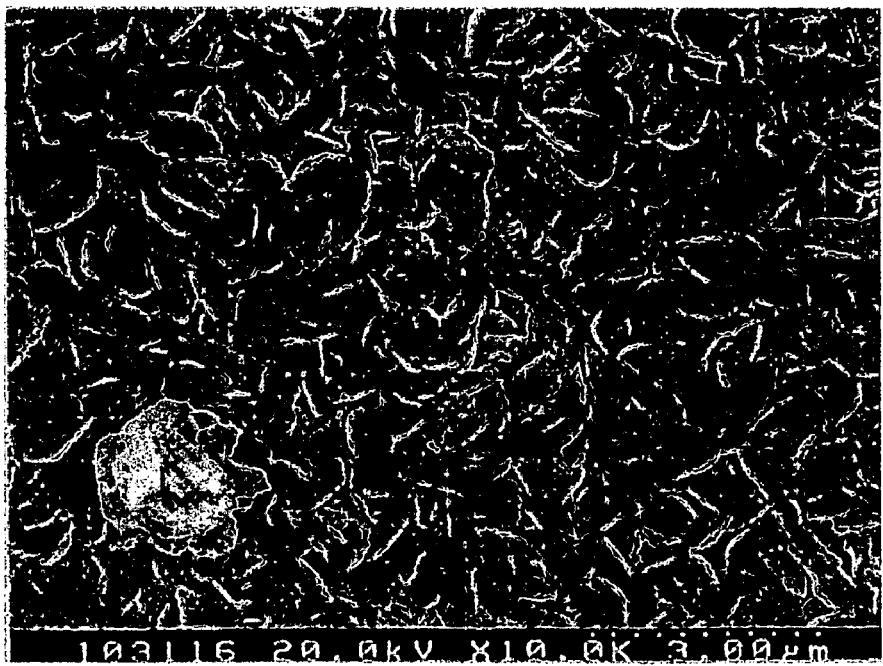

The results of observation of the surfaces of these alumina coatings by SEM (magnification: 10,000 times) are shown in FIGS. 18. FIG. 18(a) is a SEM micrograph showing the alumina coating surface in the comparative case, and FIG. 18(b) is a SEM micrograph showing the alumina coating surface in the inventive case.

In FIG. 18(*a*), the alumina coating of the comparative case is separated to crystal grains (white parts) and flat parts (black parts) where crystal grains are not grown, and the grown crystal grains are roughed and unevenly present. In contrast, the alumina coating of the inventive case shown in FIG. 18(*b*) is formed of uniform and minute crystal grains, apparently different from the coating surface of the comparative case.

Example 2

The same experiment as in Example 1 was carried out except forming a CrN coating as the primary coating, and the surfaces of the resulting alumina coatings were analyzed by a grazing incidence X-ray diffraction device to specify the crystal structures of the coatings. The results are shown in FIG. 19 (comparative case) and FIG. 20 (inventive case).

In FIGS. 19 and 20, all the diffraction peaks determined as alumina show α-type crystal structure, from which it is found that alumina coatings composed only of α-type crystal structure could be obtained in both the inventive case and the comparative case. No remarkable difference between the alumina coatings of the inventive case and the comparative case is observed in the grazing incidence X-ray diffraction. However, when the heights of the diffraction peaks of FIGS. 19 and 20 are compared, the diffraction intensity in FIG. 20 is slightly small, compared with that in FIG. 19. This is attributable to the influence of miniaturization of crystal grains described later.

Figure 21A:
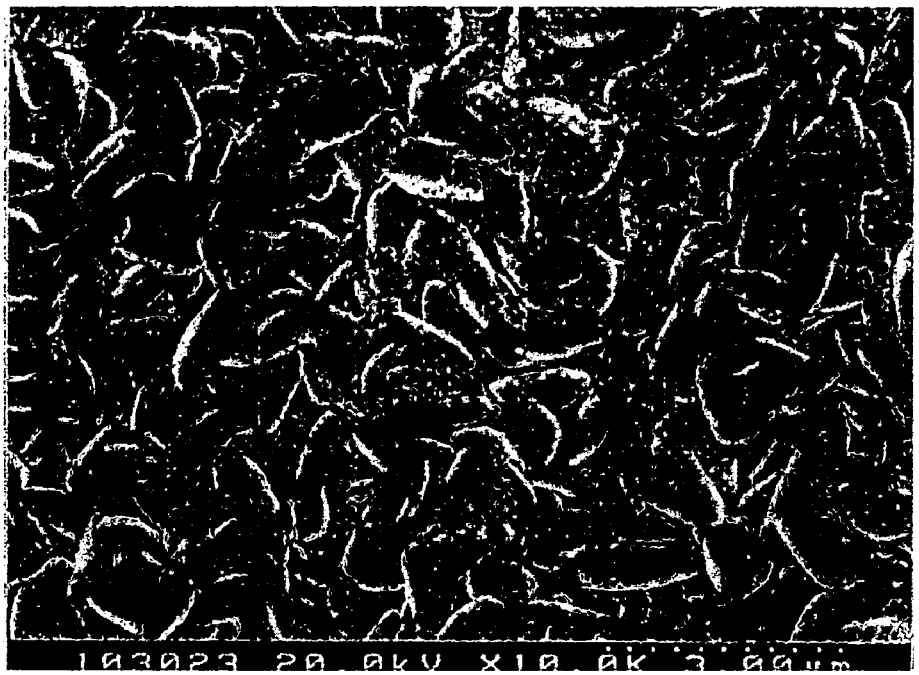
FIGS. 21(a) and (b) are SEM microphotographs (a: Comparative Case, b: Inventive Case) of the surfaces of the alumina coatings formed on the CrN coatings.
Figure 21B:
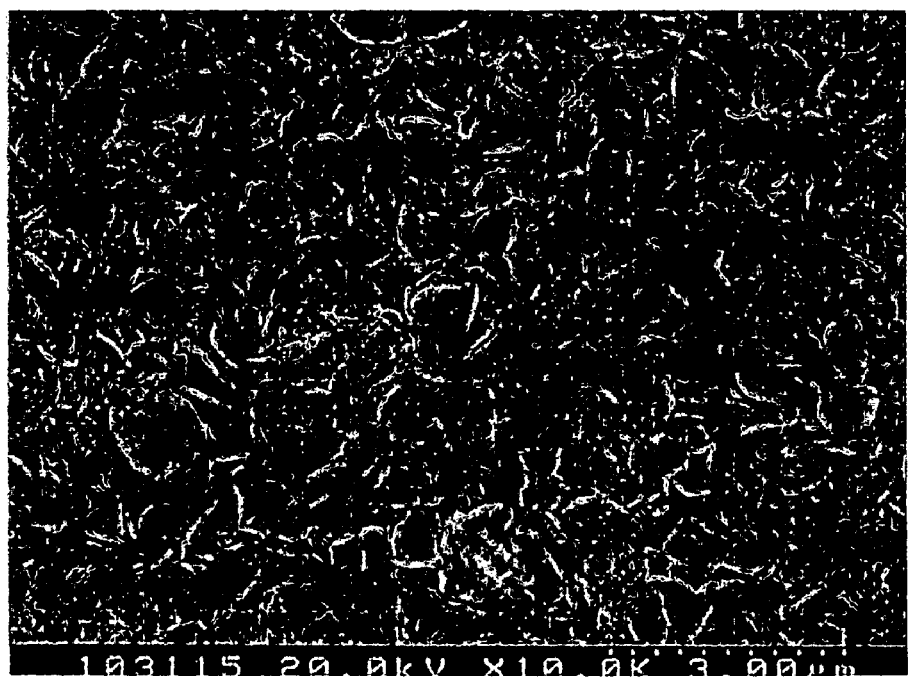

The surfaces of these alumina coatings were observed by SEM similarly to Example 1. The results are shown in FIGS. 21. FIG. 21(*a*) is an SEM micrograph showing the alumina coating surface of the comparative case, and FIG. 21(*b*) is an SEM micrograph showing the alumina coating surface of the inventive case.

The alumina coating of the inventive case is composed of further minute crystal grains as shown in FIG. 21(*b*) with rather small pores between crystal grains, compared with the alumina coating of the comparative case [FIG. 21(*a*)], which shows that consolidation of crystal grains is progressed. Although no remarkable difference is observed in the grazing incidence X-ray diffraction, the difference in the surface state is remarkable in the SEM observation, and the alumina coating of the inventive case will exhibit further excellent characteristics.

In the experiment of forming an alumina coating by use of a high speed steel base material or sintered cBN as a base material in the same condition as Examples 1 and 2 without providing a primary coating such as a CrN coating or TiAlN coating, it was also confirmed that an alumina coating composed mainly of α-type crystal structure with a minimized ratio of γ-type crystal structure and minute and uniform grains can be formed by performing the gas ion bombardment treatment and then the oxidation treatment.

(5) Working Example for the Fifth Mode

Example 1

Figure 7:
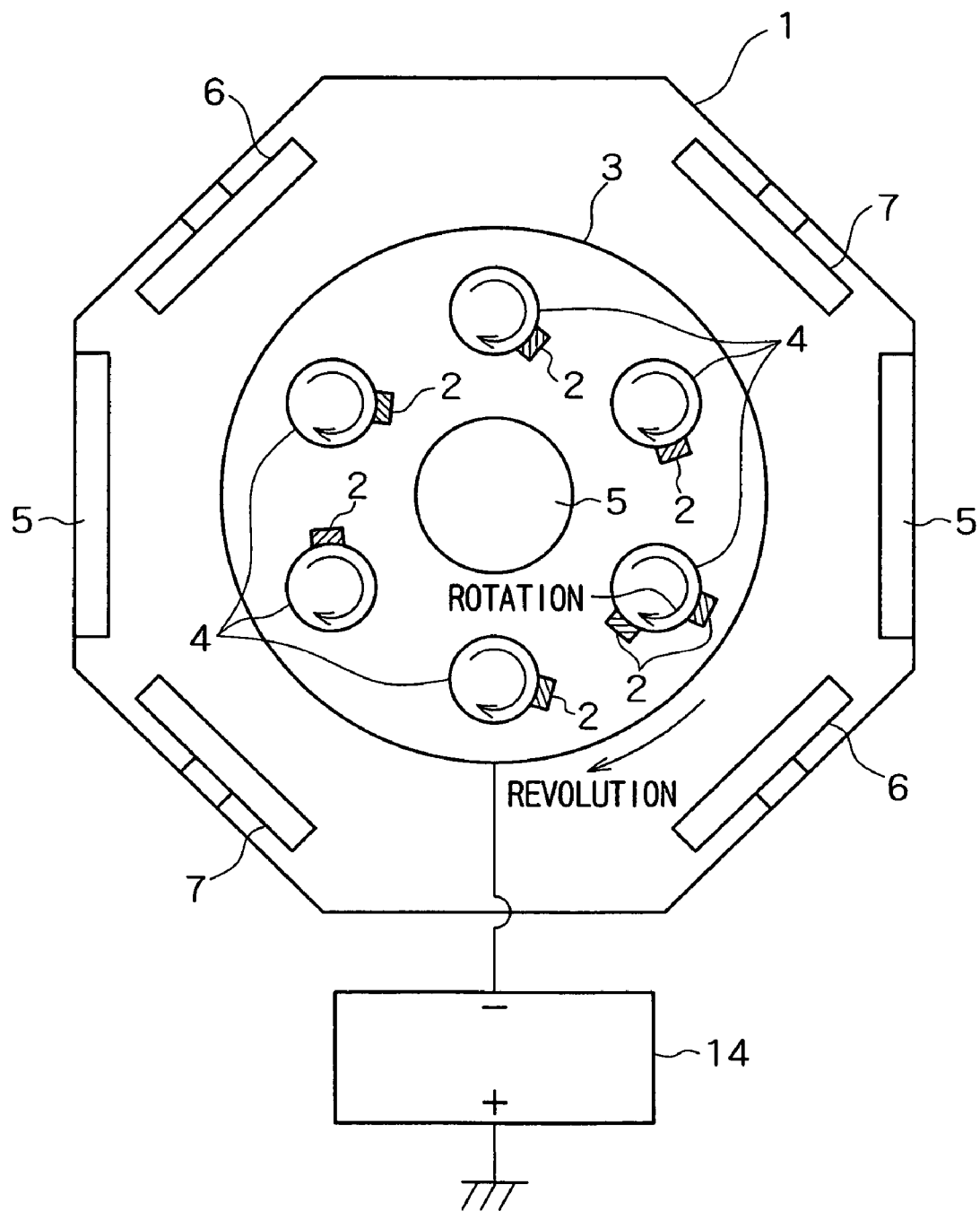
FIG. 7 is a schematic illustrative view (top view) showing an example of the apparatus used for the implementation of the fifth mode.

By use of base materials of a-c, the metal ion bombardment treatment, the oxidation treatment and the formation of alumina coating were successively carried out in a vacuum deposition apparatus (manufactured by Kobe Steels, Ltd. composite machine AIP-S40) shown in FIG. 7.

<Kinds of Materials>
a. Cemented carbide base material (12 mm×12 mm×5 mm)
b. Si wafer (silicone wafer) (20 mm×20 mm)
c. Cemented carbide base material (12 mm×12 mm×5 mm) with
TiAlN coating with a thickness of about 2 μm formed thereon by AIP The metal ion bombardment treatment was carried out as follows.

A sample (base material) 2 was set in a base material holder (planetary rotary jig) 4 on a rotary table 3 within a chamber 1. After the chamber 1 was evacuated to a vacuum state, the sample was heated to 600° C. by heaters 5 set in two positions of side surfaces and in the center part within the chamber 1, and retained at this temperature for 30 minutes.

Thereafter, the power of the heating heater is raised to a level capable of retaining the base material temperature at 750° C. in a steady state, an arc current of 80 A was applied to an AIP evaporation source 7 mounted with Cr targets to generate a plasma containing Cr ion. A DC bias voltage is applied to the base material by a bias power supply 14 through the rotary table 3 and the base material holder (planetary rotary jigs) 4 to emit the Cr ion to the base material, whereby the metal ion bombardment treatment was carried out. The bias voltage was applied for a total of 9 minutes with −600V for 2 minutes, −700V for 2 minutes, and −800V for 5 minutes. The base material temperature at the end of the metal ion bombardment treatment was about 760° C.

The above metal ion bombardment treatment, and the oxidation treatment and formation of alumina coating described later were carried out while rotating (revolving) the rotary table 3 in FIG. 7 and rotating the base material holders (planetary rotating jigs) 4 set thereon around its own axis.

After the metal ion bombardment treatment, the arc discharge and application of bias voltage were stopped to perform the oxidation treatment. The oxidation treatment was carried out by introducing oxygen gas into the chamber 1 after the metal ion bombardment treatment, with a flow rate of 300 sccm and a pressure of 0.75 Pa, and heating and retaining the base material for 30 minutes. The base material temperature at the end of the oxidation treatment in this process was 750° C.

An alumina coating was then formed on the oxidized surface. The formation of the alumina coating was carried out at a base material temperature substantially equal to in the oxidization treatment (750° C.) in an atmosphere of argon and oxygen by means of reactive sputtering by applying a pulse DC voltage of about 2.5 kW to a sputtering cathode 6 mounted with two aluminum targets in FIG. 7. During the formation of the alumina coating, the discharge voltage and the flow rate ratio of argon-oxygen were controlled by use of plasma emission spectroscopy to set the discharge state to a so-called transition mode, whereby an alumina coating with a thickness of about 2 μm was formed (Nos. 1-3 of Table 5).

Example 2

The metal ion bombardment treatment, the oxidation treatment and the formation of alumina coating were carried out in the same manner as in Example 1 except introducing, at the metal ion bombardment treatment, nitrogen into the chamber 1 so as to have a partial pressure of 0.05 Pa to perform the metal ion bombardment treatment under a nitrogen atmosphere (Nos. 4-6 of Table 5).

Example 3

The metal ion bombardment treatment, the oxidation treatment and the formation of alumina coating were carried out in the same manner as in Example 1 except using, as a generation source of metal ion in the metal ion bombardment treatment, Ti instead of Cr as the target material to be mounted on the AIP evaporation source (Nos. 7-9 of Table 5).

Comparative Example

The formation of alumina coating was carried out after the oxidation treatment without performing the metal ion bombardment treatment. As a conventional method, the process of forming a CrN coating further on the TiAlN coating of the base material c, oxidizing the resulting base material, and then forming an alumina coating was also carried out. The oxidation treatment and the formation of alumina coating were carried out in the same manner as in Example 1.

<Result of Grazing incidence X-ray Diffraction Analysis of Resulting Alumina Coatings>

The surfaces of the alumina coatings formed according to the methods of Examples 1-3 and Comparative Example were analyzed by a grazing incidence X-ray diffraction device to specify the crystal structures of the alumina coatings. The result is shown in Table 5.

TABLE 5

| No. | | Substrate (+Coating) | Metal Ion Bombardment | Crystal Structure of Alumina Coating |
|---|---|---|---|---|
| 1 | Example 1 | Cemented carbide | Cr | $\alpha$ |
| 2 | | Si Wafer | | $\alpha$ |
| 3 | | Cemented carbide + TiAlN | | $\alpha$ |
| 4 | Example 2 | Cemented carbide | Cr + $N_2$ | $\alpha$ |
| 5 | | Si Wafer | introduction | $\alpha$ |
| 6 | | Cemented carbide + TiAlN | | $\alpha$ |
| 7 | Example 3 | Cemented carbide | Ti | $\alpha$ + trace $\gamma$ |
| 8 | | Si Wafer | | $\alpha$ + trace $\gamma$ |
| 9 | | Cemented carbide + TiAlN | | $\alpha$ + trace $\gamma$ |
| 10 | Comparative Example | Cemented carbide | None | $\alpha$ + $\gamma$ |
| 11 | | Si Wafer | | $\gamma$ |
| 12 | | Cemented carbide + TiAlN | | $\alpha$ + $\gamma$ |
| 13 | | Cemented carbide + TiAlN + CrN | | $\alpha$ |

As is apparent from Table 5, in Nos. 1-9 showing the results of Examples 1-3, the alumina coating composed mainly of $\alpha$-type crystal structure is formed in each case of a. the cemented carbide, b. the Si wafer, and c. the cemented carbide base material with TiAlN coating with thickness of about 2 □m formed thereon by AIP. In comparison of the results of Nos. 1-6 with those of Nos. 7-9, when Cr is used in the metal ion bombardment treatment instead of Ti, an alumina coating composed substantially of only $\alpha$-type crystal structure can be formed in this example.

In the comparative example, although an alumina coating composed substantially only of $\alpha$-type crystal structure could be formed when a TiAlN coating and a CrN coating are formed on cemented carbide (No. 13), a mixed coating composed of $\alpha$-type crystal structure and v type crystal structure was formed when the cemented carbide is used as the base material as it is (No. 10) or only the TiAlN coating is formed on the cemented carbide (No. 12). When the Si wafer is used as the base material (No. 11), no alumina of $\alpha$-type crystal structure is formed, and an alumina coating composed substantially only of $\gamma$-type crystal structure was obtained.

From these results, according to the inventive method, an alumina coating composed mainly of $\alpha$-type crystal structure can be formed without being limited by the kinds of base materials.

(6) Working Example for the Sixth Mode

The formation of alumina coating according to the present invention was carried out by use of a PVD apparatus (vacuum deposition apparatus) shown in FIG. 4. A test piece having a CrN coating (primary coating) preliminarily formed on a cemented carbide base material by AIP was set to base material holder (planetary rotating jig) 4 within an apparatus 1. After evacuation was carried out until the inside of the apparatus 1 was laid substantially in a vacuum state, the sample was heated to 750° C. by heaters 5 disposed on side surfaces and the center within the apparatus. When the temperature of the test piece reached 750° C., oxygen gas was introduced into the apparatus 1 with a flow rate of 300 sccm and a pressure of about 0.75 Pa to oxidize the surface for 20 minutes. Denoted at 7 in FIG. 4 is an AIP evaporation source for forming the primary coating by AIP.

A pulse DC power of about 2.5 kW was applied to a sputtering cathode 6 mounted with two aluminum targets in an atmosphere of argon and oxygen to form aluminum oxide (alumina) in substantially the same temperature condition as the oxidation temperature (750° C.). At the formation of alumina, the discharge state was kept in a so-called transition mode by using discharge voltage control and plasma emission spectroscopy to form an alumina coating with atmosphere of about 2 μm. The formation of the coating was carried out while rotating (revolving) the rotary table 3 shown in FIG. 4 and also rotating the base material holders (planetary rotating jigs) 4 set thereon around its own axis.

The alumina coating after deposition treatment was analyzed for crystallinity by grazing incidence X-ray diffraction to specify the crystal structure of the alumina coating. Consequently, it could be confirmed that only diffraction peaks showing alumina of $\alpha$-type crystal structure can be observed from the alumina coating.

Figure 22:
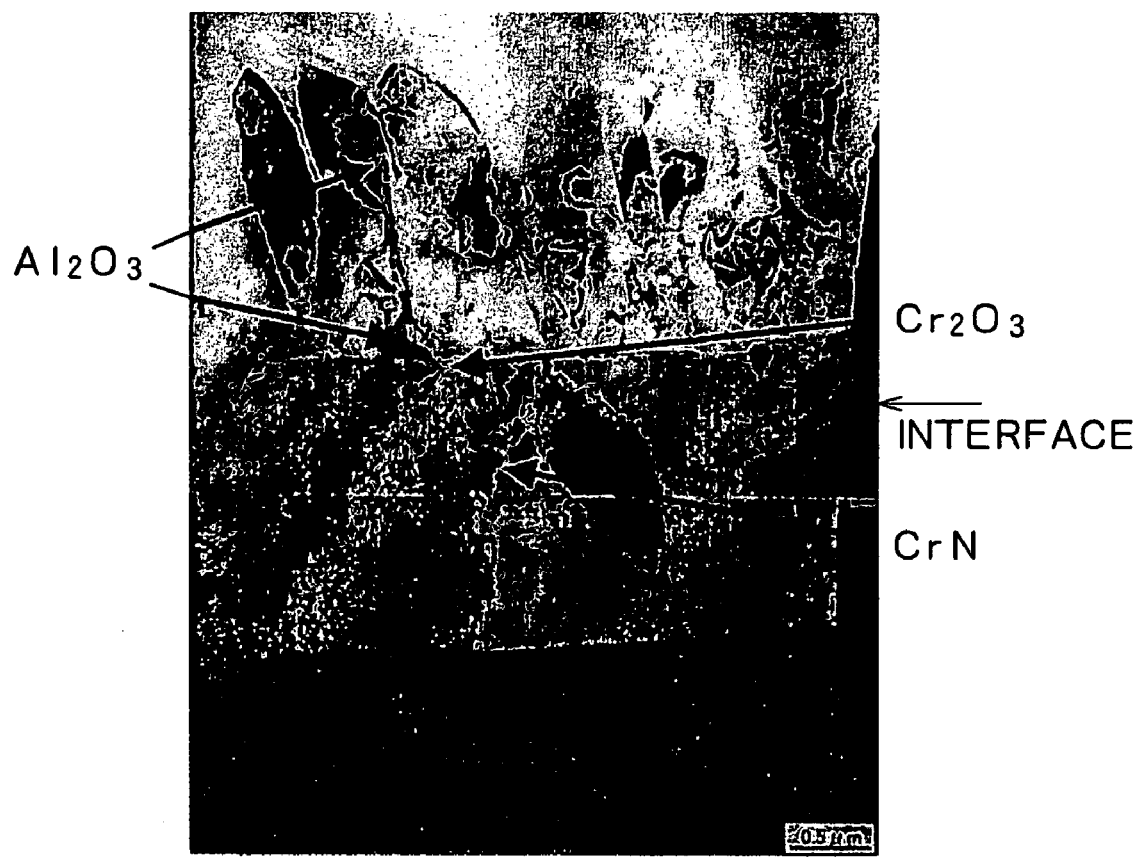
FIG. 22 is a drawing-substitutive picture showing the observation result by transmission electron microscopy (TEM) of the crystal structure of an alumina coating obtained in a working example for the sixth mode.

The result of observation of the alumina coating by transmission electron microscopy (TEM) is shown in FIG. 22 (drawing-substitutive picture) (magnification: 20000 times). According to this TEM image and an EXD analysis (energy-dispersive X-ray analysis) executed simultaneously, this coating has a three-layer structure consisting of a CrN coating, a chromium oxide ($Cr_2O_3$) layer with a thickness of 30-40 nm formed on the surface of CrN by the oxidation treatment process, and an alumina layer in order from the side closer to the base material. As a result of electron diffraction analysis of the alumina and chromium oxide layers, it could be confirmed that both the layers are $\alpha$-$A_2O_8$ and $\alpha$-$Cr_2O_3$, respectively, each of which has a corundum structure.

Figure 23:
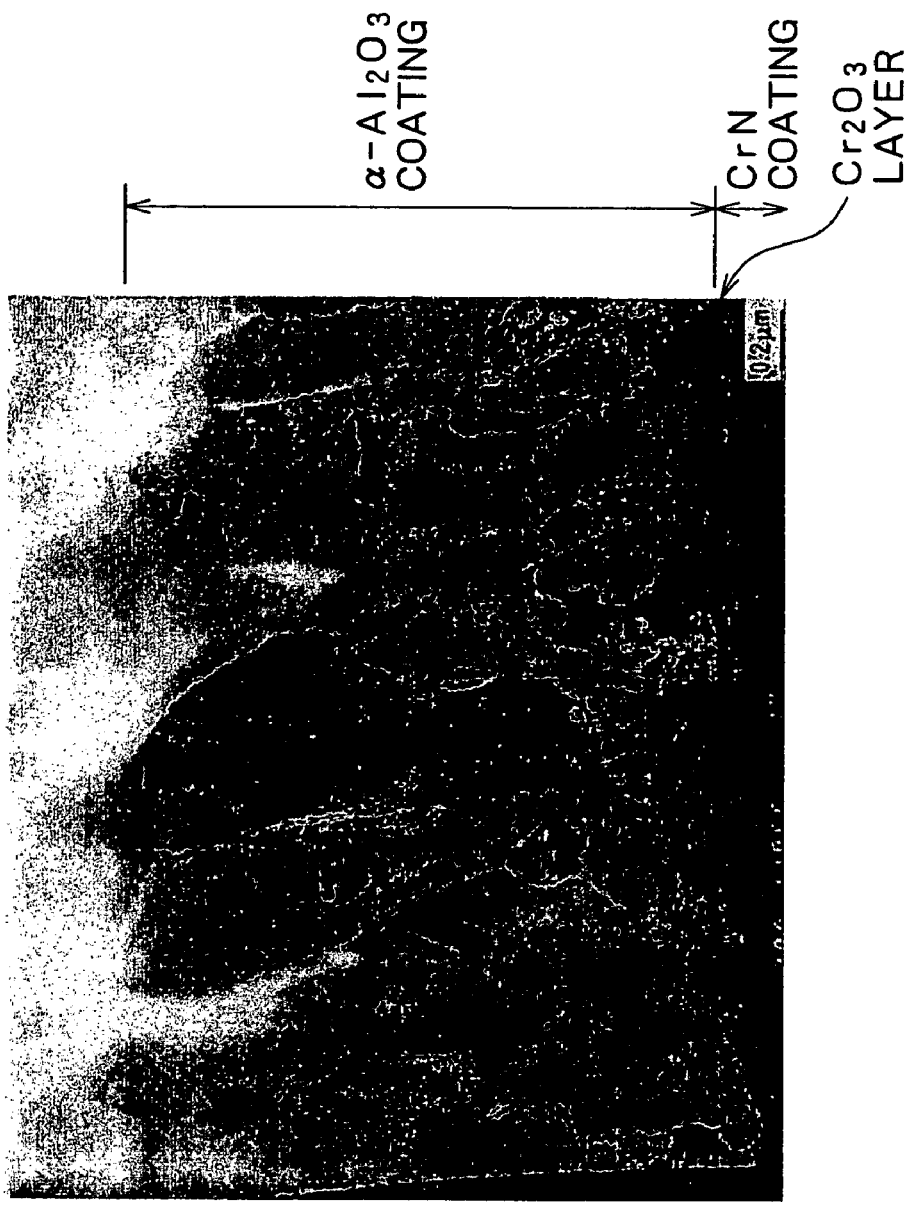
FIG. 23 is a drawing-substitutive picture of an enlarged part of FIG. 22.

FIG. 23 (drawing-substitutive picture) is a partially enlarged view of FIG. 22. As is apparent from FIG. 23, the crystal grain is enlarged as the coating growth progresses to increase the thickness, with a maximum crystal width of 0.5 μm and a columnar crystal length of columnar crystal reaching 1.5 μm in the vicinity of the surface. In contrast, the grain size is about 0.3 μm at a maximum at the initial stage of growth of the coating.

It is a general tendency of forming minute crystal grains at the initial stage of growth of the coating, and growing the crystal grains with the growth of the coating. However, according to the past coating sectional observations for alumina coatings formed by the PVD method (Surf. Coat. Technol., 94-95 (1997) p. 303-308, Surf. Coat. Technol., 142-144 (2001) p. 260-264, and J. Vac. Sci. Technol. A20(6), November/December (2002) p. 2134-2136), it is reported that a γ-alumina layer with minute crystal grains is formed at the initial stage of formation of the coating even in a sample in which α-alumina could be formed, and α-type crystals are grown therefrom. Therefore, it was thought that, when an α-alumina coating is formed by the PVD method, inclusion of γ-alumina is inevitable in the crystal minute area at the initial stage of growth of the coating.

In an alumina coating formed in the above-mentioned procedure, however, as a result of the electron diffraction analysis of the alumina coating in the vicinity of the interface with α-$Cr_2O_3$ at the time of TEM observation, it was found that a diffraction result from α-alumina can be obtained in every area, and no γ-alumina is detected. Accordingly, it is clarified that by forming an alumina coating in a proper condition including the kind of primary coatings, α-alumina can be formed even in an area with minute crystals at the initial stage of growth of the coating.

In this coating, although the crystal grains are largely grown in a columnar shape as the film thickness is increased from the initial stage of growth of the coating where the crystals have minute structure, only α-alumina was observed by electron diffraction in every stage of crystal growth.

In the above example, α-alumina of the present invention could be obtained by oxidizing the surface layer of CrN formed as the primary coating at a base material temperature of 750° C. and successively forming an alumina coating on the primary coating. As a result of examinations for an optimum condition for forming an alumina coating composed substantially only of α-type crystal structure, the present inventors found that α-alumina can be formed also in the following producing condition.

Namely, it could be confirmed that prior to the oxidation treatment process of the primary coating, the surface of the primary coating is subjected to ion bombardment treatment with Ar ion, etc. or "flawing treatment" with an oxide powder of corundum structure (preferably α-alumina powder), whereby the same α-alumina coating can be formed even if the surface of the base material is oxidized at about 700° C.

Accordingly, when the α-alumina coating of the present invention is produced with CrN as the primary coating in combination with the pretreatment (ion bombardment treatment or flawing treatment with the oxide powder), the oxidation treatment and the coating formation are carried out at a base material temperature of 700° C. or higher, and when it is produced without performing the pretreatment, the oxidation treatment and the coating formation are carried out at a base material temperature of 750° C. or higher, whereby an alumina coating of α-type crystal structure can be formed by the alumina coating formation by PVD.

When the ion bombardment treatment is performed, a filament for emission of thermal electron for forming a gas ion plasma or metal ion plasma (not shown) is arranged within the apparatus structure shown in FIG. 4, and a power source capable of applying a bias voltage to the base material can be set so that a bias voltage of a proper value (e.g., −400V or more) can be applied to perform the ion bombardment treatment.

(7) Working Example for Deposition Apparatus

A working example of depositing a highly heat-resistant α-alumina coating by use of a physical vapor deposition apparatus (not provided with an arc source 7) shown in FIG. 8 will be described.

A hard coating (TiAlN) was preliminarily formed on a mirror-surface (Ra=about 0.02 μm) plate-like cemented carbide base material of 12.7 mm×12.7 mm×5 mm with a thickness of 2-3 μm by means of arc ion plating to prepare a sample used for the deposition experiment. The coating composition of TiAlN was $Ti_{0.55}Al_{0.45}N$.

This sample was set in a base material holder (planetary rotating jig) 4 on a rotary table 3. After the apparatus was evacuated to a vacuum state through an exhaust gas pipe 11, and the sample was heated to a base material temperature of 550° C. by radiation type heating heaters 51 and 52. Thereafter, argon gas was introduced through a gas inlet pipe 11 at a pressure of 2.7 Pa, a discharge of 15A was generated between a filament for emission of thermal electron that is a plasma source 8 and a chamber to generate argon plasma. A DC voltage made into pulse at a frequency of 30 kHz was applied to the base material for a total of 15 minutes with −300V for 5 minutes and −400V for 10 minutes while emitting the argon plasma, whereby the ion bombardment treatment was executed.

The sample was heated to a base material temperature of 750° C. by the heating heaters 51 and 52, and when the sample reaches the temperature, oxygen gas was introduced into the chamber through the gas inlet pipe 11 at a flow rate of 300 sccm and a pressure of about 0.75 Pa to thermally oxidize the surface for 20 minutes.

By use of a sputtering cathode mounted with two aluminum targets as a sputtering evaporation source 6, a pulse DC sputtering power of about 2.5 kW is applied thereto in an atmosphere of argon and oxygen to form aluminum oxide (alumina) on the surface of the hard coating in substantially the same temperature condition as the oxidation temperature (750° C.) by sputtering. At the formation of alumina coating by this reactive sputtering, the discharge state is kept in a so-called transition mode by use of discharge voltage control and plasma emission spectroscopy to form an alumina coating with a thickness of about 2 μm.

The treatment-completed sample of this working example was analyzed by grazing incidence X-ray diffraction to specify the crystal structure. The result of grazing incidence X-ray diffraction of the alumina coating formed on the TiAlN coating is shown in FIG. 24. In this drawing, a circular mark shows peaks of □-alumina (alumina composed mainly of α-type crystal structure), a reversed blank triangular mark shows peaks of γ-alumina (alumina composed mainly of γ-type crystal structure), and a reversed black triangular mark shows peaks of TiAlN. As is apparent from FIG. 24, the alumina coating composed mainly of α-type crystal structure (highly heat-resistant oxide-based coating) can be formed on a practical hard coating such as TiAlN by using the apparatus of the present invention.

In contrast, it was confirmed also by experiments that a sufficient coating cannot be formed in an apparatus lacking the requirements of the apparatus of the present invention.

When the plasma source is lacked, the deposition was carried out without performing the ion bombardment treatment of the above processes. Although an alumina coating including α-type crystal structure could be formed on TiAlN, inclusion of α-type crystal structure was confirmed. It was also hard to say that the resulting coating was an alumina coating with uniform crystal grains.

When a bias power supply capable of intermittently applying a DC voltage is lacked, or when a DC bias power supply is used, arc was frequently caused. A high-frequency bias power supply could not be applied to the planetary rotary table.

With respect to the base material heating capability of the radiation type heating mechanism, α-type crystal could not also be obtained at a base material temperature of lower than 650° C., and deterioration of the TiAlN coating was observed when the base material temperature exceeds 800° C.

Complementarily to the embodiments of the present invention, the preferable range of intermittent application frequency of the bias power supply for a negative pulse bias voltage to the base material holder (planetary rotary jig) is 10 kHz-400 kHz. Since an unstable phenomenon by generation of arc discharge occurs at a frequency less than 10 kHz, and a problem of matching or the like is caused at a high frequency exceeding 400 kHz, the above range is recommended.

The formation of alumina coating by this apparatus is performed by the reactive sputtering as described above. Namely, aluminum targets mounted on the sputtering evaporation source are moved within a mixed atmosphere of argon and oxygen, whereby metal aluminum is sputtered and reacted with oxygen on the base material. In order to perform the deposition at a high deposition rate, it is necessary to retain the mode of the sputtering in a so-called transition mode, and it is desirable that the sputtering power source for driving the sputtering evaporation source can perform a constant voltage control from this point of view. Further, additively, this apparatus is desirably equipped with a spectrometer for monitoring the plasma emission in front of the sputtering evaporation source in order to grasp the mode of the sputtering.

INDUSTRIAL APPLICABILITY

By adapting the structure as described above, an alumina coating composed mainly of α-type crystal structure particularly excellent in heat resistance can be formed in a relatively low temperature range where the characteristic of a base material or a hard coating is never deteriorated, independently from a high temperature as in a CVD method. Since it is not necessary to provide an intermediate layer between the hard coating and the alumina coating of α-type crystal structure as in the past, a laminate coating can be efficiently formed, and the deterioration of cutting performance or the like by the intermediate layer can be eliminated.

Accordingly, such a laminate coating including an alumina coating composed mainly of α-type crystal structure and processes for producing these coatings are realized, whereby a cutting tool more excellent in wear resistance and heat resistance than in the past can be provided at a low cost.

The present invention is practical in the point of providing a process for forming alumina of α-type crystal structure excellent in oxidation resistance on a generally used titanium-based hard coating such as TiN, TiCN or TiC at a relatively low temperature.

When a gas ion bombardment treatment is performed, particularly, an alumina coating with minute and uniform crystal grains for which further excellent wear resistance and heat resistance can be expected can be formed, and when a metal ion bombardment treatment is performed, an alumina coating can be formed on the base material or primary coating regardless of the kind of the base material or primary coating that is a deposition object of alumina coating. In the present invention, further, the alumina coating can be formed also on a sintered cBN without specifying its composition.

The invention claimed is:

1. A process for producing an alumina coating comprised mainly of α crystal structure, comprising:
   coating a base material with a metal component comprising Al and Ti and one or more of B, C, N and O to form a primary coating,
   oxidizing the primary coating to form an oxide-containing layer, and
   forming an alumina coating comprised mainly of α crystal structure on the oxide-containing layer.

2. The process according to claim 1, wherein the outermost surface side of the oxide-containing layer is substantially comprised of alumina.

3. The process according to claim 1, wherein the primary coating comprises TiAlN.

4. The process according to claim 1, wherein the primary coating comprises a nitride, cemented carbide, carbonitride, boride, nitroxide, or carbonitroxide comprising Al and Ti, and at least one element selected from the group consisting of elements of the groups IVa (except Ti), Va, and VIa and Si.

5. The process according to claim 1, wherein the primary coating comprises TiAlCrN.

6. The process according to claim 1, wherein the oxidizing is carried out in an oxidizing gas-containing atmosphere while retaining a base material temperature at 650-800° C.

7. The process according to claim 1, wherein the forming of the alumina coating is performed by a PVD method.

8. The process according to claim 1, wherein the oxidizing the surface of the primary coating and the forming of the alumina coating are carried out within the same apparatus.

9. The process according to claim 1, wherein the coating of the base material, oxidizing the primary coating, and forming the alumina coating are successively carried out within the same apparatus.

10. A process for producing an alumina coating comprised mainly of α crystal structure, comprising:
    coating a base material with a metal component comprising Al and one or more of B, C, N and O to form a primary coating,
    oxidizing the primary coating to form an oxide-containing layer, and
    forming an alumina coating comprised mainly of α crystal structure on the oxide-containing layer.

11. The process according to claim 10, wherein the primary coating is comprised of a nitride, cemented carbide, carbonitride, boride, nitroxide, or carbonitroxide comprising Al and at least one element selected from the group consisting of elements of the groups IVa, Va, and VIa and Si.

12. The process according to claim 10, wherein the oxidizing is carried out in an oxidizing gas-containing atmosphere while retaining a base material temperature at 650-800° C.

13. The process according to claim 10, wherein forming the alumina coating is performed by a PVD method.

14. The process according to claim 10, wherein oxidizing the primary coating and forming the alumina coating are carried out within the same apparatus.

15. The process according to claim 10, wherein the process of forming the primary coating, the process of oxidizing the surface of the primary coating, and the process of forming the alumina coating comprised mainly of α-type crystal structure are successively carried out within the same apparatus.

16. A process for producing an alumina coating comprised mainly of α crystal structure, comprising:
    coating a base material with a metal whose standard free energy for oxidation generation is greater than that of aluminum and a compound of one or more of B, C, N, O to form a primary coating, oxidizing the primary coating to form an oxide-containing layer, and forming an alumina coating comprised mainly of α crystal structure on the oxide-containing layer.

17. The process according to claim 16, wherein the metal whose standard free energy for oxidation generation is greater than that of aluminum is Ti.

18. The process according to claim 16, wherein one or two or more laminate layers selected from the group consisting of TiN, TiC and TiCN are formed as the primary coating.

19. The process according to claim 16, wherein a composition gradient layer of both material constituting elements to be connected is formed in a connecting interface between the primary coating and the base material, or layers of the primary coating.

20. The process according to claim 16, wherein a titanium oxide-containing layer is formed as the oxide-containing layer and, in the following formation of alumina, an alumina coating is formed while being accompanied by reduction of the titanium oxide on the surface of the layer.

21. The process according to claim 16, wherein a $TiO_2$-containing layer is formed as the oxide-containing layer and, in the following formation of alumina, an alumina coating is formed while being accompanied by reduction of $TiO_2$ to $Ti_3O_5$ on the surface of the layer.

22. The process according to claim 16, wherein the oxidizing is carried out in an oxidizing gas-containing atmosphere while retaining a base material temperature at 650-800° C.

23. The process according to claim 16, wherein forming the alumina coating is performed by a PVD method.

24. The process according to claim 16, wherein oxidizing the primary coating and forming the alumina coating are carried out within the same apparatus.

25. The process according to claim 16, wherein forming the primary coating, oxidizing the primary coating, and forming the alumina coating are successively carried out within the same apparatus.

26. A process for producing an alumina coating comprised mainly of α crystal structure comprising:
(1) forming at least one of the following coatings (a)-(c) on a base material:
  (a) a coating comprised of a pure metal or alloy:
  (b) a coating comprised mainly of a metal solid-dissolving nitrogen, oxygen, carbon or boron:
  (c) a coating comprised of a metal nitride, oxide, cemented carbide or boride comprising nitrogen, oxygen, carbon or boron insufficient to a stoichiometric composition,
(2) oxidizing the surface of the coating from (1), and
(3) forming an alumina coating comprised mainly of α crystal structure on the oxidized surface from (2).

27. The process according to claim 26, wherein the oxidizing is carried out in an oxidizing gas-containing atmosphere while retaining a base material temperature at 650-800° C.

28. The process according to claim 26, wherein forming the alumina coating is performed by a PVD method.

29. The process according to claim 26, wherein oxidizing the primary coating and forming the alumina coating are carried out within the same apparatus.

30. The process according to claim 26, wherein forming the primary coating, oxidizing the primary coating, and forming the alumina coating are successively carried out within the same apparatus.

* * * * *